US012127393B2

(12) United States Patent
Yang et al.

(10) Patent No.: US 12,127,393 B2
(45) Date of Patent: Oct. 22, 2024

(54) MEMORY DEVICES HAVING VERTICAL TRANSISTORS AND METHODS FOR FORMING THE SAME

(71) Applicant: YANGTZE MEMORY TECHNOLOGIES CO., LTD., Wuhan (CN)

(72) Inventors: Tao Yang, Wuhan (CN); Dongxue Zhao, Wuhan (CN); Yuancheng Yang, Wuhan (CN); Zhiliang Xia, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 420 days.

(21) Appl. No.: 17/539,742

(22) Filed: Dec. 1, 2021

(65) Prior Publication Data
US 2023/0133595 A1 May 4, 2023

Related U.S. Application Data

(63) Continuation of application No. PCT/CN2021/127794, filed on Oct. 31, 2021.

(51) Int. Cl.
*H01L 29/66* (2006.01)
*H01L 23/00* (2006.01)
(Continued)

(52) U.S. Cl.
CPC .............. *H10B 12/33* (2023.02); *H01L 24/08* (2013.01); *H01L 24/80* (2013.01);
(Continued)

(58) Field of Classification Search
None
See application file for complete search history.

(56) References Cited

U.S. PATENT DOCUMENTS

| 10,249,683 | B1 | 4/2019 | Lille et al. |
| 2004/0089893 | A1 | 5/2004 | Bissey et al. |
(Continued)

FOREIGN PATENT DOCUMENTS

| CN | 102522407 A | 6/2012 |
| CN | 102544049 A | 7/2012 |
(Continued)

OTHER PUBLICATIONS

International Search Report issued in corresponding International Application No. PCT/CN2021/127792, mailed Jul. 27, 20122, 4 pages.
(Continued)

*Primary Examiner* — Hung K Vu
(74) *Attorney, Agent, or Firm* — Bayes PLLC

(57) ABSTRACT

In certain aspects, a memory device includes a vertical transistor, a storage unit, a bit line, and a body line. The vertical transistor includes a semiconductor body extending in a first direction. The semiconductor body includes a doped source, a doped drain, and a channel portion. The storage unit is coupled to a first terminal. The first terminal is one of the source and the drain. The bit line extends in a second direction perpendicular to the first direction and coupled to a second terminal. The second terminal is another one of the source and the drain. The body line is coupled to the channel portion of the semiconductor body.

20 Claims, 53 Drawing Sheets

(51) Int. Cl.
  *H01L 25/00* (2006.01)
  *H01L 25/065* (2023.01)
  *H01L 25/18* (2023.01)
  *H01L 29/78* (2006.01)
  *H10B 12/00* (2023.01)

(52) U.S. Cl.
  CPC .......... *H01L 25/0657* (2013.01); *H01L 25/18* (2013.01); *H01L 25/50* (2013.01); *H01L 29/66666* (2013.01); *H01L 29/7827* (2013.01); *H10B 12/036* (2023.02); *H10B 12/05* (2023.02); *H10B 12/482* (2023.02); *H01L 2224/08145* (2013.01); *H01L 2224/80895* (2013.01); *H01L 2224/80896* (2013.01); *H01L 2924/1431* (2013.01); *H01L 2924/1436* (2013.01); *H01L 2924/1441* (2013.01); *H01L 2924/1444* (2013.01)

(56) References Cited

U.S. PATENT DOCUMENTS

| | | | |
|---|---|---|---|
| 2005/0054158 | A1 | 3/2005 | Divakaruni et al. |
| 2006/0043617 | A1 | 3/2006 | Abbott |
| 2007/0166914 | A1 | 7/2007 | Chen et al. |
| 2008/0173936 | A1 | 7/2008 | Yoon et al. |
| 2010/0270529 | A1* | 10/2010 | Lung .................. G11C 13/0004 257/E47.001 |
| 2011/0227145 | A1 | 9/2011 | Renn |
| 2013/0234230 | A1 | 9/2013 | Takesako et al. |
| 2015/0263074 | A1 | 9/2015 | Takaki |
| 2016/0307914 | A1 | 10/2016 | Sun et al. |
| 2017/0098685 | A1* | 4/2017 | Konevecki ........... H10B 63/845 |
| 2018/0145184 | A1 | 5/2018 | Clifton et al. |
| 2018/0374855 | A1 | 12/2018 | Pandey et al. |
| 2020/0328186 | A1 | 10/2020 | Liu |
| 2020/0395341 | A1 | 12/2020 | Maejima et al. |
| 2021/0028174 | A1 | 1/2021 | Lee |
| 2021/0066502 | A1 | 3/2021 | Karda et al. |
| 2021/0280595 | A1 | 9/2021 | Hopkins et al. |
| 2021/0296319 | A1 | 9/2021 | Sukekawa |

FOREIGN PATENT DOCUMENTS

| | | |
|---|---|---|
| CN | 112216677 A | 1/2021 |
| CN | 112470274 A | 3/2021 |
| CN | 112838087 A | 5/2021 |
| CN | 113496731 A | 10/2021 |
| CN | 113540095 A | 10/2021 |
| WO | 2020263340 A1 | 12/2020 |

OTHER PUBLICATIONS

International Search Report issued in corresponding International Application No. PCT/CN2021/127796, mailed Jul. 27, 2022, 4 pages.

International Search Report issued in corresponding International Application No. PCT/CN2021/127797, mailed Jul. 27, 2022, 4 pages.

International Search Report issued in corresponding International Application No. PCT/CN2021/127794, mailed Jul. 29, 2022, 4 pages.

International Search Report issued in corresponding International Application No. PCT/CN2021/127790, mailed Jul. 27, 2022, 4 pages.

* cited by examiner

2000

MEMORY DEVICES HAVING VERTICAL TRANSISTORS AND METHODS FOR FORMING THE SAME

CROSS-REFERENCE TO RELATED APPLICATIONS

This application is a continuation of International Application No. PCT/CN2021/127794, filed on Oct. 31, 2021, entitled "MEMORY DEVICES HAVING VERTICAL TRANSISTORS AND METHODS FOR FORMING THE SAME," which is hereby incorporated by reference in its entirety. This application is also related to ee-pending U.S. application Ser. No. 17/539,760, filed on Dec. 1, 2021, entitled "MEMORY DEVICES HAVING VERTICAL TRANSISTORS IN STAGGERED LAYOUTS," U.S. application Ser. No. 17/539,784, filed on Dec. 1, 2021, entitled "MEMORY DEVICES HAVING VERTICAL TRANSISTORS AND METHODS FOR FORMING THE SAME," U.S. application Ser. No. 17/539,802, filed on Dec. 1, 2021, entitled "MEMORY DEVICES HAVING VERTICAL TRANSISTORS AND METHODS FOR FORMING THE SAME," and U.S. application Ser. No. 17/539,818, filed on Dec. 1, 2021, entitled "MEMORY DEVICES HAVING VERTICAL TRANSISTORS AND STACKED STORAGE UNITS AND METHODS FOR FORMING THE SAME," all of which are hereby incorporated by reference in their entireties.

BACKGROUND

The present disclosure relates to memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a memory device includes a vertical transistor, a storage unit, a bit line, and a body line. The vertical transistor includes a semiconductor body extending in a first direction. The semiconductor body includes a doped source, a doped drain, and a channel portion. The storage unit is coupled to a first terminal. The first terminal is one of the source and the drain. The bit line extends in a second direction perpendicular to the first direction and coupled to a second terminal. The second terminal is another one of the source and the drain. The body line is coupled to the channel portion of the semiconductor body.

In another aspect, a 3D memory device includes a first semiconductor structure including a peripheral circuit, a second semiconductor, and a bonding interface between the first semiconductor structure and the second semiconductor structure in a first direction. The second semiconductor structure includes a vertical transistor, a storage unit, a bit line, and a body line. The vertical transistor includes a semiconductor body extending in the first direction. The semiconductor body includes a doped source, a doped drain, and a channel portion. The storage unit is coupled to a first terminal. The first terminal is one of the source and the drain. The bit line extends in a second direction perpendicular to the first direction and coupled to a second terminal. The second terminal is another one of the source and the drain. The body line is coupled to the channel portion of the semiconductor body.

In still another aspect, a memory system includes a memory device configured to store data and a memory controller coupled to the memory device. The memory device includes a vertical transistor, a storage unit, a bit line, and a body line. The vertical transistor includes a semiconductor body extending in a first direction. The semiconductor body includes a doped source, a doped drain, and a channel portion. The storage unit is coupled to a first terminal. The first terminal is one of the source and the drain. The bit line extends in a second direction perpendicular to the first direction and coupled to a second terminal. The second terminal is another one of the source and the drain. The body line is coupled to the channel portion of the semiconductor body. The memory controller is configured to control the vertical transistor and the storage unit through the bit line and the body line.

In yet another aspect, a method for forming a memory device is disclosed. A semiconductor body extending vertically from a first side of a substrate is formed. The substrate is removed from a second side opposite to the first side of the substrate to expose a first end of the semiconductor body. A protrusion of the semiconductor body is formed from the exposed first end of the semiconductor body. Part of the protrusion of the semiconductor body is doped. A bit line in contact with the doped part of the protrusion of the semiconductor body is formed. A body line in contact with another part of the protrusion of the semiconductor body is formed.

In yet another aspect, a method for forming a 3D memory device is disclosed. A peripheral circuit is formed on a first substrate. A semiconductor body extending vertically from a second substrate is formed. The first substrate and the second substrate are bonded in a face-to-face manner. The second substrate is removed to expose a first end of the semiconductor body. Part of the semiconductor body is doped from the exposed first end of the semiconductor body. A body line in contact with another part of the semiconductor body is formed.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1A:
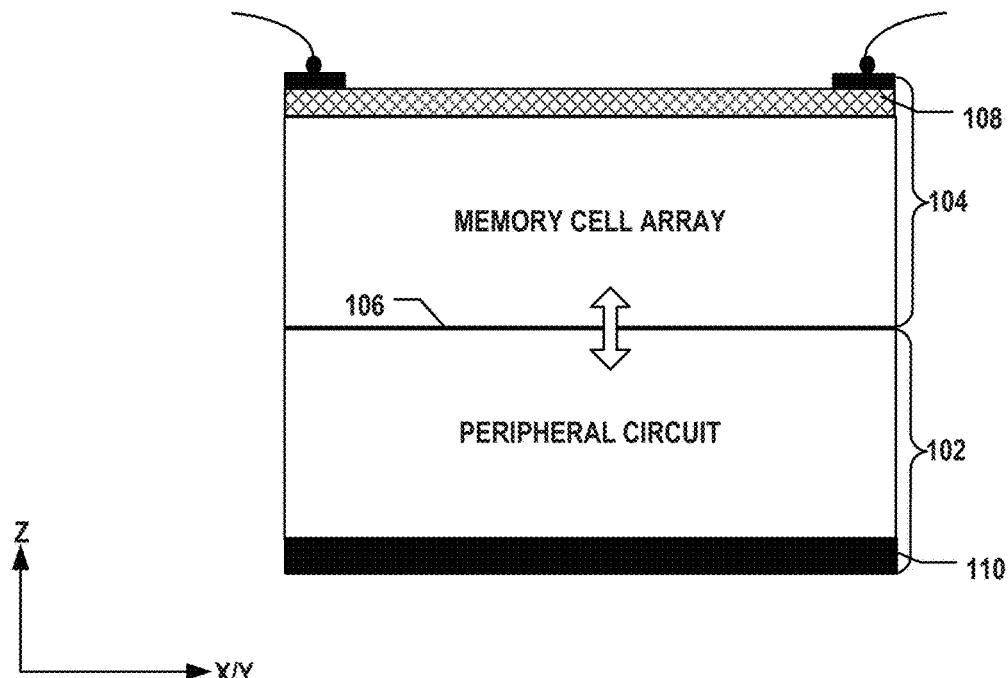
FIG. 1A illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, as the number of memory cells keeps increasing, to maintain the same chip size, the dimensions of the components in the memory cell array, such as transistors, storage units (e.g., capacitors), word lines, and/or bit lines, need to keep decreasing in order not to significantly reduce the memory cell array efficiency. The continuous reduction of the device dimensions of the storage units, however, is facing a great challenge. For example, the aspect ratio in etching the capacitor holes has reached its limit with the existing design and instruments and thus, may not be continuously increased to increase the memory cell density.

Some memory devices thus replace the planar transistors with vertical transistors to increase the performance and/or the memory cell array efficiency. However, different from a planar transistor in which the substrate body can be easily biased with a certain potential to fully deplete the charge, the upper and lower ends of the semiconductor body in a vertical transistor are fully doped to form the source and drain in those memory devices, which can cause the floating body effect. For example, the semiconductor body of the vertical transistor may become floating due to the diode formed between the channel and the bit line. As a result, the charge accumulated in the semiconductor body may cause adverse effects, for example, the opening of parasitic transistors in the structure and causing off-state leakages, resulting in higher current consumption and in case of DRAM in loss of information from the memory cells. It may also cause the history effect, the dependence of the threshold voltage of the transistor on its previous states.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines may be reduced for ease of fabrication. The vertical structures of the transistors also allow the bit lines and storage units, such as capacitors, to be arranged on opposite sides of the transistors in the vertical direction (e.g., one above and on below the transistors), such that the process margin of the bit lines can be increased and the coupling capacitance between the bit lines and the storage units can be decreased.

Consistent with the scope of the present disclosure, one end of the semiconductor body can be partially doped, such that the channel portion of the semiconductor body can be coupled to a body line to bias the semiconductor body at a certain potential to suppress the floating body effect. In some implementations, one or more sides of a protrusion of the semiconductor body is doped to form the source/drain in contact with the bit line, while the remainder of the protrusion (e.g., the top) is in contact with the body line to enable the depletion of the charge from the channel.

According to some aspects of the present disclosure, the memory cell array having vertical transistors and the peripheral circuits of the memory cell array can be formed on different wafers and bonded together in a face-to-face manner. Thus, the thermal budget of fabricating the memory cell array does not affect the fabrication of the peripheral circuits. The stacked memory cell array and peripheral circuits can also reduce the chip size compared with the side-by-side arrangement, thereby improving the array efficiency. The face-to-face bonding can also allow backside processes on vertical transistors to form the partially doped protrusion of the semiconductor body as well as the bit line and body line from the backside after the bonding.

According to some aspects of the present disclosure, the array of memory cells can be arranged in a staggered layout, as opposed to the cross-point orthogonal layout (a.k.a., straight or aligned layout), in the plan view to further increase the cell density and reduce the unit cell size. In some implementations, a minimum cell distance is kept the same between any adjacent memory cells in the staggered layout to minimize the unit cell size. The maintain the same minimum cell distance in the staggered layout, dummy memory cells coupled to a slit structure separating adjacent word lines or a serpentine-shaped slit structure can be introduced into the memory design in various implementations.

According to some aspects of the present disclosure, each vertical transistor can be coupled to multiple stacked storage units (e.g., ferroelectric capacitors), as opposed to a single storage unit, to further increase the memory cell density. That is, the storage units can be scaled up vertically in 3D to overcome the fabrication limits. In some implementations, multiple plate lines of a ferroelectric memory device (e.g., FRAM) are formed in stack structure having interleaved conductive layers and dielectric layers above the vertical transistors, and each plate line is coupled to a respective one of the stacked storage units.

FIG. 1A illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including the peripheral circuits of a memory cell array. 3D memory device 100 can also include a second semiconductor structure 104 including the memory cell array. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

As shown in FIG. 1A, 3D memory device 100 can also include second semiconductor structure 104 including an array of memory cells (memory cell array) that can use transistors as the switch and selecting devices. In some implementations, the memory cell array includes an array of DRAM cells or any array of FRAM cells. For ease of description, a DRAM cell array or a FRAM cell array may be used as examples for describing the memory cell array in the present disclosure. But it is understood that the memory cell array is not limited to DRAM or FRAM cell array and may include any other suitable types of memory cell arrays that can use transistors as the switch and selecting devices, such as PCM cell array, static random-access memory (SRAM) cell array, resistive memory cell array, magnetic memory cell array, spin transfer torque (STT) memory cell array, to name a few, or any combination thereof.

Second semiconductor structure 104 can be a DRAM device in which memory cells are provided in the form of an array of DRAM cells. In some embodiments, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementation.

Alternatively, second semiconductor structure 104 can be a FRAM device in which memory cells are provided in the form of an array of FRAM cells. In some embodiments, each FRAM cell includes a ferroelectric capacitor for storing binary information of the respective FRAM cell based on the switch between two polarization states of ferroelectric materials under an external electric field. In some implementations, each FRAM cell is a one-transistor, one-capacitor (1T1C) cell for storing multiple bits of binary information. In some implementations, each FRAM cell is a one-transistor, multi-capacitors (1TnC) cell, where n is a positive integer greater than 1. Consistent with the scope of the present disclosure, each 1TnC FRAM cell can include multiple ferroelectric capacitors stacked vertically, each of which is coupled to one of multiple parallel, laterally extended plate lines.

As shown in FIG. 1A, 3D memory device 100 further includes a bonding interface 106 vertically between (in the vertical direction, e.g., the z-direction in FIG. 1A) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects (e.g., bonding contacts) across bonding interface 106. By vertically integrating first and second semiconductor structures 102 and 104, the chip size can be reduced, and the memory cell density can be increased.

Figure 1B:
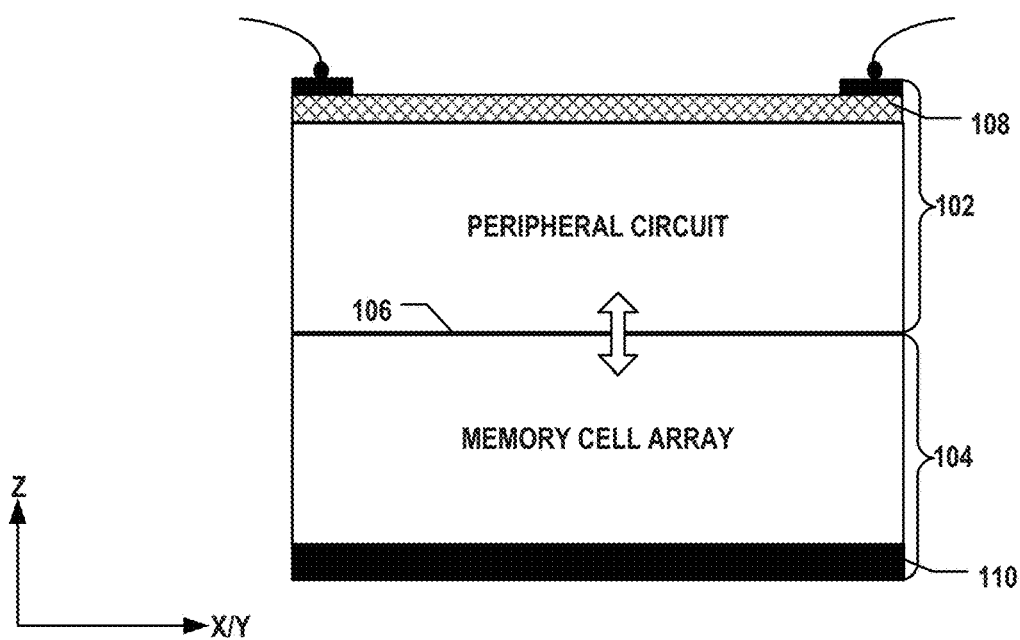
FIG. 1B illustrates a schematic view of a cross-section of another 3D memory device, according to some aspects of the present disclosure.

It is understood that the relative positions of stacked first and second semiconductor structures 102 and 104 are not limited. For example, FIG. 1B illustrates a schematic view of a cross-section of another exemplary 3D memory device 101, according to some implementations. Different from 3D memory device 100 in FIG. 1A in which second semiconductor structure 104 including the memory cell array is above first semiconductor structure 102 including the peripheral circuits, in 3D memory device 101 in FIG. 1B, first semiconductor structure 102 including the peripheral circuit is above second semiconductor structure 104 including the memory cell array. Nevertheless, bonding interface 106 is formed vertically between first and second semiconductor structures 102 and 104 in 3D memory device 101, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

Figure 1C:
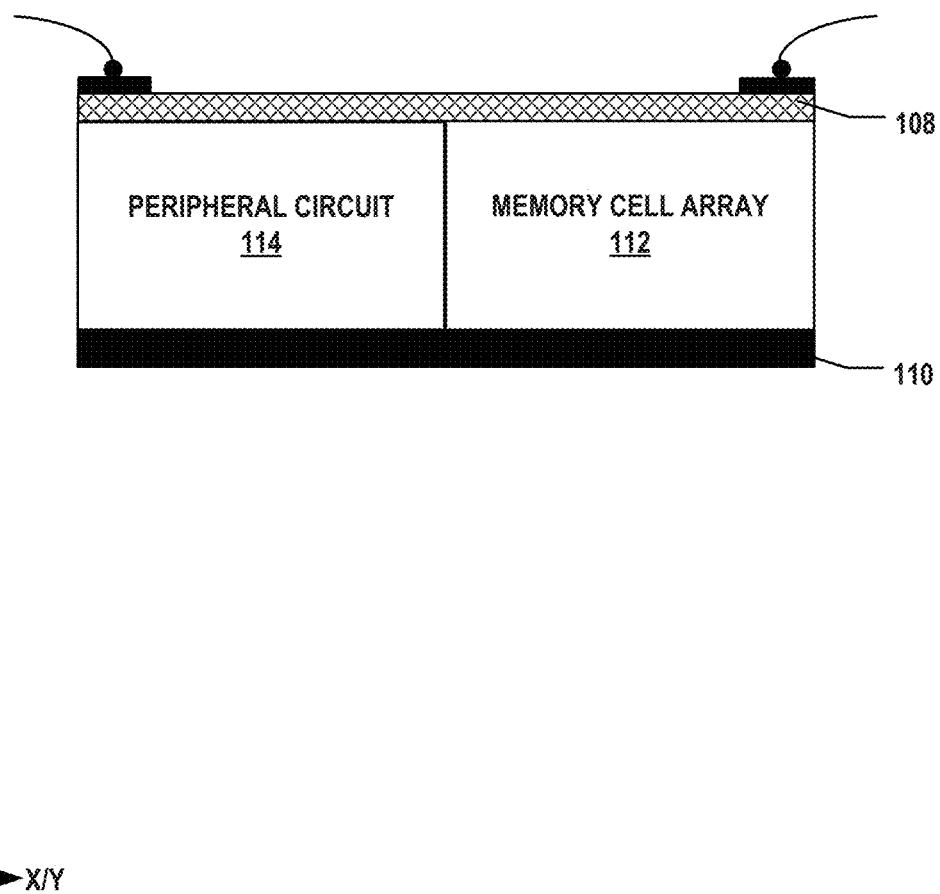
FIG. 1C illustrates a schematic view of a cross-section of still another 3D memory device, according to some aspects of the present disclosure.

It is also understood that the memory cell array having vertical transistors and the peripheral circuits of the memory cell array may be formed on the same wafer in a side-by-side manner, i.e., next to one another. The number of wafers needed to fabricate the same number of memory devices and the complexity involved in the bonding process can be reduced compared with the face-to-face bonding scheme. For example, FIG. 1C illustrates a schematic view of a cross-section of still another 3D memory device 103, according to some aspects of the present disclosure. As shown in FIG. 1C, memory device 103 can include a memory cell array region 112 and a peripheral circuit region 114 arranged side-by-side in the same device plane, as opposed to be stacked one over another in different device planes. A memory cell array can be formed in memory cell array region 112, and the peripheral circuits of the memory cell array can be formed in peripheral circuit region 114 disposed beside memory cell array region 112.

It is noted that x, y, and z axes are included in FIGS. 1A-1C to further illustrate the spatial relationship of the components in 3D memory devices 100, 101, and 103. Substrate 110 of 3D memory device 100, 101, or 103 includes two lateral surfaces extending laterally in the x-y plane: a top surface on the front side of the wafer on which 3D memory device 100, 101, or 103 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of 3D memory device 100, 101, or 103 is determined relative to substrate 110 of 3D memory device 100, 101, or 103 in the z-direction (the vertical direction perpendicular to the x-y plane, e.g., the thickness direction of the substrate) when substrate 110 is positioned in the lowest plane of 3D memory device 100, 101, or 103 in the z-direction. The same notion for describing the spatial relationships is applied throughout the present disclosure.

As shown in FIGS. 1A-1C, 3D memory device 100, 101, or 103 can further include a pad-out interconnect layer 108 for pad-out purposes, i.e., interconnecting with external devices using contact pads on which bonding wires can be soldered. Pad-out interconnect layer 108 and substrate 110 can be disposed on opposite sides of the device plane having the memory cell array and peripheral circuits in the z-direction. In other words, the memory cell array and peripheral circuits are disposed vertically between pad-out interconnect layer 108 and substrate 110 in 3D memory device 100, 101, or 103, according to some implementations. As shown in FIGS. 1A and 1B, the relative positions of substrate 110 and pad-out interconnect layer 108 are not limited with respect to first and second semiconductor structures 102 and 104. In one example as shown in FIG. 1A, substrate 110 may be part of first semiconductor structure 102 having the peripheral circuit, and pad-out interconnect layer 108 may be part of second semiconductor structure 104 having the memory cell array. In another example as shown in FIG. 1B, substrate 110 may be part of second semiconductor structure 104 having the memory cell array, and pad-out interconnect layer 108 may be part of first semiconductor structure 102 having the peripheral circuit. In other words, in bonded 3D memory device 100 or 101, the pad-out may be achieved from either the memory cell array side or from the peripheral circuit side in different examples.

Figure 2:
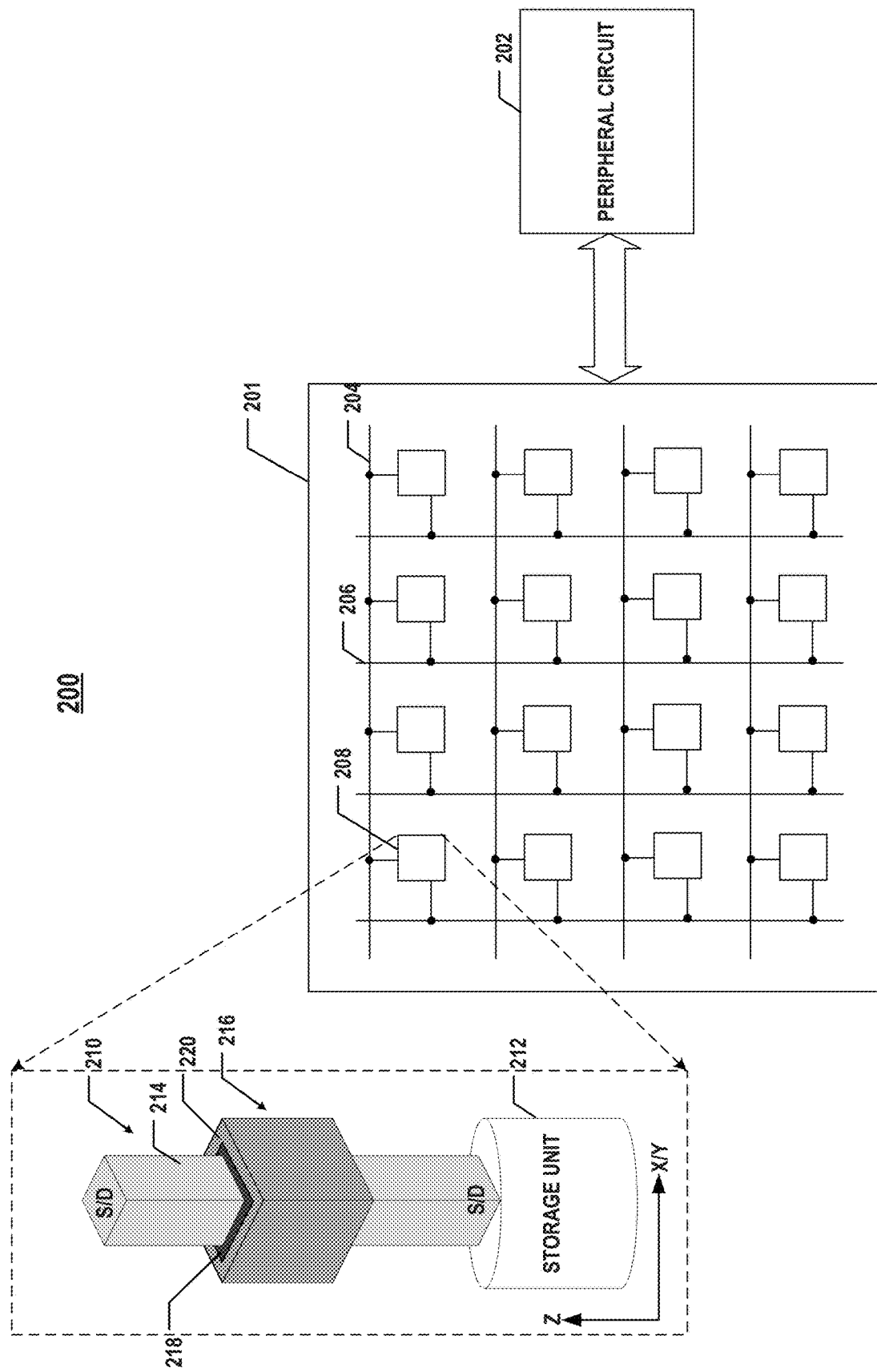
FIG. 2 illustrates a schematic diagram of a memory device including peripheral circuits and an array of memory cells each having a vertical transistor, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. 3D memory devices 100 and 101 may be examples of memory device 200 in which memory cell array 201 and peripheral circuits 202 may be included in second and first semiconductor structures 104 and 102, respectively. 3D memory device 103 may be another example of memory device 200 in which memory cell array 201 and peripheral circuits 202 may be included in memory cell array region 112 and peripheral circuit region 114, respectively. Memory cell array 201 can be any suitable memory cell array in which each memory cell 208 includes a vertical transistor 210 and one or more storage units 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace the conventional planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the z-direction) above the substrate (not shown). That is, semiconductor body 214 can extend above the top surface of the substrate to expose not only the top surface of semiconductor body 214, but also one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the x-y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered to having multiple sides, such that the gate structures are in contact with more than one side of the semiconductor bodies. As described below with respect to the fabrication process, semiconductor body 214 can be formed from the substrate (e.g., by etching and/or epitaxy) and thus, has the same semiconductor material (e.g., silicon crystalline silicon) as the substrate (e.g., a silicon substrate).

As shown in FIG. 2, vertical transistor 210 can also include a gate structure 216 in contact with one or more sides of semiconductor body 214, i.e., in one or more planes of the side surface(s) of the active region. In other words, the active region of vertical transistor 210, i.e., semiconductor body 214, can be at least partially surrounded by gate structure 216. Gate structure 216 can include a gate dielectric 218 over one or more sides of semiconductor body 214, e.g., in contact with four side surfaces of semiconductor body 214 as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high dielectric constant (high-k) dielectrics. For example, gate dielectric 218 may include silicon oxide, i.e., gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, i.e., a gate poly. In some implementations, gate electrode 220 includes multiple conductive layers, such as a W layer over a TiN layer. It is understood that gate electrode 220 and word line 204 may be a continuous conductive layer in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, semiconductor body 214 of vertical transistor 210 can include a pair of a source and a drain (S/D, doped regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). Semiconductor body 214 of vertical transistor 210 can also include a channel portion, i.e., the remaining portion other than the source and drain in which channel(s) are formed during transistor operation. In some implementations, semiconductor body 214 of vertical transistor 210 includes single crystalline silicon, and the channel portion includes undoped single crystalline silicon or doped single crystalline silicon having a different type of dopant from the source and the drain. The source and drain can be separated by gate structure 216 in the vertical direction (the z-direction). In other words, gate structure 216 is formed vertically between the source and drain. As a result, one or more channels (not shown) of vertical transistor 210 can be formed in the channel portion of semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations. Consistent with the scope of the present disclosure, the channel portion of semiconductor body 214 can be in contact with a body line (not shown in FIG. 2) to allow the depletion of the charge from the channels through the body line to reduce the floating body effect and the resulting issues described above.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed in the channel portion of semiconductor body 214 between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. During the off state, since the channel is fully depleted, the leakage current ($I_{off}$) of vertical transistor 210 can be significantly reduced a well. The multi-gate vertical transistors can include, for example, double-gate vertical transistors (e.g., dual-side gate vertical transistors), tri-gate vertical transistors (e.g., tri-side gate vertical transistors), and gate all around (GAA) vertical transistors.

It is understood that although vertical transistor 210 is shown as a multi-gate transistor in FIG. 2, the vertical transistors disclosed herein may also include single-gate transistors. That is, gate structure 216 may be in contact with a single side of semiconductor body 214, for example, for the purpose of increasing the transistor and memory cell density. It is also understood that although gate dielectric 218 is shown as being separate (i.e., a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 210, semiconductor body 214 extends vertically (in the z-direction), and the source and the drain are disposed in the different lateral planes, according to some implementations. In some implementations, the source and the drain are formed at two ends of semiconductor body 214 in the vertical direction (the z-direction), respectively, thereby being overlapped in the plan view. As a result, the area (in the x-y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells, ferroelectric capacitors for FRAM cells, and PCM elements for PCM cells. In some implementations, vertical transistor 210 controls the selection and/or the state switch of the respective storage unit 212 coupled to vertical transistor 210. Although a single storage unit 212 is shown in FIG. 2, it is understood that in some examples, multiple storage units 212 (e.g., multiple ferroelectric capacitors) may be stacked in the z-direction and coupled to vertical transistor 210, for example, in a 1TnC memory cell.

Figure 3:
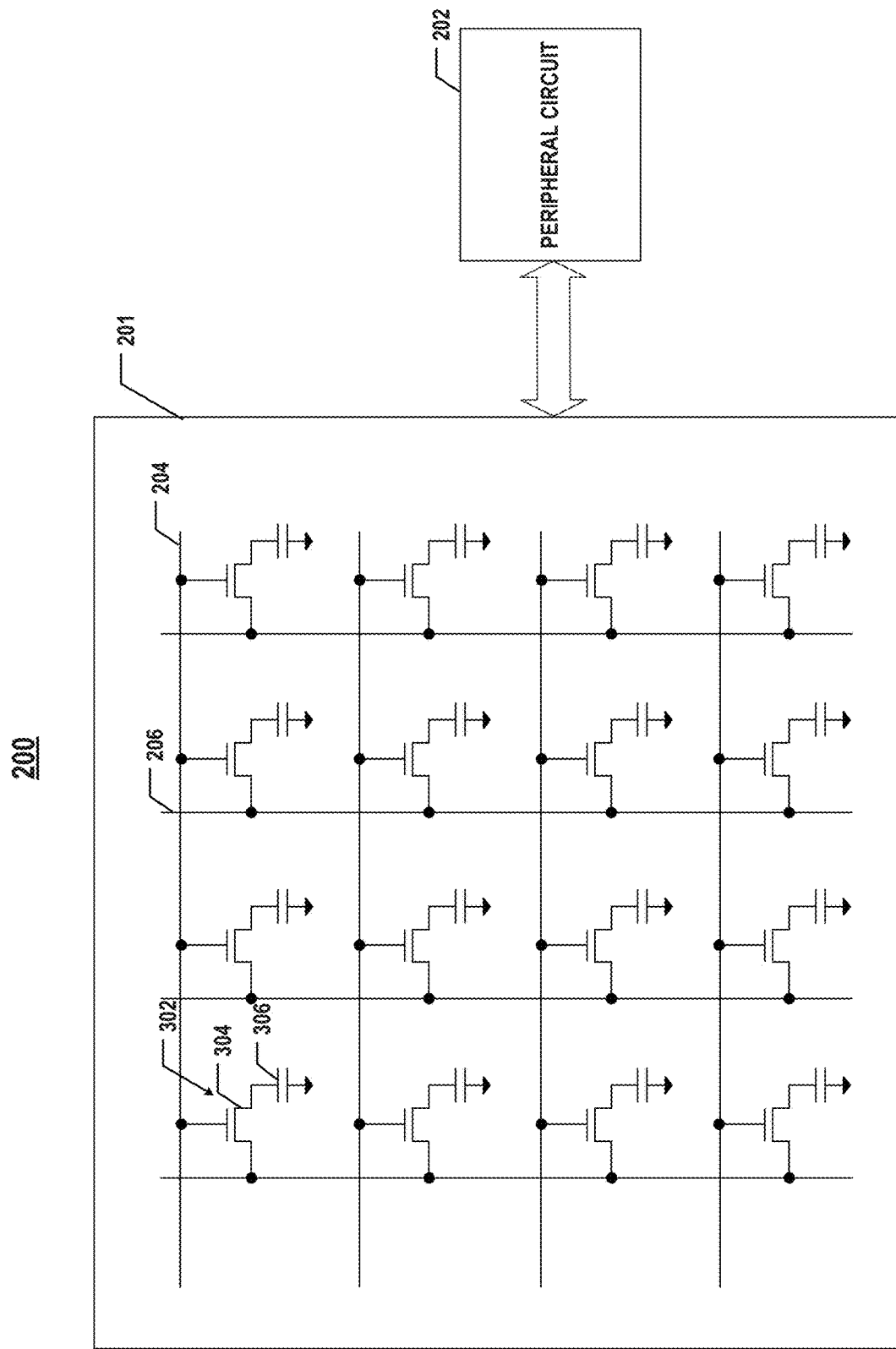
FIG. 3 illustrates a schematic circuit diagram of a memory device including peripheral circuits and an array of dynamic random-access memory (DRAM) cells, according to some aspects of the present disclosure.

In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground.

Figure 4:
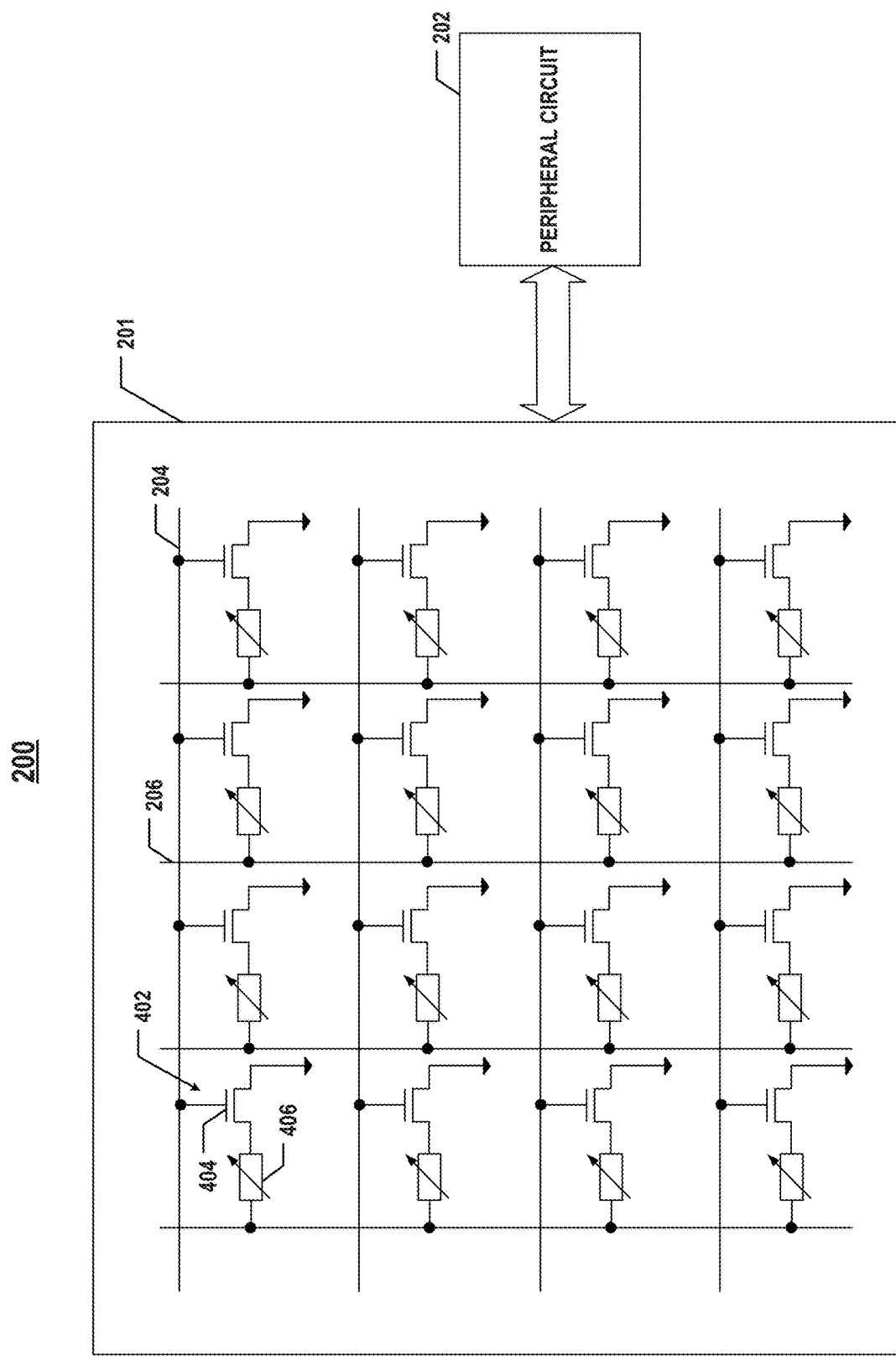
FIG. 4 illustrates a schematic circuit diagram of a memory device including peripheral circuits and an array of phase-change memory (PCM) cells, according to some aspects of the present disclosure.

In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Figure 5A:
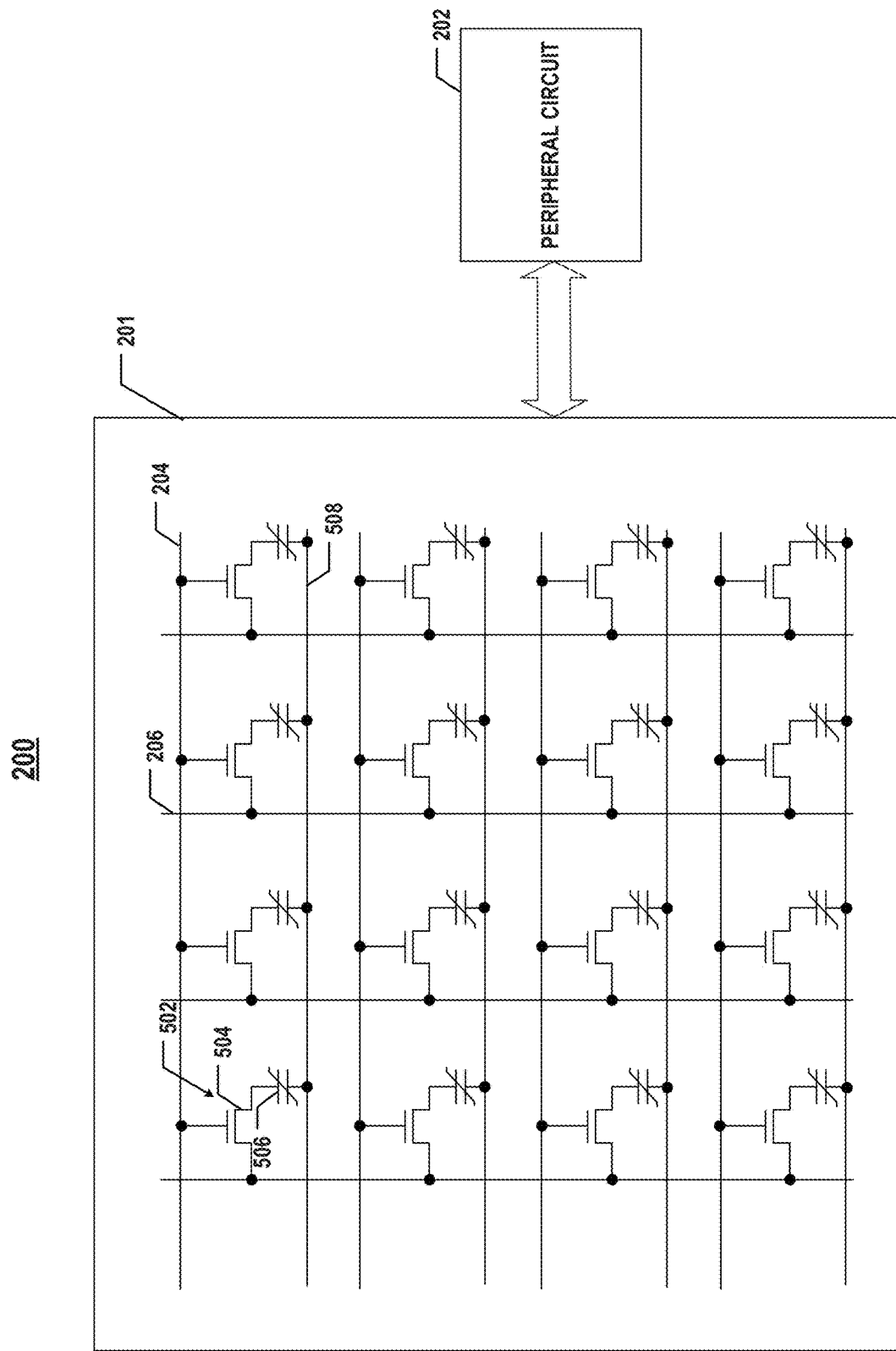
FIG. 5A illustrates a schematic circuit diagram of a memory device including peripheral circuits and an array of ferroelectric random-access memory (FRAM) cells, according to some aspects of the present disclosure.
Figure 5B:
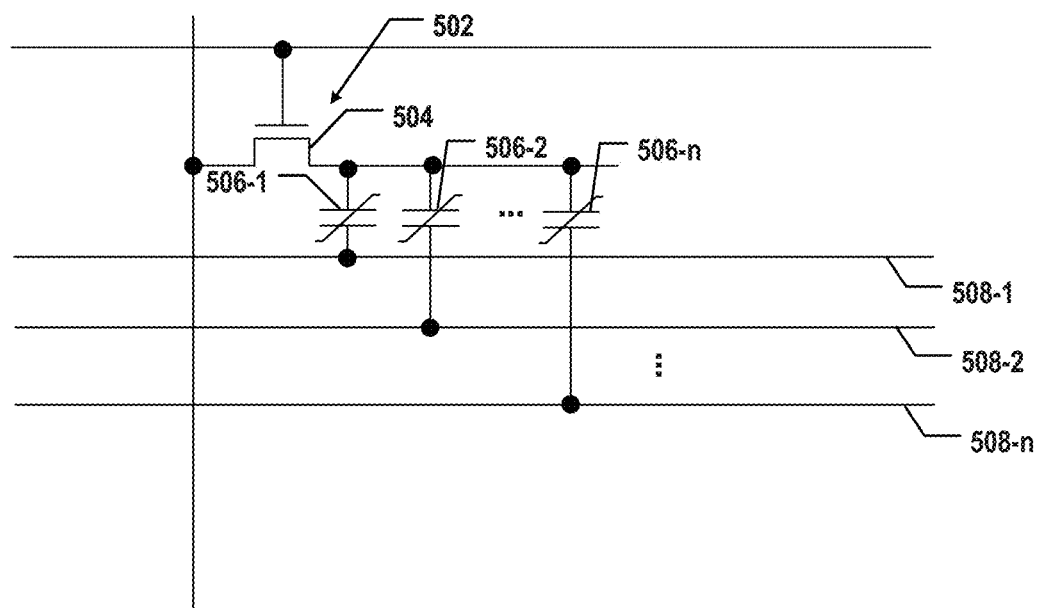
FIG. 5B illustrates a schematic circuit diagram of a 1TnC FRAM cell, according to some aspects of the present disclosure.

In some implementations as shown in FIG. 5A, each memory cell 208 is a FRAM cell 502 including a transistor 504 (e.g., implementing using vertical transistors 210 in FIG. 2) and a ferroelectric capacitor 506 (e.g., an example of storage unit 212 in FIG. 2). The gate of transistor 504 (e.g., corresponding to gate electrode 220) may be coupled to word line 204, one of the source and the drain of transistor 504 may be coupled to bit line 206, the other one of the source and the drain of transistor 504 may be coupled to one electrode of ferroelectric capacitor 506, and the other electrode of ferroelectric capacitor 506 may be coupled to a plate line 508. That is, different from DRAM cell 302 and PCM cell 402 that is controlled by two lines—word line 204 and bit line 206 (a.k.a., two-end memory cell), FRAM cell 502 can be controlled by three lines—word line 204, bit line 206, and plate line 508 (a.k.a., three-end memory cell). Although FIG. 5A shows a 1T1C configuration of FRAM cell 502, it is understood that FRAM cell 502 may be in a 1TnC configuration in other examples. For example, as shown in FIG. 5B, FRAM cell 502 in 1TnC configuration may include n ferrielectric capacitors 506-1, 506-2, . . . , and 506-n coupled to the other one of the source and the drain of transistor 504. That is, one electrode of each ferrielectric capacitor 506-1, 506-2, . . . , or 506-n may be coupled to the same source/drain of transistor 504, and the other electrode of each ferrielectric capacitor 506-1, 506-2, . . . , or 506-n may be coupled a respective one of n plate lines 508-1, 508-2, . . . , and 508-n, such that each ferrielectric capacitor 506-1, 506-2, . . . , or 506-n may be individually controlled by the respective plate line 508-1, 508-2, . . . , or 508-n.

Peripheral circuits 202 can be coupled to memory cell array 201 through bit lines 206, word lines 204, and any other suitable metal wirings. As described above, peripheral circuits 202 can include any suitable circuits for facilitating the operations of memory cell array 201 by applying and sensing voltage signals and/or current signals through word lines 204 and bit lines 206 to and from each memory cell 208. Peripheral circuits 202 can include various types of peripheral circuits formed using CMOS technologies.

Figure 6:
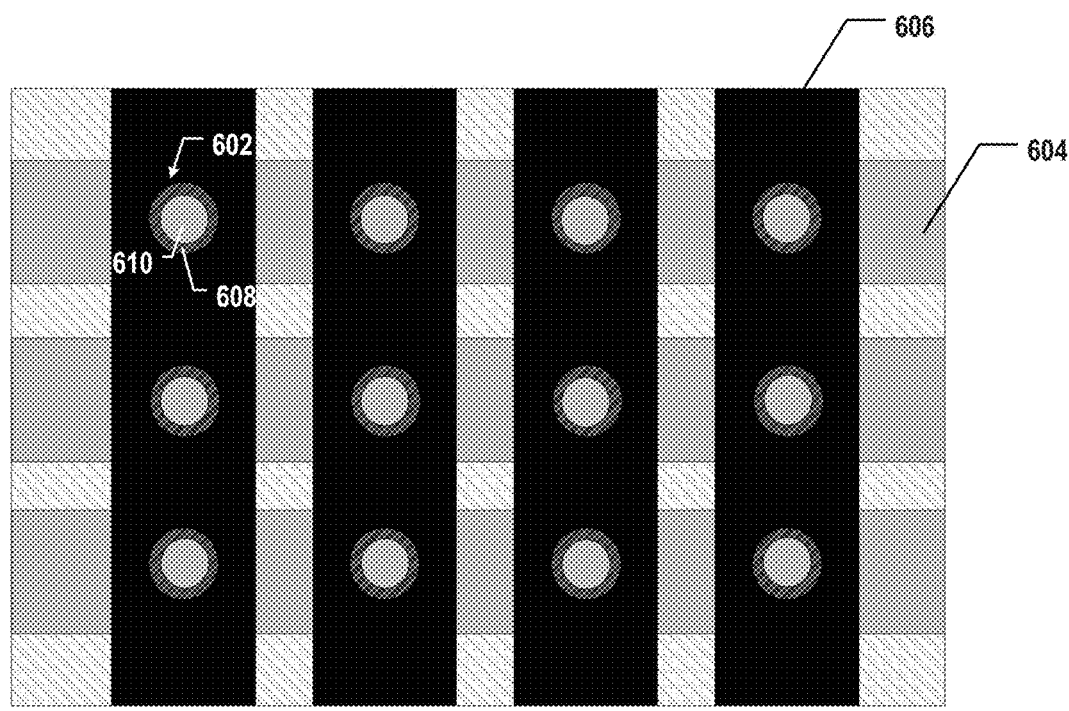
FIG. 6 illustrates a plan view of an array of memory cells each including a vertical transistor in a memory device, according to some aspects of the present disclosure.

According to some aspects of the present disclosure, at one end of the semiconductor body of a vertical transistor that is away from the storage unit, only part of the semiconductor body is doped to form one of the source and drain (e.g., the drain of a DRAM cell or FRAM cell) in contact with the bit line, while the remaining portion (i.e., the channel portion) of the semiconductor body is in contact with a body line for channel charge depletion, thereby reducing the floating body effect of the vertical transistor. For example, FIG. 6 illustrates a plan view of an array of memory cells 602 each including a vertical transistor in a memory device 600, according to some aspects of the present disclosure. As shown in FIG. 6, memory device 600 can include a plurality of word lines 604 each extending in a first lateral direction (the x-direction, referred to as the word line direction). Memory device 600 can also include a plurality of bit lines 606 each extending in a second lateral direction perpendicular to the first lateral direction (the y-direction, referred to as the bit line direction). It is understood that FIG. 6 does not illustrate a cross-section of memory device 600 in the same lateral plane, and word lines 604 and bit lines 606 may be formed in different lateral planes for ease of routing as described below in detail.

Memory cells 602 can be formed at the intersections of word lines 604 and bit lines 606. In some implementations, each memory cell 602 includes a vertical transistor (e.g., vertical transistor 210 in FIG. 2) having a semiconductor body (e.g., semiconductor body 214 in FIG. 2) and a gate structure (e.g., gate structure 216 in FIG. 2). The semiconductor body can extend in the vertical direction (the z-direction, not shown) perpendicular to the first and second lateral directions. The vertical transistor can be a multi-gate transistor or a single-gate transistor. In some implementations, the array of memory cells 602 can be arranged in rows and columns in the plan view. Each row of memory cells 602 can extend in the word line direction, and each column of memory cells 602 can extend in the bit line direction. Rows of memory cells 602 can be separated in the bit line direction, and columns of memory cells 602 can be separated in the word line direction. As shown in FIG. 6, in some implementations, the array of memory cells 602 is arranged in a cross-point orthogonal layout in which memory cells 602 are formed in each cross-point (intersection) of word lines 604 and bit lines 606, two adjacent rows of memory cells 602 in the bit line direction are aligned (not staggered) with one another, and two adjacent columns of memory cells 602 in the word line direction are aligned (not staggered) with one another as well. The unit cell size of the cross-point orthogonal layout in FIG. 6 may be, for example, $4F^2$ (a.k.a., 4F2 cell size).

The semiconductor body can include a doped source 608, a doped drain 608, and a channel portion 610. At one end of the semiconductor body in the vertical direction (the end away from the storage unit, e.g., as shown in the plan view of FIG. 6), the semiconductor body is partially doped to form doped source/drain 608 and channel portion 610 surrounded by source/drain 608, according to some implementations. For each column of memory cells 602, the respective bit line 606 is coupled to sources/drains 608, but not channel portions 610, of the semiconductor bodies, according to some implementations. That is, bit line 606 can be in contact with source/drain 608, but separated from channel portion 610, of the semiconductor body of respective memory cells 602 by source/drain 608. Different from vertical transistors in some memory devices in which the end of the semiconductor body away from the storage unit is fully doped and thus, fully covered with the source/drain and in contact with the bit line, channel portion 610 of the semiconductor body can be coupled to a body line (not shown in FIG. 6) to release the channel charge from the semiconductor body through the body line.

As shown in FIG. 6, in some implementations, source/drain 608 is formed on all sides of the semiconductor body, and bit line 606 fully circumscribes (e.g., surrounding and contacting) the semiconductor body in the plan view. In some implementations, source/drain 608 is laterally between bit line 606 and channel portion 610 in x-direction and y-direction in the plan view. It is understood that although the semiconductor body shown in FIG. 6 has a circular-shaped cross-section in the plan view, source/drain 608 may be formed on all sides of a semiconductor body having a cross-section with any suitable shape as described above, such as all four sides of a semiconductor body having a rectangle or square-shaped cross-section in the plan view.

Figure 7A:
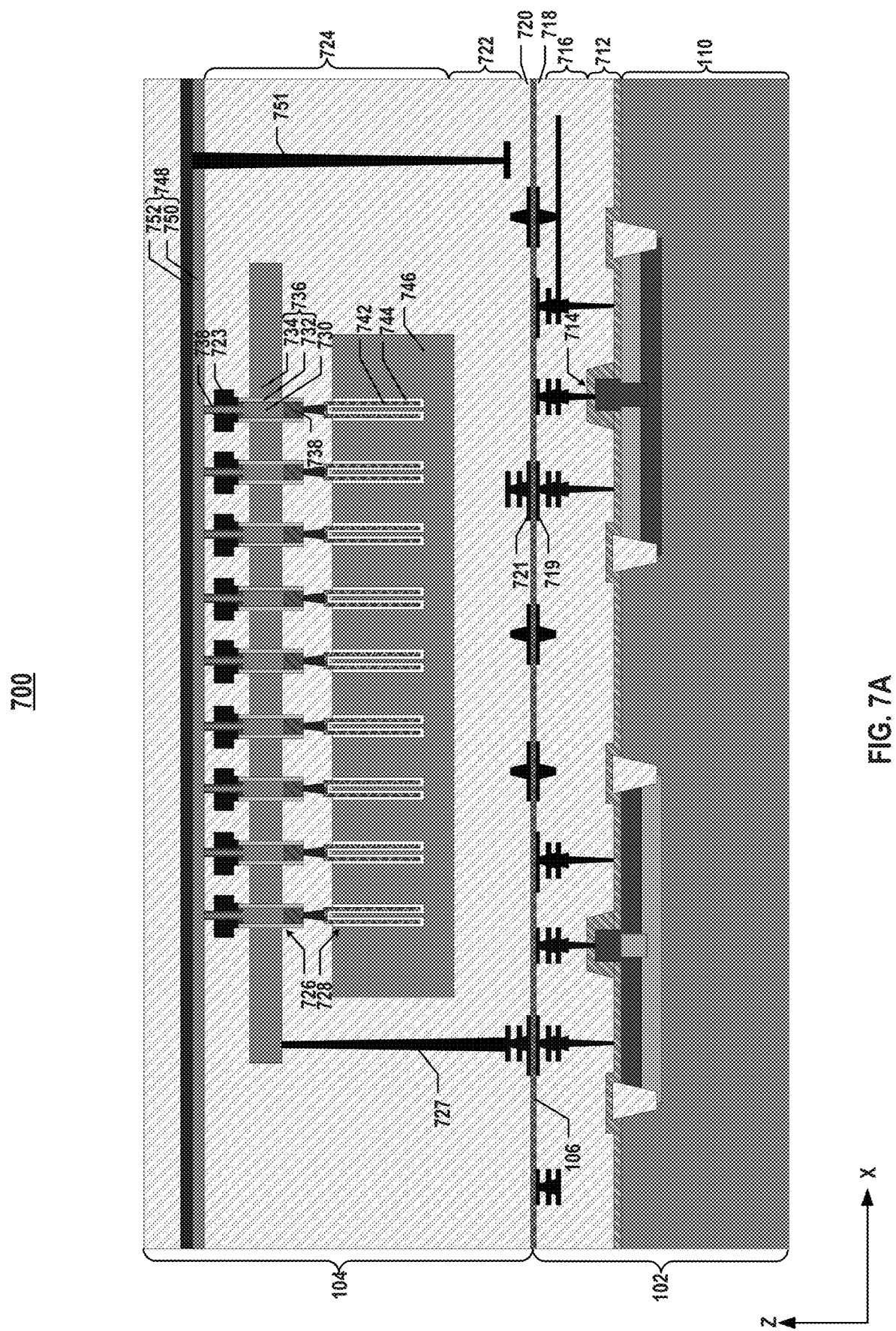
FIG. 7A illustrates a side view of a cross-section of a 3D memory device including vertical transistors, according to some aspects of the present disclosure.

FIG. 7A illustrates a side view of a cross-section of a 3D memory device 700 including vertical transistors, according to some aspects of the present disclosure. 3D memory device 700 may be one example of memory device 600. It is understood that FIG. 7A is for illustrative purposes only and may not necessarily reflect the actual device structure (e.g., interconnections) in practice. As one example of 3D memory device 100 described above with respect to FIG. 1A, 3D memory device 700 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 7A, first semiconductor structure 102 can include substrate 110, which can include silicon (e.g., single crystalline silicon, c-Si), silicon germanium (SiGe), gallium arsenide (GaAs), germanium (Ge), silicon-on-insulator (SOI), or any other suitable materials.

First semiconductor structure 102 can include peripheral circuits 712 on substrate 110. In some implementations, peripheral circuits 712 include a plurality of transistors 714 (e.g., planar transistors and/or 3D transistors). Trench isolations (e.g., shallow trench isolations (STIs)) and doped regions (e.g., wells, sources, and drains of transistors 714) can be formed on or in substrate 110 as well.

In some implementations, first semiconductor structure 102 further includes an interconnect layer 716 above peripheral circuits 712 to transfer electrical signals to and from peripheral circuits 712. Interconnect layer 716 can include a plurality of interconnects (also referred to herein as "contacts"), including lateral interconnect lines and vertical interconnect access (VIA) contacts. As used herein, the term "interconnects" can broadly include any suitable types of interconnects, such as middle-end-of-line (MEOL) interconnects and back-end-of-line (BEOL) interconnects. Interconnect layer 716 can further include one or more interlayer dielectric (ILD) layers (also known as "intermetal dielectric (IMD) layers") in which the interconnect lines and via contacts can form. That is, interconnect layer 716 can include interconnect lines and via contacts in multiple ILD layers. In some implementations, peripheral circuits 712 are coupled to one another through the interconnects in interconnect layer 716. The interconnects in interconnect layer 716 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 7A, first semiconductor structure 102 can further include a bonding layer 718 at bonding interface 106 and above interconnect layer 716 and peripheral circuits 712. Bonding layer 718 can include a plurality of bonding contacts 719 and dielectrics electrically isolating bonding contacts 719. Bonding contacts 719 can include conductive materials, such as Cu. The remaining area of bonding layer 718 can be formed with dielectric materials, such as silicon oxide. Bonding contacts 719 and surrounding dielectrics in bonding layer 718 can be used for hybrid bonding. Similarly, as shown in FIG. 7A, second semiconductor structure 104 can also include a bonding layer 720 at bonding interface 106 and above bonding layer 718 of first semiconductor structure 102. Bonding layer 720 can include a plurality of bonding contacts 721 and dielectrics electrically isolating bonding contacts 721. Bonding contacts 721 can include conductive materials, such as Cu. The remaining area of bonding layer 720 can be formed with dielectric materials, such as silicon oxide. Bonding contacts 721 and surrounding dielectrics in bonding layer 720 can be used for hybrid bonding. Bonding contacts 721 are in contact with bonding contacts 719 at bonding interface 106, according to some implementations.

Second semiconductor structure 104 can be bonded on top of first semiconductor structure 102 in a face-to-face manner at bonding interface 106. In some implementations, bonding interface 106 is disposed between bonding layers 720 and 718 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 720 and 718 are met and bonded. In practice, bonding interface 106 can be a layer with a certain thickness that includes the top surface of bonding layer 718 of first semiconductor structure 102 and the bottom surface of bonding layer 720 of second semiconductor structure 104.

In some implementations, second semiconductor structure 104 further includes an interconnect layer 722 above bonding layer 720 to transfer electrical signals. Interconnect layer 722 can include a plurality of interconnects, such as MEOL interconnects and BEOL interconnects. In some implementations, the interconnects in interconnect layer 722 also include local interconnects, such as bit line contacts (not shown), word line contacts 727, and body line contacts 751. Interconnect layer 722 can further include one or more ILD layers in which the interconnect lines and via contacts can form. The interconnects in interconnect layer 722 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low dielectric constant (low-k) dielectrics, or any combination thereof. In some implementations, peripheral circuits 712 include a word line driver/row decoder coupled to word line contacts 727 in interconnect layer 722 through bonding contacts 721 and 719 in bonding layers 720 and 718 and interconnect layer 716. In some implementations, peripheral circuits 712 include a bit line driver/column decoder coupled to the bit line contacts in interconnect layer 722 through bonding contacts 721 and 719 in bonding layers 720 and 718 and interconnect layer 716. In some implementations, peripheral circuits 712 include a voltage source or the ground that is coupled to body line contacts 751 in interconnect layer 722 through bonding contacts 721 and 719 in bonding layers 720 and 718 and interconnect layer 716.

In some implementations, second semiconductor structure 104 includes a DRAM device in which memory cells are provided in the form of an array of DRAM cells 724 (e.g., an example of memory cells 602 in FIG. 6) above interconnect layer 722 and bonding layer 720. It is understood that the cross-section of 3D memory device 700 in FIG. 7A may be made along the word line direction (the x-direction), and one word line 734 extending laterally in the x-direction may be coupled to a row of DRAM cells 724. Each DRAM cell 724 can include a vertical transistor 726 (e.g., an example of vertical transistors 210 in FIG. 2) and a capacitor 728 (e.g., an example of storage unit 212 in FIG. 2) coupled to vertical transistor 726. DRAM cell 724 can be in the 1T1C configuration (i.e., a 1T1C cell) consisting of one transistor and one capacitor. It is understood that DRAM cell 724 may be of any suitable configurations, such as nT1C, 1TnC, nTnC, etc.

Vertical transistor 726 can be a MOSFET used to switch a respective DRAM cell 724. In some implementations, vertical transistor 726 includes a semiconductor body 730 (i.e., the active region in which multiple channels can form) extending vertically (in the z-direction), and a gate structure 736 in contact with one or more sides of semiconductor body 730. In some implementations in which vertical transistor 726 is a GAA vertical transistor, semiconductor body 730 has a cuboid shape or a cylinder shape, and gate structure 736 is in contact with all sides of semiconductor body 730, i.e., fully circumscribing semiconductor body 730 in the plan view. In some implementations in which vertical transistor 726 is a tri-gate vertical transistor, a double-gate vertical transistor, or a single-gate vertical transistor, semiconductor body 730 has a cuboid shape or a cylinder shape, and gate structure 736 is in contact with one or some sides, but not all sides, of semiconductor body 730, i.e., partially circumscribing semiconductor body 730 in the plan view. Gate structure 736 includes a gate electrode 734 and a gate dielectric 732 laterally between gate electrode 734 and semiconductor body 730 in at least the word line direction, according to some implementations. For example, for semiconductor body 730 having a cylinder shape, semiconductor body 730, gate dielectric 732, and gate electrode 734 may be disposed radially from the center of vertical transistor 726 in this order. In some implementations, gate dielectric 732 surrounds and contacts semiconductor body 730, and gate electrode 734 surrounds and contacts gate dielectric 732.

In some implementations, gate dielectric 732 includes dielectric materials, such as silicon oxide, silicon nitride, or high-k dielectrics including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. In some implementations, gate electrode 734 includes conductive materials including, but not limited to W, Co, Cu, Al, TiN, TaN, polysilicon, silicides, or any combination thereof. In some implementations, gate electrode 734 includes multiple conductive layers, such as a W layer over a TiN layer. In one example, gate structure 736 may be a "gate oxide/gate poly" gate in which gate dielectric 732 includes silicon oxide and gate electrode 734 includes doped polysilicon. In another example, gate structure 736 may be a high-k metal gate (HKMG) in which gate dielectric 732 includes a high-k dielectric and gate electrode 734 includes a metal.

As shown in FIG. 7A, in some implementations, semiconductor body 730 has two ends (the upper end and lower end) in the vertical direction (the z-direction), and both ends extend beyond gate electrode/word line 734, respectively, in the vertical direction (the z-direction) into ILD layers. That is, semiconductor body 730 can have a larger vertical dimension (e.g., the depth) than that of gate electrode/word line 734 (e.g., in the z-direction), and neither the upper end nor the lower end of semiconductor body 730 is flush with the respective end of gate electrode/word line 734. Thus, short circuits between bit lines 723 and word lines/gate electrodes 734 or between word lines/gate electrodes 734 and capacitors 728 can be avoided.

Figure 7B:
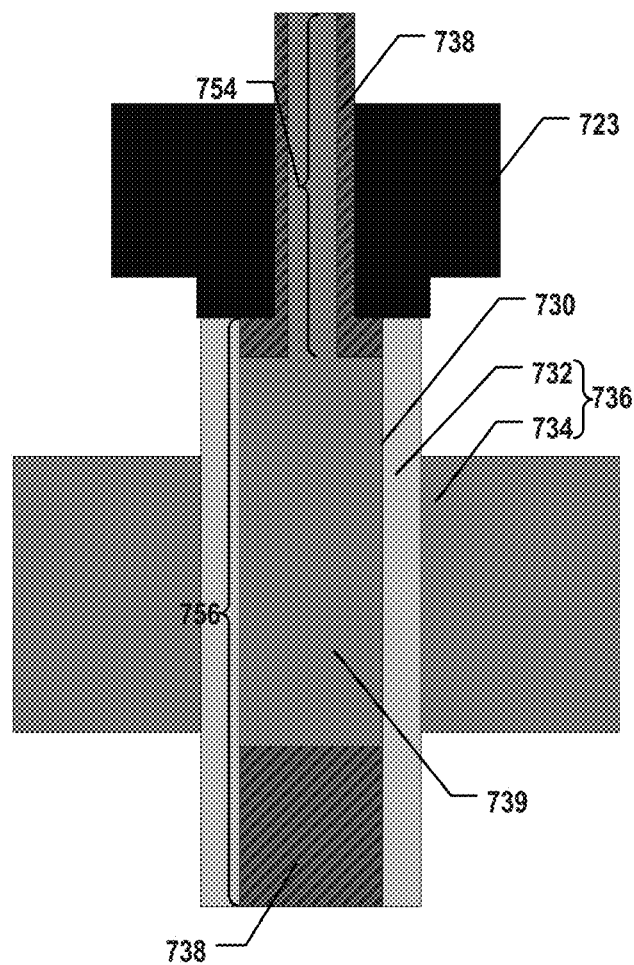
FIG. 7B illustrates an enlarged side view of a cross-section of the vertical transistor in FIG. 7A, according to some aspects of the present disclosure.

As shown in FIG. 7A and the enlarged view of FIG. 7B, semiconductor body 730 of vertical transistor 726 can include a source and a drain (both referred to as 738 as their locations may be interchangeable) as well as a channel portion 739 from the doping perspective, i.e., whether a particular portion of semiconductor body 730 is doped or the type of dopant thereof. In one example, the lower end of semiconductor body 730 that is coupled to capacitor 728 may be fully doped to form one of source and drain 738 (e.g., the source of vertical transistor 726), while the upper end of semiconductor body 730 away from capacitor 728 may be partially doped to form the other one of source and drain 738 (e.g., the drain of vertical transistor 726). The remaining undoped/intrinsic portion of semiconductor body 730 thus may become channel portion 739. In another example, the lower end of semiconductor body 730 that is coupled to capacitor 728 may be fully doped with N-type dopant(s) form one of source and drain 738 (e.g., the source of vertical transistor 726), while the upper end of semiconductor body 730 away from capacitor 728 may be partially doped with N-type dopant(s) to form the other one of source and drain 738 (e.g., the drain of vertical transistor 726). The remaining portion of semiconductor body 730 thus may become channel portion 739, which may be doped with P-type dopant(s). In still another example, the lower end of semiconductor body 730 that is coupled to capacitor 728 may be fully doped with P-type dopant(s) form one of source and drain 738 (e.g., the source of vertical transistor 726), while the upper end of semiconductor body 730 away from capacitor 728 may be partially doped with P-type dopant(s) to form the other one of source and drain 738 (e.g., the drain of vertical transistor 726). The remaining portion of semiconductor body 730 thus may become channel portion 739, which may be doped with N-type dopant(s). In some implementations, semiconductor body 730 has a base 756 and a protrusion 754 from the shape perspective, i.e., the relative dimensions and geometric relationships between different portions of semiconductor body 730, as shown in FIG. 7B. For example, base 756 may have a larger lateral dimension than protrusion 754. Protrusion 754 can protrude entirely from the interior of base 756, i.e., all sides of protrusion 754 being within the boundary of base 756 in the plan view. In some implementations, base 756 faces word line/gate electrode 734, and protrusion 754 faces bit line 723.

One of source and drain 738 (e.g., at the lower end in FIG. 7A) can be formed on one end (e.g., the lower end in FIG. 7A) of base 756. The other one of source and drain 738 (e.g., at the upper end in FIG. 7A) can be formed on one or more sides of protrusion 754 of semiconductor body 730. In some implementations, as shown in FIGS. 7A and 7B, one of source and drain 738 that is away from capacitor 728 (e.g., the drain of vertical transistor 726) is formed on all sides of protrusion 754. Channel portion 739 can be formed in both base 756 and protrusion 754 of semiconductor body 730. That is, both base 756 and protrusion 754 of semiconductor body 730 can have portions that are undoped or doped with a different type of dopant from source and drain 738, becoming channel portion 739. As shown in FIGS. 7A and 7B, different from the lower end (i.e., bottom) of base 756 that is doped to become part of source/drain 738, the upper end (i.e., top) of protrusion 754 is not doped with the same type of dopant as source and drain 738 to become part of source/drain 738, but remains as part of channel portion 739, according to some implementations. As shown in FIG. 7B, gate dielectric 732 of gate structure 736 is in contact with base 756 of semiconductor body 730, but does not extend further to be in contact with protrusion 754 of semiconductor body 730, according to some implementations. In other words, gate dielectric 732 can be separated from protrusion 754 of semiconductor body 730.

In some implementations, semiconductor body 730 includes semiconductor materials, such as single crystalline silicon, polysilicon, amorphous silicon, Ge, any other semiconductor materials, or any combinations thereof. In one example, semiconductor body 730 may include single crystalline silicon, and channel portion 739 of semiconductor body 730 may include undoped single crystalline silicon or doped single crystalline silicon having a different type of dopant from source and drain 738. Source and drain 738 can be doped with N-type dopants (e.g., P or As) or P-type dopants (e.g., B or Ga) at a desired doping level. In some implementations, source and drain 738 are doped with N-type dopants (e.g., P or As), and channel proportion 739 is undoped/intrinsic or doped with P-type dopants (e.g., B or Ga).

As described above, since gate electrode 734 may be part of a word line or extend in the word line direction (e.g., the x-direction in FIG. 6) as a word line, although not directly shown in FIG. 7A, second semiconductor structure 104 of 3D memory device 700 can also include a plurality of word lines (e.g., an example of word lines 604 in FIG. 6, referred to as 734 as well) each extending in the word line direction (the x-direction). Each word line 734 can be coupled to a row of DRAM cells 724. That is, bit line 723 and word line 734 can extend in two perpendicular lateral directions, and semiconductor body 730 of vertical transistor 726 can extend in the vertical direction perpendicular to the two lateral directions in which bit line 723 and word line 734 extend. Word lines 734 are in contact with word line contacts 727, according to some implementations. In some implementations, word lines 734 include conductive materials including, but not limited to W, Co, Cu, Al, TiN, TaN, polysilicon, silicides, or any combination thereof. In some implementations, word line 734 includes multiple conductive layers, such as a W layer over a TiN layer.

As shown in FIG. 7A, second semiconductor structure 104 of 3D memory device 700 can also include a plurality of bit lines 723 (e.g., an example of bit lines 606 in FIG. 6) each extending in the bit line direction (the y-direction in FIG. 6). Each bit line 723 can be coupled to a column of DRAM cells 724. In some implementations, bit line 723 is coupled to one of source and drain 738 that is away from capacitor 728 (e.g., the drain of vertical transistor 726). For example, as shown in FIG. 7B, bit line 723 may be in contact with source/drain 738 that is formed on all sides of protrusion 754 of semiconductor body 730, but separated from channel portion 739 of semiconductor body 730 by source/drain 738. That is, bit line 723 is not in contact with channel portion 739 of semiconductor body 730 in which the channels of vertical transistor 726 are formed to suppress the floating body effect, according to some implementations.

As shown in FIG. 7A, second semiconductor structure 104 of 3D memory device 700 can further include a body line 748 extending laterally (in the bit line direction and/or word line direction) and coupled to channel portion 739 of semiconductor body 730. Body line 748 can also be coupled to body line contact 751, which can be in turn coupled to peripheral circuits 712 in first semiconductor structure 102 through interconnect layers 722 and 716 and bonding layers 718 and 720. As a result, channel portion 739 of semiconductor body 730 can be coupled to a certain potential, for example, by a voltage source or the ground in peripheral circuits 712, through body line 748, body line contact 751, and any other suitable interconnects in interconnect layers 722 and 716 and bonding layers 718 and 720, such that channel charge in channel portion 739 of semiconductor body 730 can be released during operation of 3D memory device 700 to mitigate the floating body effect and the resulting issues. It is understood that in some examples, body line 748 may be coupled to a voltage source or the ground not in peripheral circuits 712 as long as the charge of the channels in semiconductor body 730 can be depleted.

As described above, the upper end (top) of protrusion 754 of semiconductor body 730 is not covered by source/drain 738, such that body line 748 can be in contact with channel portion 739 of semiconductor body 730. In some implementations, the upper end of protrusion 754 extends beyond bit line 723 such that body line 748 in contact with the upper end of protrusion 754 is separated from bit line 723 to avoid short circuits. In some implementations, body line 748 includes a polysilicon layer 750 in contact with channel portion 739 of semiconductor body 730 to reduce the contact resistance between body line 748 and semiconductor body 730. In some implementations, body line 748 further includes a metal layer 752 (e.g., W or Cu layer) in contact with polysilicon layer 750 to reduce the sheet resistance of body line 748. It is understood that the structure and/or materials of body line 748 may vary in other examples as long as body line 748 can couple channel portion 739 of semiconductor body 730 to a certain potential with reasonable contact and sheet resistances.

Body line 748 and capacitor 728 can be coupled to opposite ends of vertical transistor 726 in the z-direction. For example, body line 748 may be coupled to the upper end of vertical transistor 726, while capacitor 728 may be coupled to the lower end of vertical transistor 726, as shown in FIG. 7A. In some implementations, bit line 723 is between capacitor 728 and body line 748 in the z-direction as bit line 723 is in contact with the sides of protrusion 754 of semiconductor body 730 while body line 748 is in contact with the upper end of protrusion 754. In some implementations, capacitor 728 is between bonding interface 106 and vertical transistor 726 in the z-direction, and word line 734 is between bonding interface 106 and bit line 723 in the z-direction. The relative spatial relationships of various components in second semiconductor structure 104 of 3D memory device 700 that are described above as well as depicted in FIG. 7A may result from the face-to-face bonding process between first and second semiconductor structures 102 and 104 as well as the backside process for forming protrusion 754, bit line 723, and body line 748 as described below in detail with respect to the fabrication processes, which enable the design of vertical transistor 726 with reduced floating body effect.

As shown in FIG. 7A, in some implementations, capacitor 728 includes a first electrode 742 below and coupled to source or drain 738 of vertical transistor 726, e.g., at the lower end of base 756 of semiconductor body 730. Capacitor 728 can also include a capacitor dielectric 744 in contact with first electrode 742, and a second electrode 746 in contact with capacitor dielectric 744. That is, capacitor dielectric 744 can be sandwiched between electrodes 742 and 746. In some implementations, each first electrode 742 is coupled to source or drain 738 of a respective vertical transistor 726 in the same DRAM cell 724, while all second electrodes 746 are parts of a common plate coupled to the ground, e.g., a common ground. Although not shown in FIG. 7A, it is understood that second semiconductor structure 104 may further include a capacitor contact in contact with the common plate of second electrodes 746 for coupling second electrodes 746 of capacitor 728 to peripheral circuits 712 or to the ground directly.

It is understood that the structure and configuration of capacitor 728 are not limited to the interdigitated capacitor (a.k.a., finger capacitor) example in FIG. 7A and may include any suitable structure and configuration, such as a planar capacitor, a stack capacitor, a multi-fins capacitor, a cylinder capacitor, a trench capacitor, or a substrate-plate capacitor. In some implementations, capacitor dielectric 744 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 728 may be a ferroelectric capacitor used in a FRAM cell, and capacitor dielectric 744 may be replaced by a ferroelectric layer having ferroelectric materials, such as lead zirconate titanate (PZT) or strontium bismuth tantalate (SBT). In some implementations, electrodes 742 and 746 include conductive materials including, but not limited to W, Co, Cu, Al, TiN, TaN, polysilicon, silicides, or any combination thereof.

Although not shown in FIG. 7A, it is understood that in some examples, second semiconductor structure 104 may further include a pad-out interconnect layer (e.g., pad-out interconnect layer 108 in FIG. 1A) above body line 748. The pad-out interconnect layer may include interconnects, e.g., contact pads, in one or more ILD layers. The pad-out interconnect layer and interconnect layer 722 can be formed on opposite sides of DRAM cells 724. Vertical transistors 726 are disposed vertically between capacitors 728 and the pad-out interconnect layer, according to some implementations. In some implementations, the interconnects in the pad-out interconnect layer can transfer electrical signals between 3D memory device 700 and outside circuits, e.g., for pad-out purposes. It is also understood that the pad-out of 3D memory devices is not limited to from second semiconductor structure 104 having DRAM cells 724 and may be from first semiconductor structure 102 having peripheral circuit 712. For example, as shown in FIG. 1B, 3D memory device 101 may include a pad-out interconnect layer in first semiconductor structure 102.

Figure 8:
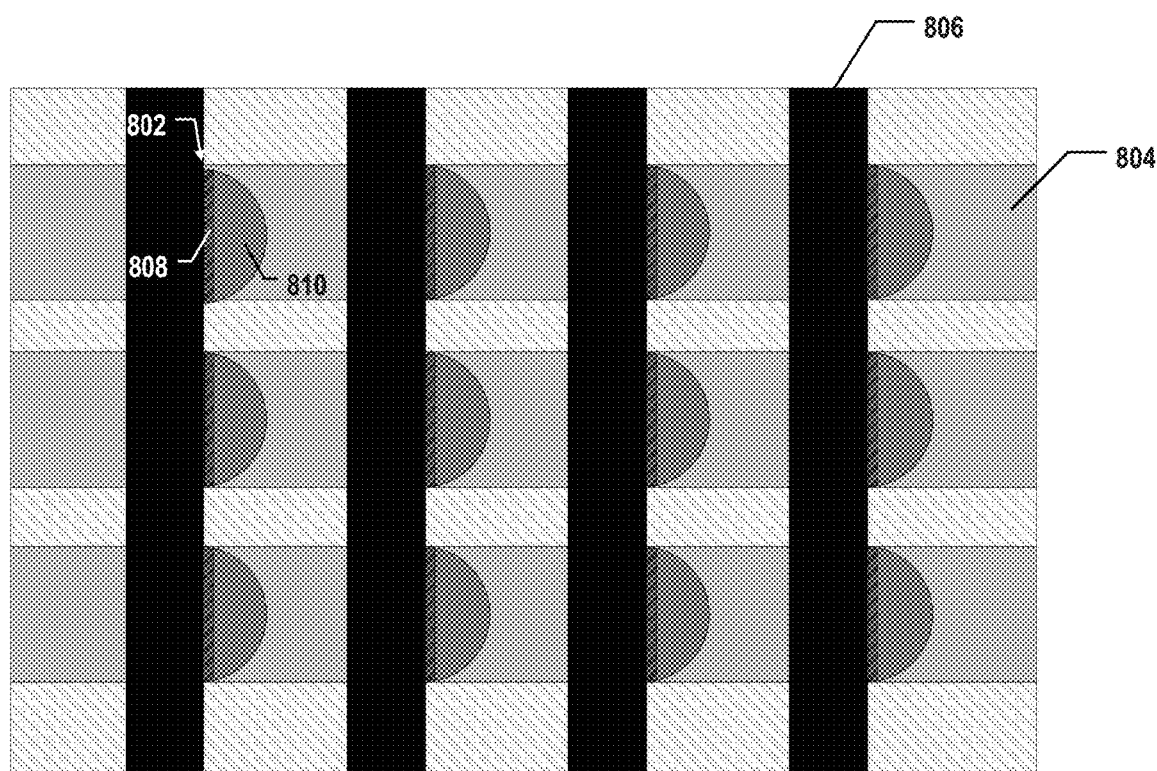
FIG. 8 illustrates a plan view of another array of memory cells each including a vertical transistor in a memory device, according to some aspects of the present disclosure.

It is further understood that the memory cell array is not limited to the example shown in FIGS. 6, 7A, and 7B in which the bit line fully circumscribes the protrusion of the semiconductor body in the plan view, and the source/drain is formed on all sides of the protrusion of the semiconductor body. For example, FIG. 8 illustrates a plan view of another array of memory cells 802 each including a vertical transistor in a memory device 800, according to some aspects of the present disclosure. As shown in FIG. 8, memory device 800 can include a plurality of word lines 804 each extending in a first lateral direction (the x-direction, referred to as the word line direction). Memory device 800 can also include a plurality of bit lines 806 each extending in a second lateral direction perpendicular to the first lateral direction (the y-direction, referred to as the bit line direction). It is understood that FIG. 8 does not illustrate a cross-section of memory device 800 in the same lateral plane, and word lines 804 and bit lines 806 may be formed in different lateral planes for ease of routing as described below in detail.

Memory cells 802 can be formed at the intersections of word lines 804 and bit lines 806. In some implementations, each memory cell 802 includes a vertical transistor (e.g., vertical transistor 210 in FIG. 2) having a semiconductor body (e.g., semiconductor body 214 in FIG. 2) and a gate structure (e.g., gate structure 216 in FIG. 2). The semiconductor body can extend in the vertical direction (the z-direction, not shown) perpendicular to the first and second lateral directions. The vertical transistor can be a multi-gate transistor or a single-gate transistor. In some implementations, the array of memory cells 802 can be arranged in rows and columns in the plan view. Each row of memory cells 802 can extend in the word line direction, and each column of memory cells 802 can extend in the bit line direction. Rows of memory cells 802 can be separated in the bit line direction, and columns of memory cells 802 can be separated in the word line direction. As shown in FIG. 8, in some implementations, the array of memory cells 802 is arranged in a cross-point orthogonal layout in which memory cells 802 are formed in each cross-point (intersection) of word lines 804 and bit lines 806, two adjacent rows of memory cells 802 in the bit line direction are aligned (not staggered) with one another, and two adjacent columns of memory cells 802 in the word line direction are aligned (not staggered) with one another as well. The unit cell size of the cross-point orthogonal layout in FIG. 8 may be, for example, $4F^2$ (a.k.a., 4F2 cell size).

The semiconductor body can include a doped source 808, a doped drain 808, and a channel portion 810. At one end of the semiconductor body in the vertical direction (the end away from the storage unit, e.g., as shown in the plan view of FIG. 8), the semiconductor body is partially doped to form doped source/drain 808 and channel portion 810, according to some implementations. Different from memory cell 602 in FIG. 6 in which channel portion 610 is surrounded by source/drain 608, in FIG. 8, channel portion 810 is not surrounded by source/drain 808, according to some implementations. Instead, source/drain 808 abuts only one side of channel portion 810 in the plan view, according to some implementations. For each column of memory cells 802, the respective bit line 806 is coupled to sources/drains 808, but not channel portions 810, of the semiconductor bodies, according to some implementations. That is, bit line 806 can be in contact with source/drain 808, but separated from channel portion 810, of the semiconductor body of respective memory cells 802 by source/drain 808. Different from vertical transistors in some memory devices in which the end of the semiconductor body away from the storage unit is fully doped and thus, fully covered with the source/drain and in contact with the bit line, channel portion 810 of the semiconductor body can be coupled to a body line (not shown in FIG. 8) to release the channel charge from the semiconductor body through the body line.

Different from memory cell 602 in FIG. 6 in which source/drain 608 is formed on all sides of the semiconductor body, and bit line 606 fully circumscribes the semiconductor body in the plan view, as shown in FIG. 8, in some implementations, source/drain 808 is formed on one or some, but not all, sides of the semiconductor body, and bit line 806 partially circumscribes (e.g., surrounding and contacting) the semiconductor body in the plan view. In some implementations, source/drain 808 is laterally between bit line 806 and channel portion 810 in the x-direction, but not in the y-direction, in the plan view. It is understood that although the semiconductor body shown in FIG. 8 has a semicircular-shaped cross-section in the plan view, source/drain 808 may be formed on one or some sides of a semiconductor body having a cross-section with any suitable shape as described above, such as one of the four sides of a semiconductor body having a rectangle or square-shaped cross-section in the plan view.

Figure 9A:
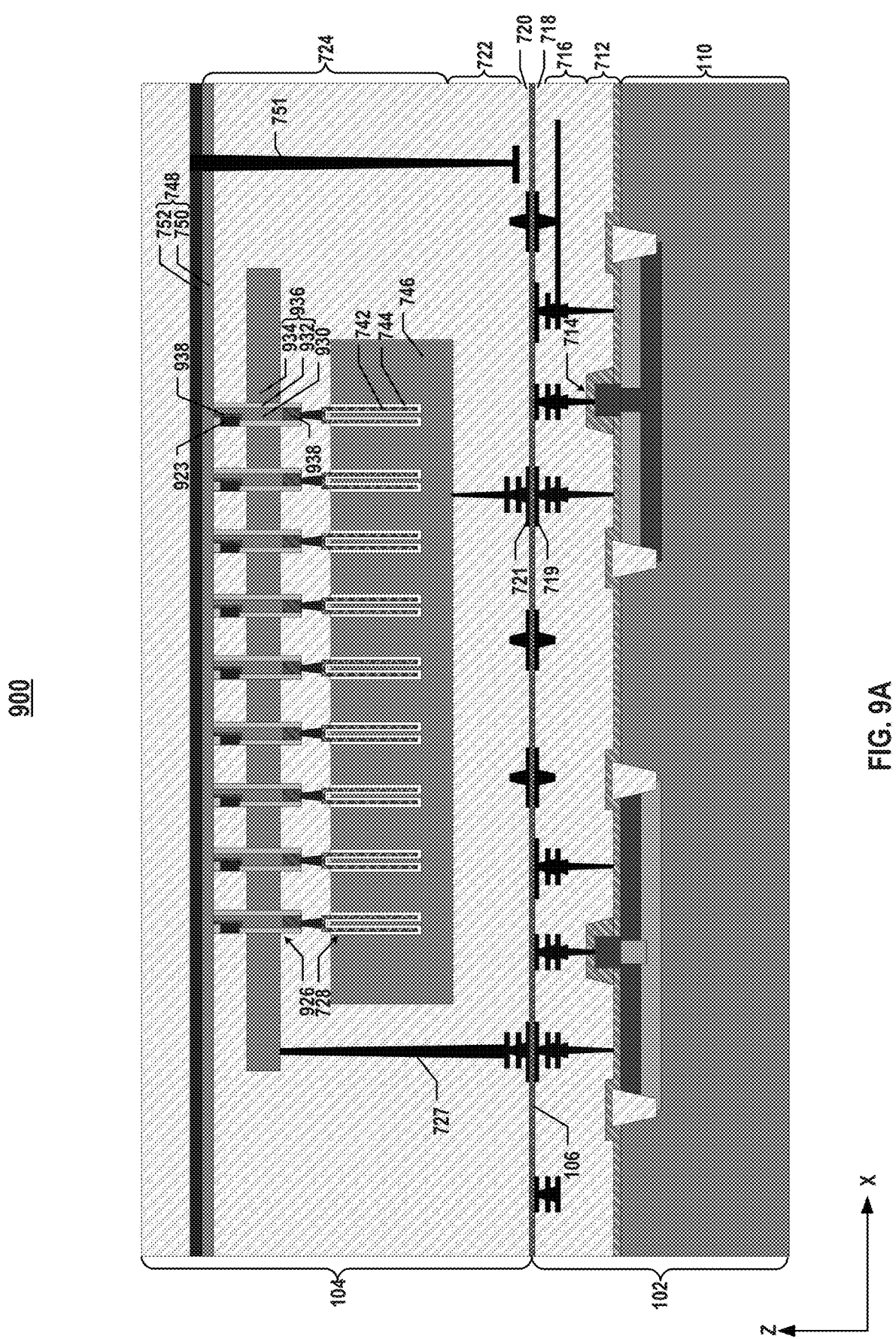
FIG. 9A illustrates a side view of a cross-section of another 3D memory device including vertical transistors, according to some aspects of the present disclosure.

FIG. 9A illustrates a side view of a cross-section of another 3D memory device 900 including vertical transistors, according to some aspects of the present disclosure. 3D memory device 900 may be one example of memory device 900. It is understood that FIG. 9A is for illustrative purposes only and may not necessarily reflect the actual device structure (e.g., interconnections) in practice. As one example of 3D memory device 100 described above with respect to FIG. 1A, 3D memory device 900 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 9A, first semiconductor structure 102 can include substrate 110, which can include silicon (e.g., single crystalline silicon, c-Si), SiGe, GaAs, Ge, SOI, or any other suitable materials.

First semiconductor structure 102 can include peripheral circuits 712 on substrate 110. In some implementations, peripheral circuits 712 include a plurality of transistors 714 (e.g., planar transistors and/or 3D transistors). Trench isolations (e.g., STIs) and doped regions (e.g., wells, sources, and drains of transistors 714) can be formed on or in substrate 110 as well.

In some implementations, first semiconductor structure 102 further includes an interconnect layer 716 above peripheral circuits 712 to transfer electrical signals to and from peripheral circuits 712. Interconnect layer 716 can include a plurality of interconnects, including lateral interconnect lines VIA contacts. Interconnect layer 716 can further include one or more ILD layers in which the interconnect lines and via contacts can form. That is, interconnect layer 716 can include interconnect lines and via contacts in multiple ILD layers. In some implementations, peripheral circuits 712 are coupled to one another through the interconnects in interconnect layer 716. The interconnects in interconnect layer 716 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 9A, first semiconductor structure 102 can further include a bonding layer 718 at bonding interface 106 and above interconnect layer 716 and peripheral circuits 712. Bonding layer 718 can include a plurality of bonding contacts 719 and dielectrics electrically isolating bonding contacts 719. Bonding contacts 719 can include conductive materials, such as Cu. The remaining area of bonding layer 718 can be formed with dielectric materials, such as silicon oxide. Bonding contacts 719 and surrounding dielectrics in bonding layer 718 can be used for hybrid bonding. Similarly, as shown in FIG. 9A, second semiconductor structure 104 can also include a bonding layer 720 at bonding interface 106 and above bonding layer 718 of first semiconductor structure 102. Bonding layer 720 can include a plurality of bonding contacts 721 and dielectrics electrically isolating bonding contacts 721. Bonding contacts 721 can include conductive materials, such as Cu. The remaining area of bonding layer 720 can be formed with dielectric materials, such as silicon oxide. Bonding contacts 721 and surrounding dielectrics in bonding layer 720 can be used for hybrid bonding. Bonding contacts 721 are in contact with bonding contacts 719 at bonding interface 106, according to some implementations.

Second semiconductor structure 104 can be bonded on top of first semiconductor structure 102 in a face-to-face manner at bonding interface 106. In some implementations, bonding interface 106 is disposed between bonding layers 720 and 718 as a result of hybrid bonding, which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 720 and 718 are met and bonded. In practice, bonding interface 106 can be a layer with a certain thickness that includes the top surface of bonding layer 718 of first semiconductor structure 102 and the bottom surface of bonding layer 720 of second semiconductor structure 104.

In some implementations, second semiconductor structure 104 further includes an interconnect layer 722 above bonding layer 720 to transfer electrical signals. Interconnect layer 722 can include a plurality of interconnects, such as MEOL interconnects and BEOL interconnects. In some implementations, the interconnects in interconnect layer 722 also include local interconnects, such as bit line contacts (not shown), word line contacts 727, and body line contacts 751. Interconnect layer 722 can further include one or more ILD layers in which the interconnect lines and via contacts can form. The interconnects in interconnect layer 722 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 712 include a word line driver/row decoder coupled to word line contacts 727 in interconnect layer 722 through bonding contacts 721 and 719 in bonding layers 720 and 718 and interconnect layer 716. In some implementations, peripheral circuits 712 include a bit line driver/column decoder coupled to the bit line contacts in interconnect layer 722 through bonding contacts 721 and 719 in bonding layers 720 and 718 and interconnect layer 716. In some implementations, peripheral circuits 712 include a voltage source or the ground that is coupled to body line contacts 751 in interconnect layer 722 through bonding contacts 721 and 719 in bonding layers 720 and 718 and interconnect layer 716.

In some implementations, second semiconductor structure 104 includes a DRAM device in which memory cells are provided in the form of an array of DRAM cells 724 (e.g., an example of memory cells 602 in FIG. 6) above interconnect layer 722 and bonding layer 720. It is understood that the cross-section of 3D memory device 900 in FIG. 9A may be made along the word line direction (the x-direction), and one word line 934 extending laterally in the x-direction may be coupled to a row of DRAM cells 724. Each DRAM cell 724 can include a vertical transistor 926 (e.g., an example of vertical transistors 210 in FIG. 2) and a capacitor 728 (e.g., an example of storage unit 212 in FIG. 2) coupled to vertical transistor 926. DRAM cell 724 can be in the 1T1C configuration (i.e., a 1T1C cell) consisting of one transistor and one capacitor. It is understood that DRAM cell 724 may be of any suitable configurations, such as nT1C, 1TnC, nTnC, etc.

Vertical transistor 926 can be a MOSFET used to switch a respective DRAM cell 724. In some implementations, vertical transistor 926 includes a semiconductor body 930 (i.e., the active region in which multiple channels can form) extending vertically (in the z-direction), and a gate structure 936 in contact with one or more sides of semiconductor body 930. In some implementations in which vertical transistor 926 is a GAA vertical transistor, semiconductor body 930 has a cuboid shape or a cylinder shape, and gate structure 936 is in contact with all sides of semiconductor body 930, i.e., fully circumscribing semiconductor body 930 in the plan view. In some implementations in which vertical transistor 926 is a tri-gate vertical transistor, a double-gate vertical transistor, or a single-gate vertical transistor, semiconductor body 930 has a cuboid shape or a cylinder shape, and gate structure 936 is in contact with one or some sides, but not all sides, of semiconductor body 930, i.e., partially circumscribing semiconductor body 930 in the plan view. Gate structure 936 includes a gate electrode 934 and a gate dielectric 932 laterally between gate electrode 934 and semiconductor body 930 in at least the word line direction, according to some implementations. For example, for semiconductor body 930 having a cylinder shape, semiconductor body 930, gate dielectric 932, and gate electrode 934 may be disposed radially from the center of vertical transistor 926 in this order. In some implementations, gate dielectric 932 surrounds and contacts semiconductor body 930, and gate electrode 934 surrounds and contacts gate dielectric 932.

In some implementations, gate dielectric 932 includes dielectric materials, such as silicon oxide, silicon nitride, or high-k dielectrics including, but not limited to $Al_2O_3$, $HfO_2$, $Ta_2O_5$, $ZrO_2$, $TiO_2$, or any combination thereof. In some implementations, gate electrode 934 includes conductive materials including, but not limited to W, Co, Cu, Al, TiN, TaN, polysilicon, silicides, or any combination thereof. In some implementations, gate electrode 934 includes multiple conductive layers, such as a W layer over a TiN layer. In one example, gate structure 936 may be a "gate oxide/gate poly" gate in which gate dielectric 932 includes silicon oxide and gate electrode 934 includes doped polysilicon. In another example, gate structure 936 may be a HKMG in which gate dielectric 932 includes a high-k dielectric and gate electrode 934 includes a metal.

As shown in FIG. 9A, in some implementations, semiconductor body 930 has two ends (the upper end and lower end) in the vertical direction (the z-direction), and both ends extend beyond gate electrode/word line 934, respectively, in the vertical direction (the z-direction) into ILD layers. That is, semiconductor body 930 can have a larger vertical dimension (e.g., the depth) than that of gate electrode/word line 934 (e.g., in the z-direction), and neither the upper end nor the lower end of semiconductor body 930 is flush with the respective end of gate electrode/word line 934. Thus, short circuits between bit lines 923 and word lines/gate electrodes 934 or between word lines/gate electrodes 934 and capacitors 728 can be avoided.

Figure 9B:
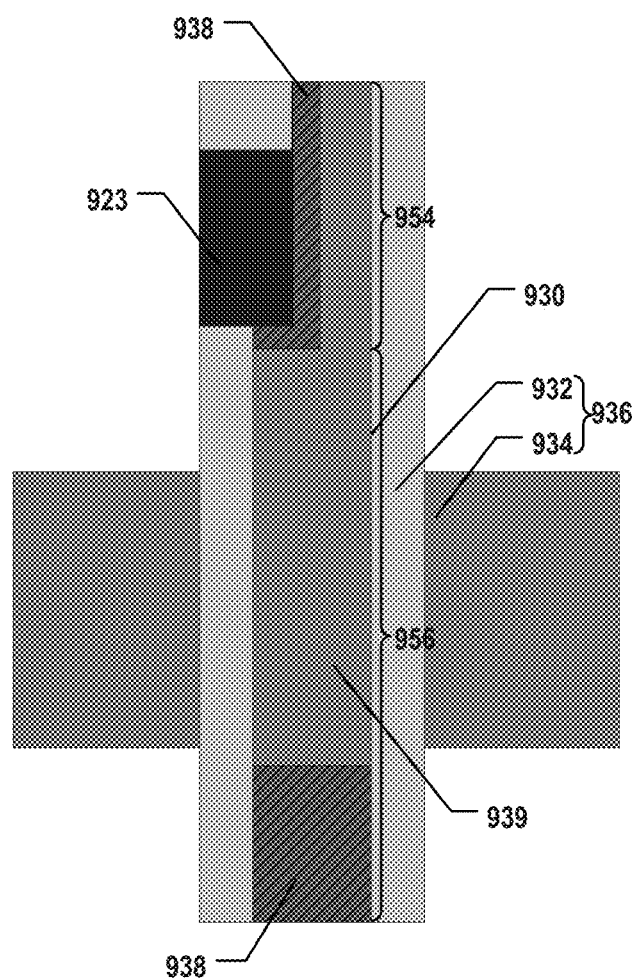
FIG. 9B illustrates an enlarged side view of a cross-section of the vertical transistor in FIG. 9A, according to some aspects of the present disclosure.

As shown in FIG. 9A and the enlarged view of FIG. 9B, semiconductor body 930 of vertical transistor 926 can include a source and a drain (both referred to as 938 as their locations may be interchangeable) as well as a channel portion 939 from the doping perspective, i.e., whether a particular portion of semiconductor body 930 is doped or the type of dopant thereof. In one example, the lower end of semiconductor body 930 that is coupled to capacitor 728 may be fully doped to form one of source and drain 938 (e.g., the source of vertical transistor 926), while the upper end of semiconductor body 930 away from capacitor 728 may be partially doped to form the other one of source and drain 938 (e.g., the drain of vertical transistor 926). The remaining undoped portion of semiconductor body 930 thus may become channel portion 939. In another example, the lower end of semiconductor body 930 that is coupled to capacitor 728 may be fully doped with N-type dopant(s) form one of source and drain 938 (e.g., the source of vertical transistor 926), while the upper end of semiconductor body 930 away from capacitor 728 may be partially doped with N-type dopant(s) to form the other one of source and drain 938 (e.g., the drain of vertical transistor 926). The remaining portion of semiconductor body 930 thus may become channel portion 939, which may be doped with P-type dopant(s). In still another example, the lower end of semiconductor body 930 that is coupled to capacitor 728 may be fully doped with P-type dopant(s) form one of source and drain 938 (e.g., the source of vertical transistor 926), while the upper end of semiconductor body 930 away from capacitor 728 may be partially doped with P-type dopant(s) to form the other one of source and drain 938 (e.g., the drain of vertical transistor 726). The remaining portion of semiconductor body 930 thus may become channel portion 939, which may be doped with N-type dopant(s). In some implementations, semiconductor body 930 has a base 956 and a protrusion 954 from the shape perspective, i.e., the relative dimensions and geometric relationships between different portions of semiconductor body 930, as shown in FIG. 9B. For example, base 956 may have a larger lateral dimension than protrusion 954. Different from 3D memory device 700 in which protrusion 754 protrudes entirely from the interior of base 756, protrusion 954 protrudes partially from the interior of base 956 and partially from the boundary of base 956, i.e., one or some sides of protrusion 954 being within the boundary of base 956 while the remaining side(s) of protrusion 954 being aligned with the boundary of base 956 in the plan view. In some implementations, base 956 faces word line/gate electrode 934, and protrusion 954 faces bit line 923.

One of source and drain 938 (e.g., at the lower end in FIG. 9A) can be formed on one end (e.g., the lower end in FIG. 9A) of base 956. The other one of source and drain 938 (e.g., at the upper end in FIG. 9A) can be formed on one or more sides of protrusion 954 of semiconductor body 930. In some implementations, as shown in FIGS. 9A and 9B, one of source and drain 938 that is away from capacitor 728 (e.g., the drain of vertical transistor 926) is formed on one or some, but not all, sides of protrusion 954. Channel portion 939 can be formed in both base 956 and protrusion 954 of semiconductor body 930. That is, both base 956 and protrusion 954 of semiconductor body 930 can have portions that are undoped or doped with a different type of dopant from source and drain 938, becoming channel portion 939. As shown in FIGS. 9A and 9B, different from the lower end (i.e., bottom) of base 956 that is doped to become part of source/drain 938, the upper end (i.e., top) of protrusion 954 is not doped with the same type of dopant as source and drain 938 to become part of source/drain 938, but remains as part of channel portion 939, according to some implementations. As shown in FIG. 9B, gate dielectric 932 of gate structure 936 is in contact with not only base 956 of semiconductor body 730, but also extends further to be in contact with protrusion 954 of semiconductor body 930, according to some implementations. In other words, gate dielectric 932 can be in contact with protrusion 954 of semiconductor body 930, which is different from gate dielectric 732 in FIG. 7A that is separated from protrusion 754 of semiconductor body 730.

In some implementations, semiconductor body 930 includes semiconductor materials, such as single crystalline silicon, polysilicon, amorphous silicon, Ge, any other semiconductor materials, or any combinations thereof. In one example, semiconductor body 930 may include single crystalline silicon, and channel portion 939 of semiconductor body 930 may include undoped single crystalline silicon or doped single crystalline silicon having a different type of dopant from source and drain 938. Source and drain 938 can be doped with N-type dopants (e.g., P or As) or P-type dopants (e.g., B or Ga) at a desired doping level. In some implementations, source and drain 938 are doped with N-type dopants (e.g., P or As), and channel proportion 939 is undoped/intrinsic or doped with P-type dopants (e.g., B or Ga).

As described above, since gate electrode 934 may be part of a word line or extend in the word line direction (e.g., the x-direction in FIG. 8) as a word line, although not directly shown in FIG. 9A, second semiconductor structure 104 of 3D memory device 900 can also include a plurality of word lines (e.g., an example of word lines 804 in FIG. 8, referred to as 934 as well) each extending in the word line direction (the x-direction). Each word line 934 can be coupled to a row of DRAM cells 724. That is, bit line 923 and word line 934 can extend in two perpendicular lateral directions, and semiconductor body 930 of vertical transistor 726 can extend in the vertical direction perpendicular to the two lateral directions in which bit line 923 and word line 934 extend. Word lines 934 are in contact with word line contacts 727, according to some implementations. In some implementations, word lines 934 include conductive materials including, but not limited to W, Co, Cu, Al, TiN, TaN, polysilicon, silicides, or any combination thereof. In some implementations, word line 934 includes multiple conductive layers, such as a W layer over a TiN layer.

As shown in FIG. 9A, second semiconductor structure 104 of 3D memory device 900 can also include a plurality of bit lines 923 (e.g., an example of bit lines 806 in FIG. 8) each extending in the bit line direction (the y-direction in FIG. 8). Each bit line 923 can be coupled to a column of DRAM cells 724. In some implementations, bit line 923 is coupled to one of source and drain 938 that is away from capacitor 728 (e.g., the drain of vertical transistor 926). For example, as shown in FIG. 9B, bit line 923 may be in contact with source/drain 938 that is formed on one or some sides of protrusion 954 of semiconductor body 930, but separated from channel portion 939 of semiconductor body 930 by source/drain 938. The rest of the sides of protrusion 954 can be in contact with gate dielectric 932. That is, bit line 923 is not in contact with channel portion 939 of semiconductor body 930 in which the channels of vertical transistor 726 are formed to suppress the floating body effect, according to some implementations.

As shown in FIG. 9A, second semiconductor structure 104 of 3D memory device 900 can further include body line 748 extending laterally (in the bit line direction and/or word line direction) and coupled to channel portion 939 of semiconductor body 930. Body line 748 can be also coupled to body line contact 751, which can be in turn coupled to peripheral circuits 712 in first semiconductor structure 102 through interconnect layers 722 and 716 and bonding layers 718 and 720. As a result, channel portion 939 of semiconductor body 930 can be coupled to a certain potential, for example, by a voltage source or the ground in peripheral circuits 712, through body line 748, body line contact 751, and any other suitable interconnects in interconnect layers 722 and 716 and bonding layers 718 and 720, such that channel charge in channel portion 939 of semiconductor body 930 can be released during operation of 3D memory device 900 to mitigate the floating body effect and the resulting issues. It is understood that in some examples, body line 748 may be coupled to a voltage source or the ground not in peripheral circuits 712 as long as the charge of the channels in semiconductor body 930 can be depleted.

As described above, the upper end (top) of protrusion 954 of semiconductor body 930 is not covered by source/drain 938, such that body line 748 can be in contact with channel portion 939 of semiconductor body 930. In some implementations, the upper end of protrusion 954 extends beyond bit line 923 such that body line 748 in contact with the upper end of protrusion 954 is separated from bit line 923 to avoid short circuits. In some implementations, body line 748 includes polysilicon layer 750 in contact with channel portion 939 of semiconductor body 930 to reduce the contact resistance between body line 748 and semiconductor body 930. In some implementations, body line 748 further includes metal layer 752 (e.g., W or Cu layer) in contact with polysilicon layer 750 to reduce the sheet resistance of body line 748. It is understood that the structure and/or materials of body line 748 may vary in other examples as long as body line 748 can couple channel portion 939 of semiconductor body 930 to a certain potential with reasonable contact and sheet resistances.

Body line 748 and capacitor 728 can be coupled to opposite ends of vertical transistor 926 in the z-direction. For example, body line 748 may be coupled to the upper end of vertical transistor 926, while capacitor 728 may be coupled to the lower end of vertical transistor 926, as shown in FIG. 9A. In some implementations, bit line 923 is between capacitor 728 and body line 748 in the z-direction as bit line 923 is in contact with the sides of protrusion 954 of semiconductor body 930 while body line 748 is in contact with the upper end of protrusion 954. In some implementations, capacitor 728 is between bonding interface 106 and vertical transistor 926 in the z-direction, and word line 934 is between bonding interface 106 and bit line 923 in the z-direction. The relative spatial relationships of various components in second semiconductor structure 104 of 3D memory device 900 that are described above as well as depicted in FIG. 9A may result from the face-to-face bonding process between first and second semiconductor structures 102 and 104 as well as the backside process for forming protrusion 954, bit line 923, and body line 748 as described below in detail with respect to the fabrication processes, which enable the design of vertical transistor 726 with reduced floating body effect.

As shown in FIG. 9A, in some implementations, capacitor 728 includes first electrode 742 below and coupled to source or drain 938 of vertical transistor 926, e.g., at the lower end of base 956 of semiconductor body 930. Capacitor 728 can also include capacitor dielectric 744 in contact with first electrode 742, and second electrode 746 in contact with capacitor dielectric 744. That is, capacitor dielectric 744 can be sandwiched between electrodes 742 and 746. In some implementations, each first electrode 742 is coupled to source or drain 938 of a respective vertical transistor 926 in the same DRAM cell 724, while all second electrodes 746 are parts of a common plate coupled to the ground, e.g., a common ground. Although not shown in FIG. 9A, it is understood that second semiconductor structure 104 may further include a capacitor contact in contact with the common plate of second electrodes 746 for coupling second electrodes 746 of capacitor 728 to peripheral circuits 712 or to the ground directly.

It is understood that the structure and configuration of capacitor 728 are not limited to the interdigitated capacitor (a.k.a., finger capacitor) example in FIG. 9A and may include any suitable structure and configuration, such as a planar capacitor, a stack capacitor, a multi-fins capacitor, a cylinder capacitor, a trench capacitor, or a substrate-plate capacitor. In some implementations, capacitor dielectric 744 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 728 may be a ferroelectric capacitor used in a FRAM cell, and capacitor dielectric 744 may be replaced by a ferroelectric layer having ferroelectric materials, such as PZT or SBT. In some implementations, electrodes 742 and 746 include conductive materials including, but not limited to W, Co, Cu, Al, TiN, TaN, polysilicon, silicides, or any combination thereof.

Although not shown in FIG. 9A, it is understood that in some examples, second semiconductor structure 104 may further include a pad-out interconnect layer (e.g., pad-out interconnect layer 108 in FIG. 1A) above body line 748. The pad-out interconnect layer may include interconnects, e.g., contact pads, in one or more ILD layers. The pad-out interconnect layer and interconnect layer 722 can be formed on opposite sides of DRAM cells 724. Vertical transistors 926 are disposed vertically between capacitors 728 and the pad-out interconnect layer, according to some implementations. In some implementations, the interconnects in the pad-out interconnect layer can transfer electrical signals between 3D memory device 900 and outside circuits, e.g., for pad-out purposes. It is also understood that the pad-out of 3D memory devices is not limited to from second semiconductor structure 104 having DRAM cells 724 and may be from first semiconductor structure 102 having peripheral circuit 712. For example, as shown in FIG. 1B, 3D memory device 101 may include a pad-out interconnect layer in first semiconductor structure 102.

Figure 10A:
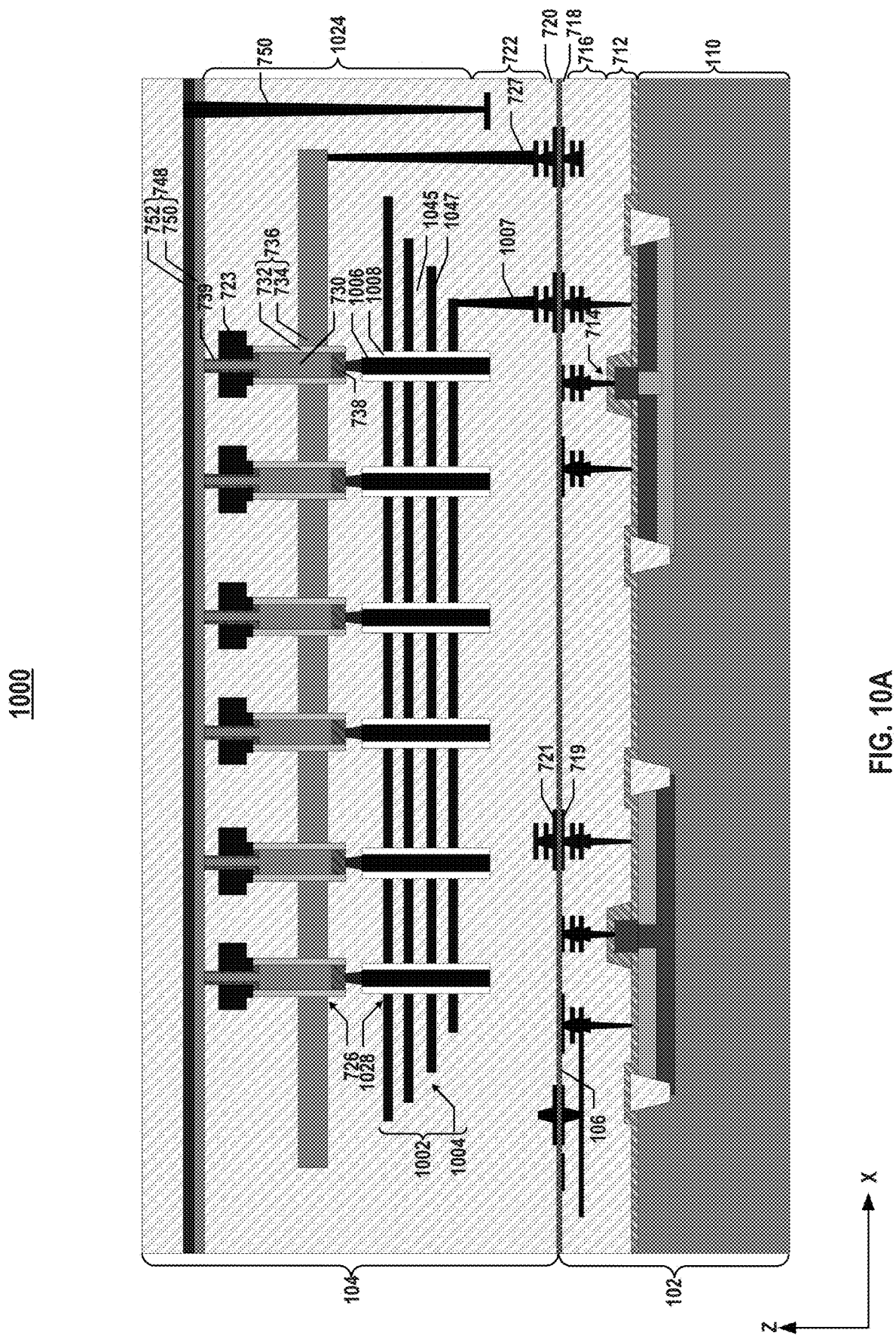
FIG. 10A illustrates a side view of a cross-section of still another 3D memory device including vertical transistors and stacked storage units, according to some aspects of the present disclosure.

As described above, according to some aspects of the present disclosure, a memory cell can include multiple storage units (e.g., capacitors, ferroelectric capacitors, or PCM elements), such as a 1TnC or nTnC DRAM cell or FRAM cell. The multiple capacitors (including ferroelectric capacitors) can be stacked vertically to further increase the capacitance density, the cell density, and/or achieve multi-bits information storage in a single memory cell under the current fabrication limitations of etching high aspect ratio capacitor holes. For example, FIG. 10A illustrates a side view of a cross-section of still another 3D memory device 1000 including vertical transistors and stacked storage units, according to some aspects of the present disclosure. It is understood that FIG. 10A is for illustrative purposes only and may not necessarily reflect the actual device structure (e.g., interconnections) in practice. As one example of 3D memory device 100 described above with respect to FIG. 1A, 3D memory device 1000 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 10A, first semiconductor structure 102 can include substrate 110, which can include silicon (e.g., single crystalline silicon, c-Si), SiGe, GaAs, Ge, SOI, or any other suitable materials.

First semiconductor structure 102 can include peripheral circuits 712 on substrate 110. In some implementations, peripheral circuits 712 include a plurality of transistors 714 (e.g., planar transistors and/or 3D transistors). Trench isolations (e.g., STIs) and doped regions (e.g., wells, sources, and drains of transistors 714) can be formed on or in substrate 110 as well.

In some implementations, first semiconductor structure 102 further includes an interconnect layer 716 above peripheral circuits 712 to transfer electrical signals to and from peripheral circuits 712. Interconnect layer 716 can include a plurality of interconnects, including lateral interconnect lines and VIA contacts. Interconnect layer 716 can further include one or more ILD layers in which the interconnect lines and via contacts can form. That is, interconnect layer 716 can include interconnect lines and via contacts in multiple ILD layers. In some implementations, peripheral circuits 712 are coupled to one another through the interconnects in interconnect layer 716. The interconnects in interconnect layer 716 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

As shown in FIG. 10A, first semiconductor structure 102 can further include bonding layer 718 at bonding interface 106 and above interconnect layer 716 and peripheral circuits 712. Bonding layer 718 can include bonding contacts 719 and dielectrics electrically isolating bonding contacts 719. Bonding contacts 719 can include conductive materials, such as Cu. The remaining area of bonding layer 718 can be formed with dielectric materials, such as silicon oxide. Bonding contacts 719 and surrounding dielectrics in bonding layer 718 can be used for hybrid bonding. Similarly, as shown in FIG. 10A, second semiconductor structure 104 can also include bonding layer 720 at bonding interface 106 and above bonding layer 718 of first semiconductor structure 102. Bonding layer 720 can include bonding contacts 721 and dielectrics electrically isolating bonding contacts 721. Bonding contacts 721 can include conductive materials, such as Cu. The remaining area of bonding layer 720 can be formed with dielectric materials, such as silicon oxide. Bonding contacts 721 and surrounding dielectrics in bonding layer 720 can be used for hybrid bonding. Bonding contacts 721 are in contact with bonding contacts 719 at bonding interface 106, according to some implementations.

Second semiconductor structure 104 can be bonded on top of first semiconductor structure 102 in a face-to-face manner at bonding interface 106. In some implementations, bonding interface 106 is disposed between bonding layers 720 and 718 as a result of hybrid bonding, which is a direct bonding technology (e.g., forming bonding between surfaces without using intermediate layers, such as solder or adhesives) and can obtain metal-metal bonding and dielectric-dielectric bonding simultaneously. In some implementations, bonding interface 106 is the place at which bonding layers 720 and 718 are met and bonded. In practice, bonding interface 106 can be a layer with a certain thickness that includes the top surface of bonding layer 718 of first semiconductor structure 102 and the bottom surface of bonding layer 720 of second semiconductor structure 104.

In some implementations, second semiconductor structure 104 further includes interconnect layer 722 above bonding layer 720 to transfer electrical signals. Interconnect layer 722 can include a plurality of interconnects, such as MEOL interconnects and BEOL interconnects. In some implementations, the interconnects in interconnect layer 722 also include local interconnects, such as bit line contacts (not shown), plate line contacts 1007, word line contacts 727, and body line contacts 751. Interconnect layer 722 can further include one or more ILD layers in which the interconnect lines and via contacts can form. The interconnects in interconnect layer 722 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 712 include a word line driver/row decoder coupled to word line contacts 727 in interconnect layer 722 through bonding contacts 721 and 719 in bonding layers 720 and 718 and interconnect layer 716. In some implementations, peripheral circuits 712 include a bit line driver/column decoder coupled to the bit line contacts in interconnect layer 722 through bonding contacts 721 and 719 in bonding layers 720 and 718 and interconnect layer 716. In some implementations, peripheral circuits 712 include a voltage source or the ground that is coupled to body line contacts 751 in interconnect layer 722 through bonding contacts 721 and 719 in bonding layers 720 and 718 and interconnect layer 716.

In some implementations, second semiconductor structure 104 includes a FRAM device in which memory cells are provided in the form of an array of FRAM cells 1024 (e.g., an example of FRAM cells 502 in FIG. 5B) above interconnect layer 722 and bonding layer 720. It is understood that the cross-section of 3D memory device 1000 in FIG. 10A may be made along the word line direction (the x-direction), and one word line 734 extending laterally in the x-direction may be coupled to a row of FRAM cells 1024. Each FRAM cell 1024 can include vertical transistor 726 (e.g., an example of vertical transistors 210 in FIG. 2) and a plurality of vertically stacked ferroelectric capacitors 1028 (e.g., an example of storage unit 212 in FIG. 2) coupled to vertical transistor 726. FRAM cell 1024 can be in the 1TnC configuration (i.e., a 1TnC cell) consisting of one transistor and multiple ferroelectric capacitors. It is understood that FRAM cell 1024 may be of any suitable configurations, such as nTnC, etc.

Vertical transistor 726 can be a MOSFET used to switch a respective FRAM cell 1024. In some implementations, vertical transistor 726 includes semiconductor body 730 (i.e., the active region in which multiple channels can form) extending vertically (in the z-direction), and gate structure 736 in contact with one or more sides of semiconductor body 730. In some implementations in which vertical transistor 726 is a GAA vertical transistor, semiconductor body 730 has a cuboid shape or a cylinder shape, and gate structure 736 is in contact with all sides of semiconductor body 730, i.e., fully circumscribing semiconductor body 730 in the plan view. In some implementations in which vertical transistor 726 is a tri-gate vertical transistor, a double-gate vertical transistor, or a single-gate vertical transistor, semiconductor body 730 has a cuboid shape or a cylinder shape, and gate structure 736 is in contact with one or some sides, but not all sides, of semiconductor body 730, i.e., partially circumscribing semiconductor body 730 in the plan view. Gate structure 736 includes gate electrode 734 and gate dielectric 732 laterally between gate electrode 734 and semiconductor body 730 in at least the word line direction, according to some implementations. For example, for semiconductor body 730 having a cylinder shape, semiconductor body 730, gate dielectric 732, and gate electrode 734 may be disposed radially from the center of vertical transistor 726 in this order. In some implementations, gate dielectric 732 surrounds and contacts semiconductor body 730, and gate electrode 734 surrounds and contacts gate dielectric 732.

In some implementations, gate dielectric 732 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 734 includes conductive materials including, but not limited to W, Co, Cu, Al, TiN, TaN, polysilicon, silicides, or any combination thereof. In some implementations, gate electrode 734 includes multiple conductive layers, such as a W layer over a TiN layer. In one example, gate structure 736 may be a "gate oxide/gate poly" gate in which gate dielectric 732 includes silicon oxide and gate electrode 734 includes doped polysilicon. In another example, gate structure 736 may be a HKMG in which gate dielectric 732 includes a high-k dielectric and gate electrode 734 includes a metal.

As shown in FIG. 10A, in some implementations, semiconductor body 730 has two ends (the upper end and lower end) in the vertical direction (the z-direction), and both ends extend beyond gate electrode/word line 734, respectively, in the vertical direction (the z-direction) into ILD layers. That is, semiconductor body 730 can have a larger vertical dimension (e.g., the depth) than that of gate electrode/word line 734 (e.g., in the z-direction), and neither the upper end nor the lower end of semiconductor body 730 is flush with the respective end of gate electrode/word line 734. Thus, short circuits between bit lines 723 and word lines/gate electrodes 734 or between word lines/gate electrodes 734 and capacitors 728 can be avoided.

As shown in FIGS. 10 and 7B, semiconductor body 730 of vertical transistor 726 can include a source and a drain (both referred to as 738 as their locations may be interchangeable) as well as channel portion 739 from the doping perspective, i.e., whether a particular portion of semiconductor body 730 is doped or the type of dopant thereof. In one example, the lower end of semiconductor body 730 that is coupled to capacitor 728 may be fully doped to form one of source and drain 738 (e.g., the source of vertical transistor 726), while the upper end of semiconductor body 730 away from capacitor 728 may be partially doped to form the other one of source and drain 738 (e.g., the drain of vertical transistor 726). The remaining undoped portion of semiconductor body 730 thus may become channel portion 739. In another example, the lower end of semiconductor body 730 that is coupled to capacitor 728 may be fully doped with N-type dopant(s) form one of source and drain 738 (e.g., the source of vertical transistor 726), while the upper end of semiconductor body 730 away from capacitor 728 may be partially doped with N-type dopant(s) to form the other one of source and drain 738 (e.g., the drain of vertical transistor 726). The remaining portion of semiconductor body 730 thus may become channel portion 739, which may be doped with P-type dopant(s). In still another example, the lower end of semiconductor body 730 that is coupled to capacitor 728 may be fully doped with P-type dopant(s) form one of source and drain 738 (e.g., the source of vertical transistor 726), while the upper end of semiconductor body 730 away from capacitor 728 may be partially doped with P-type dopant(s) to form the other one of source and drain 738 (e.g., the drain of vertical transistor 726). The remaining portion of semiconductor body 730 thus may become channel portion 739, which may be doped with N-type dopant(s). In some implementations, semiconductor body 730 has base 756 and protrusion 754 from the shape perspective, i.e., the relative dimensions and geometric relationships between different portions of semiconductor body 730, as shown in FIG. 7B. For example, base 756 may have a larger lateral dimension than protrusion 754. Protrusion 754 can protrude entirely from the interior of base 756, i.e., all sides of protrusion 754 being within the boundary of base 756 in the plan view. In some implementations, base 756 faces word line/gate electrode 734, and protrusion 754 faces bit line 723.

One of source and drain 738 (e.g., at the lower end in FIG. 10A) can be formed on one end (e.g., the lower end in FIG. 10A) of base 756. The other one of source and drain 738 (e.g., at the upper end in FIG. 10A) can be formed on one or more sides of protrusion 754 of semiconductor body 730. In some implementations, as shown in FIGS. 10 and 7B, one of source and drain 738 that is away from ferroelectric capacitors 1028 (e.g., the drain of FRAM cell 1024) is formed on all sides of protrusion 754. Channel portion 739 can be formed in both base 756 and protrusion 754 of semiconductor body 730. That is, both base 756 and protrusion 754 of semiconductor body 730 can have portions that are undoped or doped with a different type of dopant from source and drain 738, becoming channel portion 739. As shown in FIGS. 10 and 7B, different from the lower end (i.e., bottom) of base 756 that is doped to become part of source/drain 738, the upper end (i.e., top) of protrusion 754 is not doped with the same type of dopant as source and drain 738 to become part of source/drain 738, but remains as part of channel portion 739, according to some implementations. As shown in FIG. 7B, gate dielectric 732 of gate structure 736 is in contact with base 756 of semiconductor body 730, but does not extend further to be in contact with protrusion 754 of semiconductor body 730, according to some implementations. In other words, gate dielectric 732 can be separated from protrusion 754 of semiconductor body 730.

In some implementations, semiconductor body 730 includes semiconductor materials, such as single crystalline silicon, polysilicon, amorphous silicon, Ge, any other semiconductor materials, or any combinations thereof. In one example, semiconductor body 730 may include single crystalline silicon, and channel portion 739 of semiconductor body 730 may include undoped single crystalline silicon or doped single crystalline silicon having a different type of dopant from source and drain 738. Source and drain 738 can be doped with N-type dopants (e.g., P or As) or P-type dopants (e.g., B or Ga) at a desired doping level. In some implementations, source and drain 738 are doped with N-type dopants (e.g., P or As), and channel proportion 739 is undoped/intrinsic or doped with P-type dopants (e.g., B or Ga).

As described above, since gate electrode 734 may be part of a word line or extend in the word line direction as a word line, although not directly shown in FIG. 10A, second semiconductor structure 104 of 3D memory device 1000 can also include a plurality of word lines (referred to as 734 as well) each extending in the word line direction (the x-direction). Each word line 734 can be coupled to a row of FRAM cells 1024. That is, bit line 723 and word line 734 can extend in two perpendicular lateral directions, and semiconductor body 730 of vertical transistor 726 can extend in the vertical direction perpendicular to the two lateral directions in which bit line 723 and word line 734 extend. Word lines 734 are in contact with word line contacts 727, according to some implementations. In some implementations, word lines 734 include conductive materials including, but not limited to W, Co, Cu, Al, TiN, TaN, polysilicon, silicides, or any combination thereof. In some implementations, word line 734 includes multiple conductive layers, such as a W layer over a TiN layer.

As shown in FIG. 10A, second semiconductor structure 104 of 3D memory device 1000 can also include a plurality of bit lines 723 each extending in the bit line direction. Each bit line 723 can be coupled to a column of FRAM cells 1024. In some implementations, bit line 723 is coupled to one of source and drain 738 that is away from ferroelectric capacitors 1028 (e.g., the drain of vertical transistor 726). For example, as shown in FIG. 7B, bit line 723 may be in contact with source/drain 738 that is formed on all sides of protrusion 754 of semiconductor body 730, but separated from channel portion 739 of semiconductor body 730 by source/drain 738. That is, bit line 723 is not in contact with channel portion 739 of semiconductor body 730 in which the channels of vertical transistor 726 are formed to suppress the floating body effect, according to some implementations.

As shown in FIG. 10A, second semiconductor structure 104 of 3D memory device 1000 can further include body line 748 extending laterally (in the bit line direction and/or word line direction) and coupled to channel portion 739 of semiconductor body 730. Body line 748 can be also coupled to body line contact 751, which can be in turn coupled to peripheral circuits 712 in first semiconductor structure 102 through interconnect layers 722 and 716 and bonding layers 718 and 720. As a result, channel portion 739 of semiconductor body 730 can be coupled to a certain potential, for example, by a voltage source or the ground in peripheral circuits 712, through body line 748, body line contact 751, and any other suitable interconnects in interconnect layers 722 and 716 and bonding layers 718 and 720, such that channel charge in channel portion 739 of semiconductor body 730 can be released during operation of 3D memory device 1000 to mitigate the floating body effect and the resulting issues. It is understood that in some examples, body line 748 may be coupled to a voltage source or the ground not in peripheral circuits 712 as long as the charge of the channels in semiconductor body 730 can be depleted.

As described above, the upper end (top) of protrusion 754 of semiconductor body 730 is not covered by source/drain 738, such that body line 748 can be in contact with channel portion 739 of semiconductor body 730. In some implementations, the upper end of protrusion 754 extends beyond bit line 723 such that body line 748 in contact with the upper end of protrusion 754 is separated from bit line 723 to avoid short circuits. In some implementations, body line 748 includes polysilicon layer 750 in contact with channel portion 739 of semiconductor body 730 to reduce the contact resistance between body line 748 and semiconductor body 730. In some implementations, body line 748 further includes metal layer 752 (e.g., W or Cu layer) in contact with polysilicon layer 750 to reduce the sheet resistance of body line 748. It is understood that the structure and/or materials of body line 748 may vary in other examples as long as body line 748 can couple channel portion 739 of semiconductor body 730 to a certain potential with reasonable contact and sheet resistances.

Body line 748 and ferroelectric capacitors 1028 can be coupled to opposite ends of vertical transistor 726 in the z-direction. For example, body line 748 may be coupled to the upper end of vertical transistor 726, while ferroelectric capacitors 1028 may be coupled to the lower end of vertical transistor 726, as shown in FIG. 10A. In some implementations, bit line 723 is between ferroelectric capacitors 1028 and body line 748 in the z-direction as bit line 723 is in contact with the sides of protrusion 754 of semiconductor body 730 while body line 748 is in contact with the upper end of protrusion 754. In some implementations, ferroelectric capacitors 1028 are between bonding interface 106 and vertical transistor 726 in the z-direction, and word line 734 is between bonding interface 106 and bit line 723 in the z-direction. The relative spatial relationships of various components in second semiconductor structure 104 of 3D memory device 1000 that are described above as well as depicted in FIG. 10A may result from the face-to-face bonding process between first and second semiconductor structures 102 and 104 as well as the backside process for forming protrusion 754, bit line 723, and body line 748 as described below in detail with respect to the fabrication processes, which enable the design of vertical transistor 726 with reduced floating body effect.

It is understood that vertical transistors 726 and bit lines 723 in FIG. 10A are provided for illustrative purposes only and may be replaced with any other suitable counterparts disclosed herein, such as vertical transistors 926 and bit lines 923 in FIG. 9A. It is also understood that the vertical transistors in 3D memory device 1000 may be any other suitable vertical transistors as long as the vertical transistor includes a semiconductor body extending vertically, one end of which can be coupled to multiple vertically stacked storage units, such as ferroelectric capacitors 1028 disclosed herein.

Figure 10B:
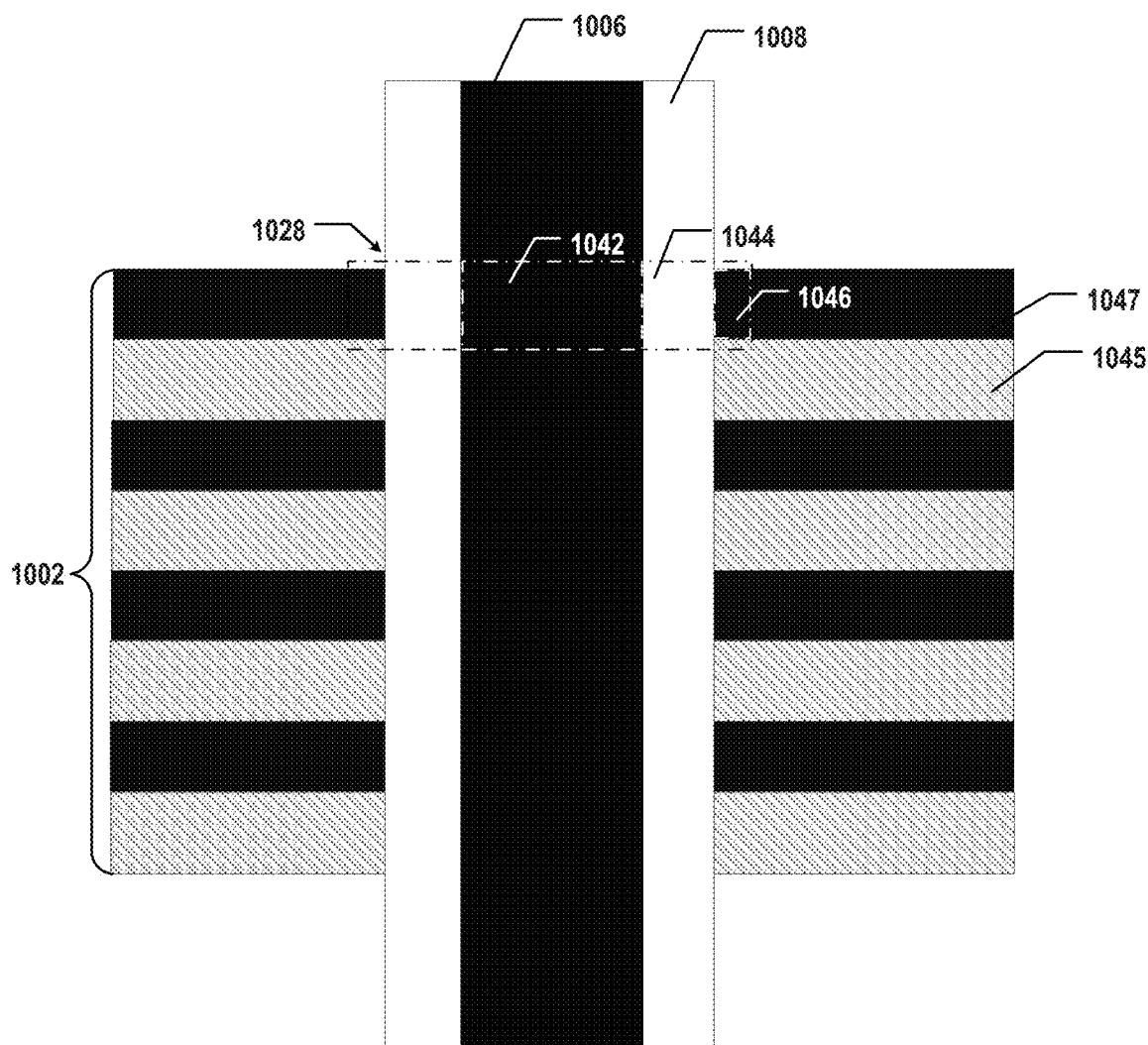
FIG. 10B illustrates an enlarged side view of a cross-section of the stacked storage units in FIG. 10A, according to some aspects of the present disclosure.

As shown in FIGS. 10A and 10B, second semiconductor structure 104 can include a plurality of ferroelectric capacitors 1028 (e.g., an example of ferroelectric capacitors 506-1, 506-2, . . . , 506-n in FIG. 5B) stacked vertically (in the z-direction) and coupled to a respective vertical transistor 726 (e.g., an example of transistor 504 in FIG. 5B) for each FRAM cell 1024 (e.g., an example of FRAM cell 502 in FIG. 5B). Second semiconductor structure 104 can also include a plurality of plate lines 1047 (e.g., an example of plate lines 508-1, 508-2, . . . , 508-n in FIG. 5B) each extending laterally (i.e., perpendicular to the vertical direction) and coupled to a respective one of ferroelectric capacitors 1028. As shown in the enlarged view of FIG. 10B, each ferroelectric capacitor 1028 includes a first electrode 1046, a second electrode 1042, and a ferroelectric section 1044 (an example of a storage section of a storage unit) sandwiched laterally between first electrode 1046 and second electrode 1042 in the word line direction and/or the bit line direction, according to some implementations. In some implementations, second electrodes 1042 of stacked ferroelectric capacitors 1028 of the same FRAM cell 1024 are parts of a continuous electrode layer 1006 coupled to the lower end of semiconductor body 730 (e.g., source/drain 738), and ferroelectric sections 1044 of stacked ferroelectric capacitors 1028 of the same FRAM cell 1024 are parts of a continuous ferroelectric layer 1008 (an example of a storage layer of a storage unit) over electrode layer 1006. Electrode layer 1006 can include a conductive material, such as a metal. In some implementations, each first electrode 1046 and a respective plate line 1047 are parts of a respective continuous conductive layer 1047. That is, similar to gate electrode/word line 734, first electrode 1046 may be viewed as part of plate line 1047, or plate line 1047 may be viewed as the extension of first electrode 1046. On the other hand, first electrodes 1046 of stacked ferroelectric capacitors 1028 of the same FRAM cell 1024 are spaced apart for one another in the vertical direction, according to some implementations. Two adjacent first electrodes 1046 (and conductive layers 1047) can be separated by a respective one of dielectric layer 1045. For electrode layer 1006 having a cylinder shape, electrode layer 1006, ferroelectric layer 1008, and conductive layers 1047 may be disposed radially from the center of electrode layer 1006 in this order. In some implementations, ferroelectric layer 1008 surrounds and contacts electrode layer 1006, and conductive layers 1047 surround and contact ferroelectric layer 1008.

As shown in FIG. 10A, stacked ferroelectric capacitors 1028 can be provided in the form of electrode layers 1006 and ferroelectric layers 1008 extending vertically (in the z-direction) through a stack structure 1002 including interleaved conductive layers 1047 and dielectric layers 1045. In some implementations, second semiconductor structure 104 of 3D memory device 1000 further includes stack structure 1002 having a plurality of pairs each including a conductive layer 1047 and a dielectric layer 1045. Each conductive layer 1047 and dielectric layer 1045 can extend laterally in the word line direction and/or the bit line direction. Stack structure 1002 can be disposed between bonding interface 106 and vertical transistors 726 in the z-direction. Word line 734 can be disposed vertically between stack structure 1002 and bit line 723 in the z-direction. The stacked and interleaved conductive layers 1047 and dielectric layers 1045 in stack structure 1002 alternate in the vertical direction, according to some implementations. The number of the pairs of conductive layers 1047 and dielectric layers 1045 in stack structure 1002 can determine the number of stacked ferroelectric capacitors 1028 in each FRAM cell 1024. Thus, the capacitance of FRAM cell 1024 can be scaled up vertically without increasing the planar area and increasing the process complexity (e.g., etching a high aspect ratio capacitor hole). Conductive layer 1047 can include conductive materials including, but not limited to, W, Co, Cu, Al, polysilicon, doped silicon, silicides, or any combination thereof. In some implementations, each conductive layer 1047 includes a metal layer, such as a W layer.

As described above, conductive layer 1047 can include plate line 1047 and first electrode 1046 in contact with and ferroelectric layer 1008. In some implementations, edges of dielectric layers 1045 and conductive layers 1047 can define staircase structure 1004 of stack structure 1002, which includes a plurality of stairs (levels) for plate line interconnections (e.g., landing plate line contacts 1007). Conductive layer/plate line 1047 can extend laterally, ending at a respective stair of staircase structure 1004. In some implementations, every two adjacent stairs of staircase structure 1004 are offset by a distance in a lateral direction (e.g., the x-direction in FIG. 10A). Each offset thus can form a "landing area" for interconnection with plate line contacts 1007 in the vertical direction. As shown in FIG. 10A, second semiconductor structure 104 of 3D memory device 1000 can further include plate line contacts 1007 in contact with conductive layers 1047, respectively, at staircase structure 1004. Thus, each one of multiple first electrodes 1046 in the same FRAM cell 1024 can be individually coupled to peripheral circuits 712 through a respective plate line 1047, a respective plate line contact 1007, and interconnects in interconnect layers 722 and 716 and bonding layers 720 and 718. Each ferroelectric capacitor 1028 can be coupled to a respective plate line 1047.

As shown in FIG. 10A, second semiconductor structure 104 of 3D memory device 1000 can further include electrode layer 1006 and ferroelectric layer 1008 over electrode layer 1006. Each of electrode layer 1006 and ferroelectric layer 1008 can extend through stack structure 1002 to in the z-direction to form vertically stacked ferroelectric capacitors 1028 of each FRAM cell 1024. In some implementations, electrode layer 1006 is a continuous layer and includes a plurality of second electrodes 1042, and ferroelectric layer 1008 is a continuous layer and includes a plurality of ferroelectric sections 1044. First electrodes 1046, second electrodes 1042, and ferroelectric sections 1044 can form a plurality of ferroelectric capacitors 1028 stacked in the vertical direction for each FRAM cell 1024. Electrode layer 1006 can be shared by all ferroelectric capacitors 1028 of the same FRAM cell 1024 and serve as a common electrode to couple each ferroelectric capacitor 1028 of the same FRAM cell 1024 to a respective vertical transistor 726. Electrode layer 1006 can include conductive materials including, but not limited to, W, Co, Cu, Al, polysilicon, doped silicon, silicides, or any combination thereof. In some implementations, electrode layer 1006 includes a metal layer, such as a W layer.

It is understood that FRAM cell 1024 is illustrated as an example of a memory cell having multiple vertically stacked storage units, ferroelectric capacitors 1028 are illustrated as an example of vertically stacked storage units. In some examples, the memory cell may be a DRAM cell, and the vertically stacked storage units may be vertically stacked capacitors. It is also understood that ferroelectric layer 1008 is illustrated as an example of a storage layer including storage sections, and ferroelectric sections 1044 are illustrated as an example of the storage sections. Ferroelectric layer 1008 may be a storage layer including a ferroelectric material. In some examples, the storage layer may include a dielectric material, such as high-K dielectrics, of capacitors.

Although not shown in FIG. 10A, it is understood that in some examples, second semiconductor structure 104 may further include a pad-out interconnect layer (e.g., pad-out interconnect layer 108 in FIG. 1A) above body line 748. The pad-out interconnect layer may include interconnects, e.g., contact pads, in one or more ILD layers. The pad-out interconnect layer and interconnect layer 722 can be formed on opposite sides of FRAM cells 1024. Vertical transistors 726 are disposed vertically between ferroelectric capacitors 1028 and the pad-out interconnect layer, according to some implementations. In some implementations, the interconnects in the pad-out interconnect layer can transfer electrical signals between 3D memory device 1000 and outside circuits, e.g., for pad-out purposes. It is also understood that the pad-out of 3D memory devices is not limited to from second semiconductor structure 104 having FRAM cells 1024 and may be from first semiconductor structure 102 having peripheral circuit 712. For example, as shown in FIG. 1B, 3D memory device 101 may include a pad-out interconnect layer in first semiconductor structure 102.

Figure 11:
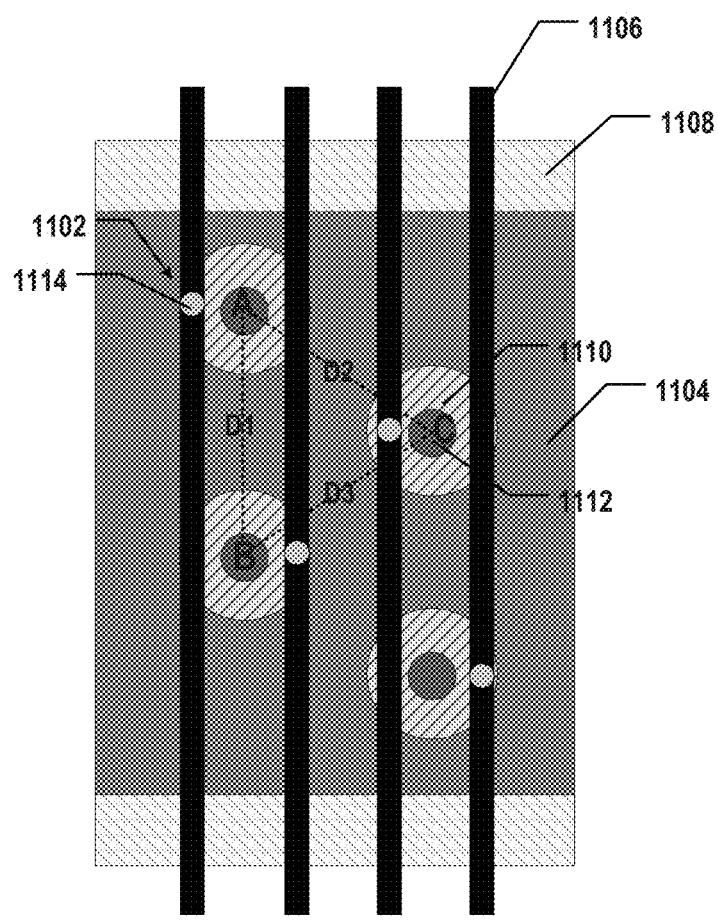
FIG. 11 illustrates a layout view of an array of memory cells each including a vertical transistor, according to some aspects of the present disclosure.
Figure 11:
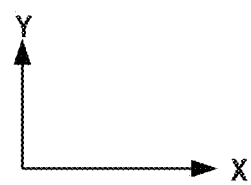

As described above with respect to FIGS. 6 and 8, the arrays of memory cells disclosed herein can be arranged in cross-point orthogonal layouts, which have a 4F2 cell size. According to some aspects of the present disclosure, the unit cell size of an array of memory cells can be further reduced by changing the layout from cross-point orthogonal layouts to staggered layouts with fixed minimum cell distances. For example, FIG. 11 illustrates a layout view of an array of memory cells 1102 each including a vertical transistor, according to some aspects of the present disclosure. Memory cell 1102 may include any suitable memory cell that includes a vertical transistor and one or more storage units coupled to the vertical transistor, such as memory cells disclosed herein.

The array of memory cells 1102 can be arranged in rows and columns. Each row of memory cells 1102 extends in the word line direction (the x-direction), and each column of memory cells extends in the bit line direction (the y-direction), according to some implementations. That is, rows of memory cells 1102 can be arranged in the bit line direction, and columns of memory cells 1102 can be arranged in the word line direction. As shown in FIG. 11, the array of memory cells 1102 can be arranged in a staggered layout, as opposed to a cross-point orthogonal layout. For example, two adjacent rows of memory cells 1102 may be staggered (not aligned) with one another, and two adjacent columns of memory cells 1102 may be staggered (not aligned) with one another as well in the plan view.

As shown in FIG. 11, each of a set of four memory cells 1102 is coupled to the same word line 1104, which is formed between two adjacent slit structures 1108 in the bit line direction (the y-direction), according to some implementations. Slit structure 1108 can include one or more dielectric materials, such as silicon oxide or silicon nitride, to separate adjacent word lines 1104 in the bit line direction. In some implementations, each of the set of four memory cells 1102 is coupled to a respective one of four bit lines 1106. As a result, although the set of four memory cells share the same word line 1104, each of the set of four memory cells 1102 can be individually controlled by a respective bit line 1106. In other words, the combination of a specific word line 1104 and a specific bit line 1106 corresponds to a respective memory cell 1102, according to some implementations. In some implementation, a set of memory cells 1102 coupled to the same word line 1104 may include n memory cells 1102 in the same column, where n is a positive integer greater than 1, and n memory cells 1102 may be coupled to n bit lines 1106, respectively, to enable individual control of each memory cell 1102. In other words, multiple bit lines 1106 can be coupled to memory cells 1102 in the same column. As a result, each bit line 1106 may not fully circumscribe the semiconductor body of a respective memory cell 1102 (e.g., having the design shown in FIGS. 7A and 7B), but may partially circumscribe the semiconductor body of a respective memory cell 1102 (e.g., having the design shown in FIGS. 9A and 9B), in case there are multiple memory cells in the same column that are coupled to the same word line 1104.

In the plan view of FIG. 11, each bit line 1106 can be coupled to a source/drain 1110 of a respective memory cell 1102 through a respective bit line contact 1114 and separated from a channel portion 1112 of the semiconductor body of the respective memory cell 1102, which is coupled to a body line (not shown) to reduce the floating body effect. It is understood that the design of source/drain 1110 and channel portion 1112 shown in FIG. 11 is for illustrative purposes only and may vary in other examples as long as source/drain 1110 of each memory cell 1102 can be coupled to a respective bit line 1106. The set of four memory cells 1102 coupled to word line 1104, as shown in FIG. 11, are referred to herein as "function memory cells" as they can be controlled by word line 1104 and bit lines 1106. In contrast, a memory cell that is coupled to slit structure 1108 (not shown in FIG. 11) is referred to herein as a "dummy memory cell" as it cannot be controlled by word line 1104.

To reduce the unit cell size, the staggered layout of memory cells 1102 is designed such that the minimum cell distances between any memory cell 1102 and its adjacent memory cells 1102 are kept the same. For example, as shown in FIG. 11, the minimum distance D1 between a first memory cell A and a second memory cell B in the same column of memory cell A may be the same as the minimum distance D2 between memory cell A and a third memory cell C in an adjacent column, i.e., D1=D2. The distance between two memory cells may be measured between the geometric centers of the two memory cells in the plan view, such as the centers of two circles, as shown in FIG. 11. It is understood that for a particular memory cell, there may be more than one adjacent memory cells in the same column or adjacent columns. Thus, the minimum distance may be the distance between the memory cell and the closest memory cell in the same or adjacent column, i.e., the smallest value of the distances from different adjacent memory cells.

As shown in FIG. 11, in some examples, the minimum distance D1/D2 may also be the same as the distance D3 between memory cell B and memory cell C, i.e., D1=D2=D3. That is, memory cells A, B, and C are disposed in vertices of an equilateral triangle (Δ), respectively, in the plan view, according to some implementations. Thus, the staggered layout of memory cells 1102 shown in FIG. 11 may also be referred to as the "delta" (Δ) arrangement. According to the delta arrangement shown in FIG. 11, the minimum cell distances between any memory cell 1102 and its adjacent memory cells 1102 are kept the same, such that the unit cell size can be minimized.

Figure 12A:
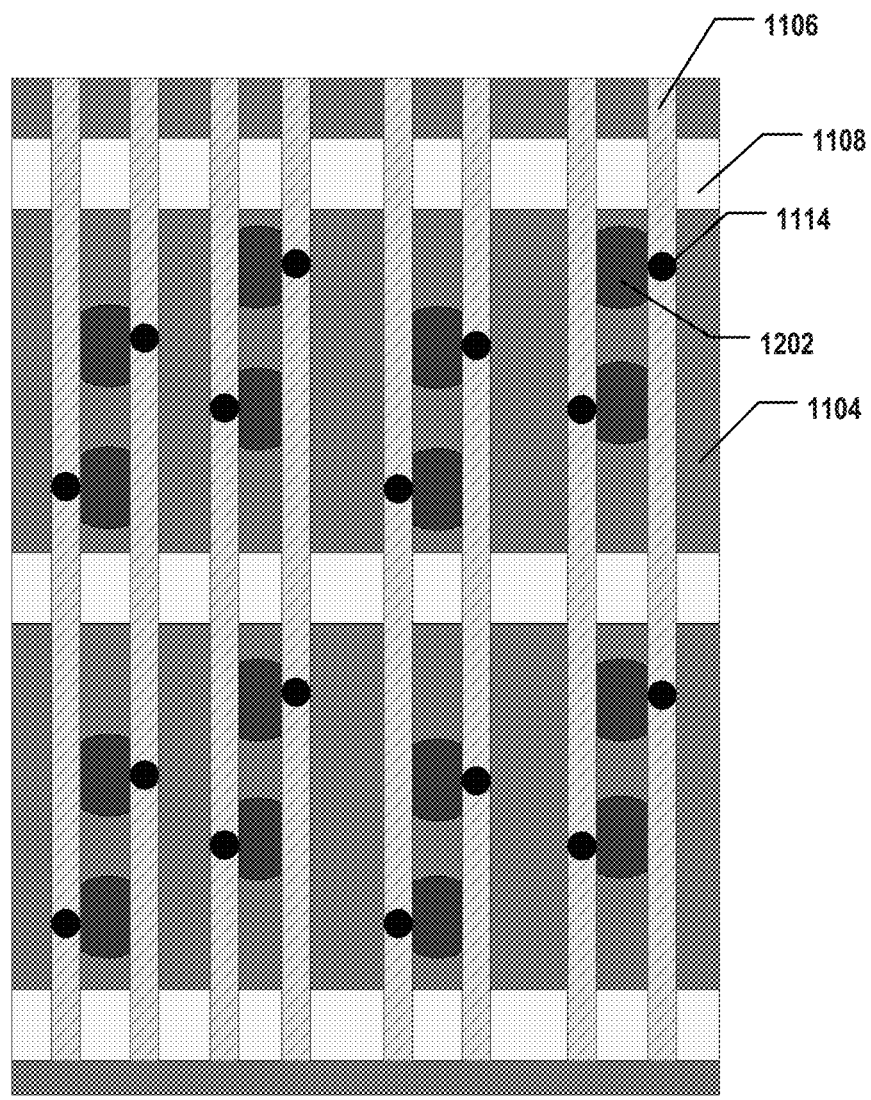
FIGS. 12A-12E illustrates layout views of various arrays of memory cells each including a vertical transistor, according to various aspects of the present disclosure.
Figure 12A:
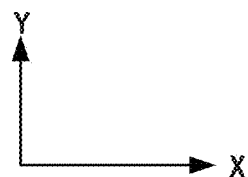
Figure 12B:
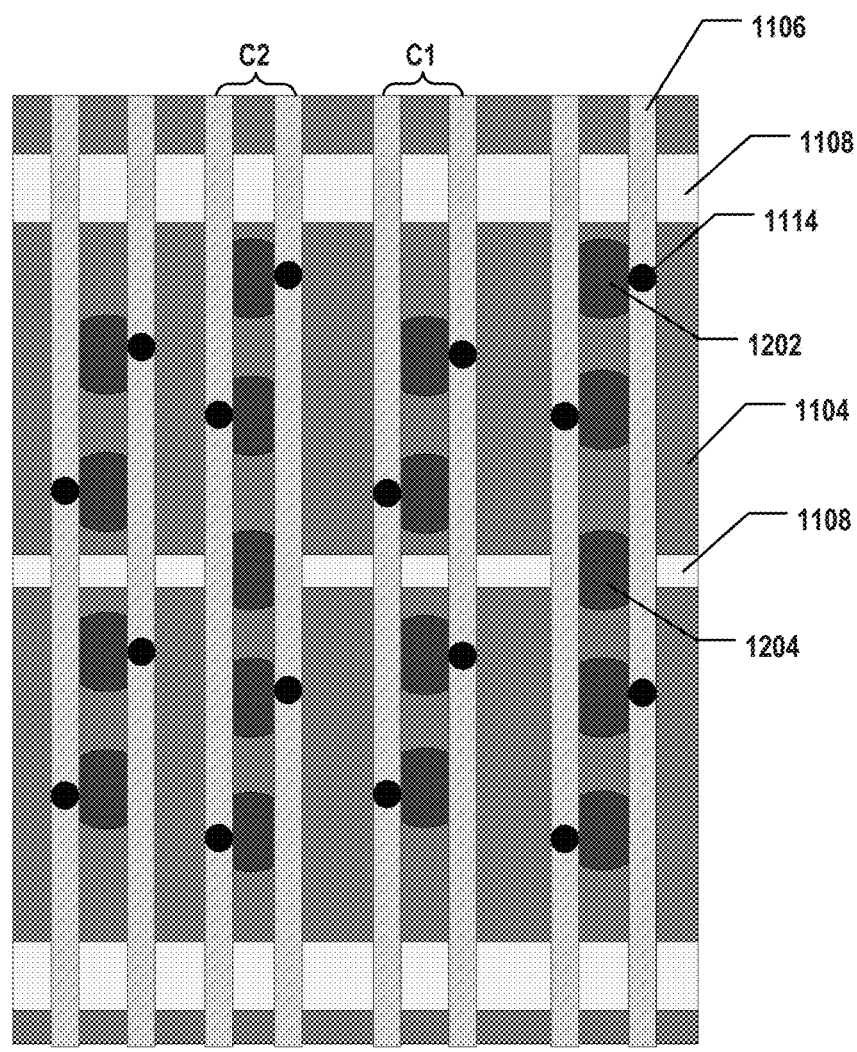
Figure 12C:
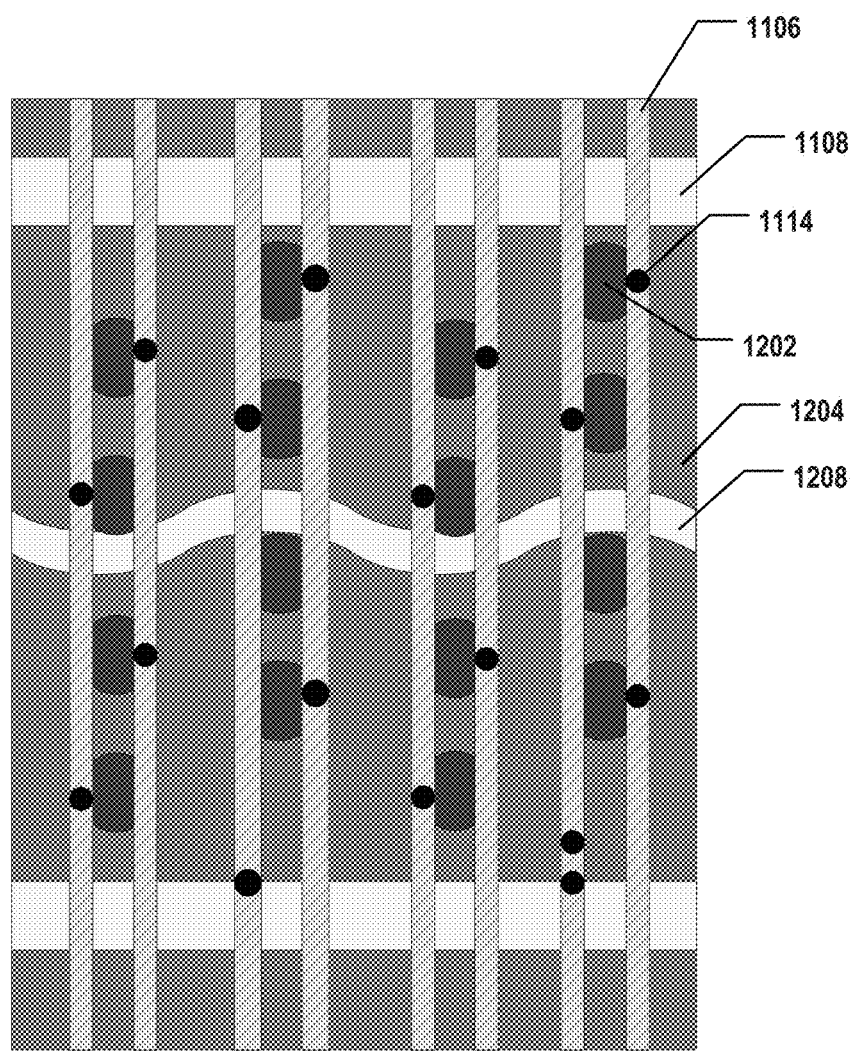
Figure 12C:
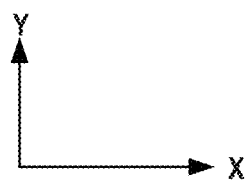
Figure 12D:
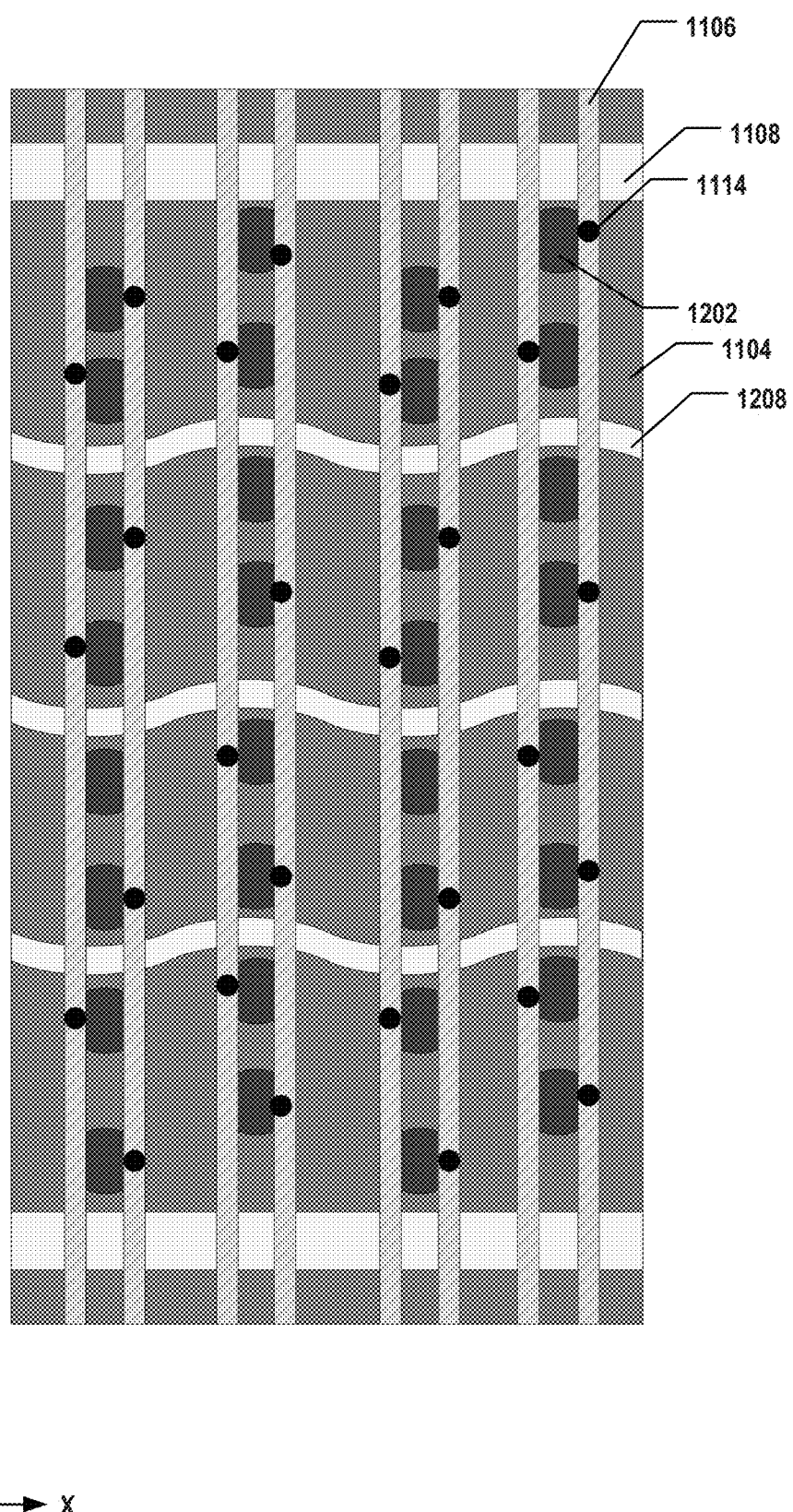
Figure 12E:
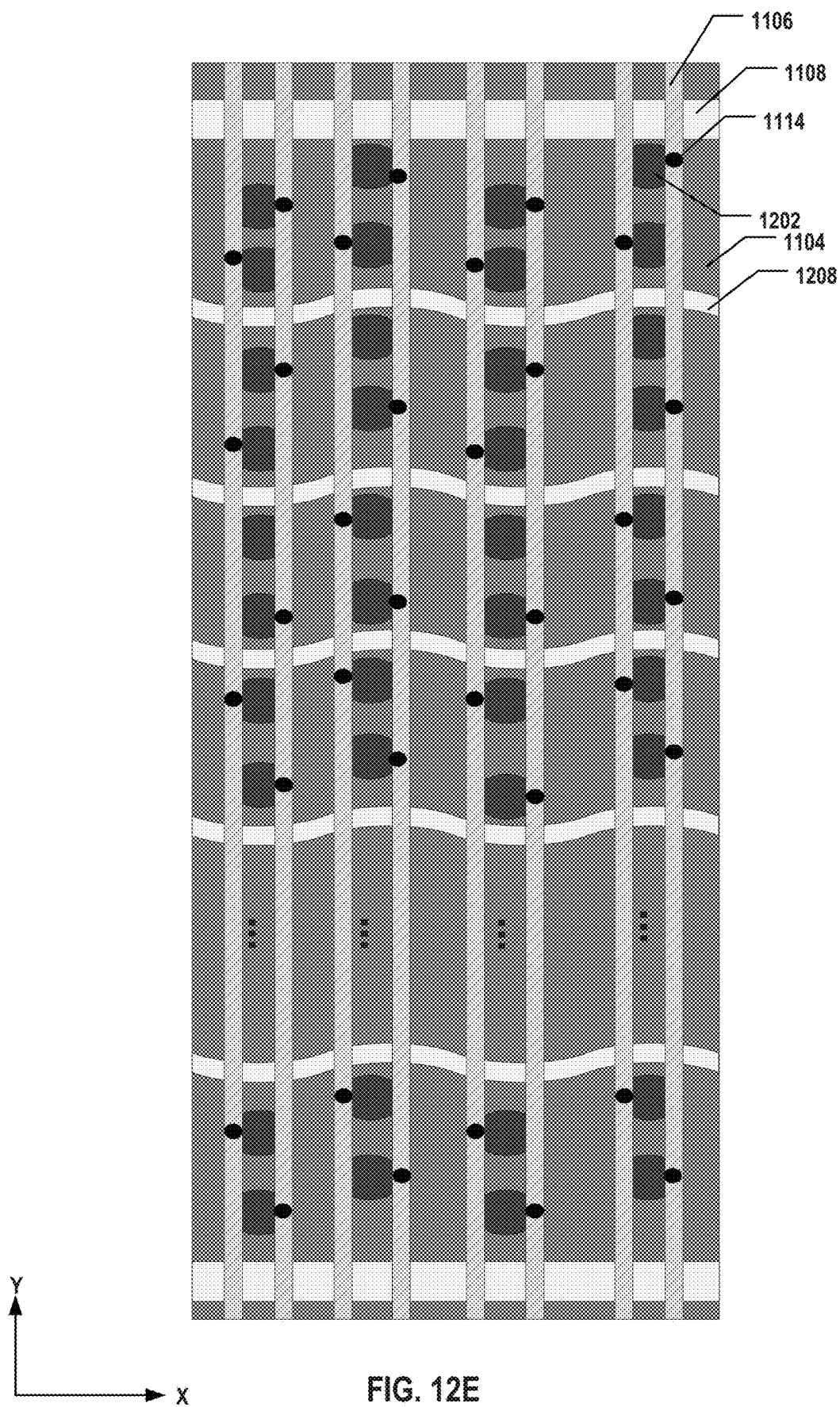

FIGS. 12A-12E illustrates layout views of various arrays of memory cells each including a vertical transistor, according to various aspects of the present disclosure. FIGS. 12-12E may illustrate various examples of staggered layouts with the delta arrangement disclosed in FIG. 11. As shown in FIG. 12A, each slit structure 1108 has a straight shape extending in the word line direction (the x-direction) in the plan view and separate two adjacent word lines 1104 in the bit line direction (the y-direction), according to some implementations. The memory cells thus can include a plurality sets of function memory cells 1202, and each set of function memory cells 1202 is coupled to a respective word line 1104. Within each set of function memory cells 1202, function memory cells 1202 are arranged according to the delta arrangement disclosed above with respect to FIG. 11, such that the minimum cell distances between any function memory cell 1202 and its adjacent function memory cells 1202 in the same set (i.e., coupling to the same word line 1104) can be kept the same. The unit cell size of the staggered layout disclosed in FIG. 12A can be reduced to $2.64F^2$ (i.e., 2.64F2 cell size).

However, since the staggered layout disclosed in FIG. 12A does not include any dummy memory cell coupled to slit structure 1108 between adjacent sets of function memory cells 1202, the delta arrangement may not be applied across adjacent sets of memory cells. For example, the distance between two adjacent function memory cells 1202 in two adjacent sets of function memory cells 1202, respectively, in the same column across slit structure 1108 may not be the same as (e.g., greater than) the minimum distances (e.g., D1/D2/D3 in FIG. 11) of function memory cells 1202 within each set of function memory cells 1202.

Thus, to further reduce the unit cell size, as shown in FIG. 12B, one or more sets of dummy memory cells 1204 can be introduced. In some implementations, each dummy memory cell 1204 of the same set is coupled to a respective slit structure 1108 having a straight shape in the plan view. In some implementations, dummy memory cell 1204 is not coupled to any word line 1104 or bit line 1106. As a result, in some columns (e.g., C1) of the staggered layout shown in FIG. 12B, the distance between two adjacent function memory cells 1202 in two adjacent sets of function memory cells 1202, respectively, in the same column across slit structure 1108 therebetween can be the same as the minimum distance (e.g., D1/D2/D3 in FIG. 11) of function memory cells 1202 within each set of function memory cells 1202; and in some columns (e.g., C2), the distance between dummy memory cell 1204 and an adjacent function memory cell 1202 in an adjacent set of function memory cells 1202 in the same column is the same as the minimum distance (e.g., D1/D2/D3 in FIG. 11) as well. Thus, by introducing dummy memory cells 1204 into the staggered layout in FIG. 12B, the delta arrangement may be applied to all the memory cells 1202 and 1204 even across different sets of memory cells 1202 and 1204. The unit cell size of the staggered layout disclosed in FIG. 12B can be further reduced to $2.17F^2$ (i.e., 2.17F2 cell size).

However, different from function memory cells 1202, dummy memory cells 1204 cannot be controlled by word lines 1104 and bit lines 1106 to store information and thus, the actual cell density may still be limited by dummy memory cells 1204 even with reduced unit cell size. Thus, to further increase the actual cell density, as shown in FIG. 12C, slit structures 1208 each having a serpentine shape can be introduced. In some implementations, different from slit structure 1108 having a straight shape, slit structure 1208 has a serpentine shape to follow the staggered pattern of function memory cells 1202 between adjacent rows. As a result, even without introducing dummy memory cells 1204, in each column of the staggered layout shown in FIG. 12C, the distance between two adjacent function memory cells 1202 in two adjacent sets of function memory cells 1202, respectively, in the same column across serpentine-shaped slit structure 1208 therebetween can be the same as the minimum distance (e.g., D1/D2/D3 in FIG. 11) of function memory cells 1202 within each set of function memory cells 1202. It is understood that the specific serpentine shape of slit structure 1208 shown in FIG. 12C is for illustrative purposes only and may vary in other examples as long as the shape follows the staggered pattern of function memory cells 1202 between adjacent rows to allow the distance between two adjacent function memory cells 1202 in two adjacent sets in any column across slit structure 1208 being the same as the minimum distances. Similar to the staggered layout shown in FIG. 12B, the unit cell size of the staggered layout disclosed in FIG. 12C may be $2.17F^2$ (i.e., 2.17F2 cell size) as the delta arrangement may be applied to all function memory cells 1202 even across different sets of function memory cells 1202. The actual cell density can be increased compared with the staggered layout shown in FIG. 12B by eliminating dummy memory cells 1204 in the staggered layout shown in FIG. 12C.

As shown in FIG. 12C, serpentine-shaped slit structures 1208 and straight-shaped slit structures 1108 may be interleaved in the staggered layout, i.e., having the same number and ratio (1/2) among slit structures 1108 and 1208. However, the unit cell size of the staggered layout in FIG. 12C is still limited by straight-shaped slit structures 1108. Thus, the unit cell size can be further reduced by increasing the ratio of serpentine-shaped slit structures 1208 among all slit structures 1108 and 1208, i.e., decreasing the ratio of straight-shaped slit structures 1108. For example, in the staggered layout of FIG. 12D, three serpentine-shaped slit structures 1208 may be arranged between two adjacent straight-shaped slit structures 1108, increasing the ratio of straight-shaped slit structures 1108 among all slit structures 1108 and 1208 to 3/5. In a general case shown in FIG. 12E, assuming k serpentine-shaped slit structures 1208 may be arranged between two adjacent straight-shaped slit structures 1108, the ratio of straight-shaped slit structures 1108 among all slit structures 1108 and 1208 is set as k/(k+2), where k is a positive integer.

Figure 20:
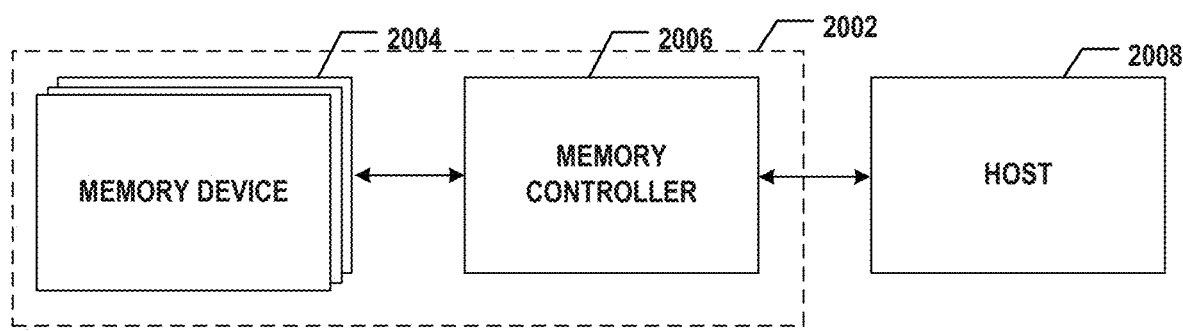
FIG. 20 illustrates a block diagram of an exemplary system having a memory device, according to some aspects of the present disclosure.

FIG. 20 illustrates a block diagram of a system 2000 having a memory device, according to some aspects of the present disclosure. System 2000 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 20, system 2000 can include a host 2008 and a memory system 2002 having one or more memory devices 2004 and a memory controller 2006. Host 2008 can be a processor of an electronic device, such as a central processing unit (CPU), or a system-on-chip (SoC), such as an application processor (AP). Host 2008 can be configured to send or receive the data to or from memory devices 2004.

Memory device 2004 can be any memory devices disclosed herein, such as 3D memory devices 100, 101, and 103, memory devices 200, 600, and 800, and 3D memory devices 700, 900, and 1000. In some implementations, memory device 2004 includes an array of memory cells each including a vertical transistor, as described above in detail.

Memory controller 2006 is coupled to memory device 2004 and host 2008 and is configured to control memory device 2004, according to some implementations. Memory controller 2006 can manage the data stored in memory device 2004 and communicate with host 2008. Memory controller 2006 can be configured to control operations of memory device 2004, such as read, write, and refresh operations. Memory controller 2006 can also be configured to manage various functions with respect to the data stored or to be stored in memory device 2004 including, but not limited to refresh and timing control, command/request translation, buffer and schedule, and power management. In some implementations, memory controller 2006 is further configured to determine the maximum memory capacity that the computer system can use, the number of memory banks, memory type and speed, memory particle data depth and data width, and other important parameters. Any other suitable functions may be performed by memory controller 2006 as well. Memory controller 2006 can communicate with an external device (e.g., host 2008) according to a particular communication protocol. For example, memory controller 2006 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 16:
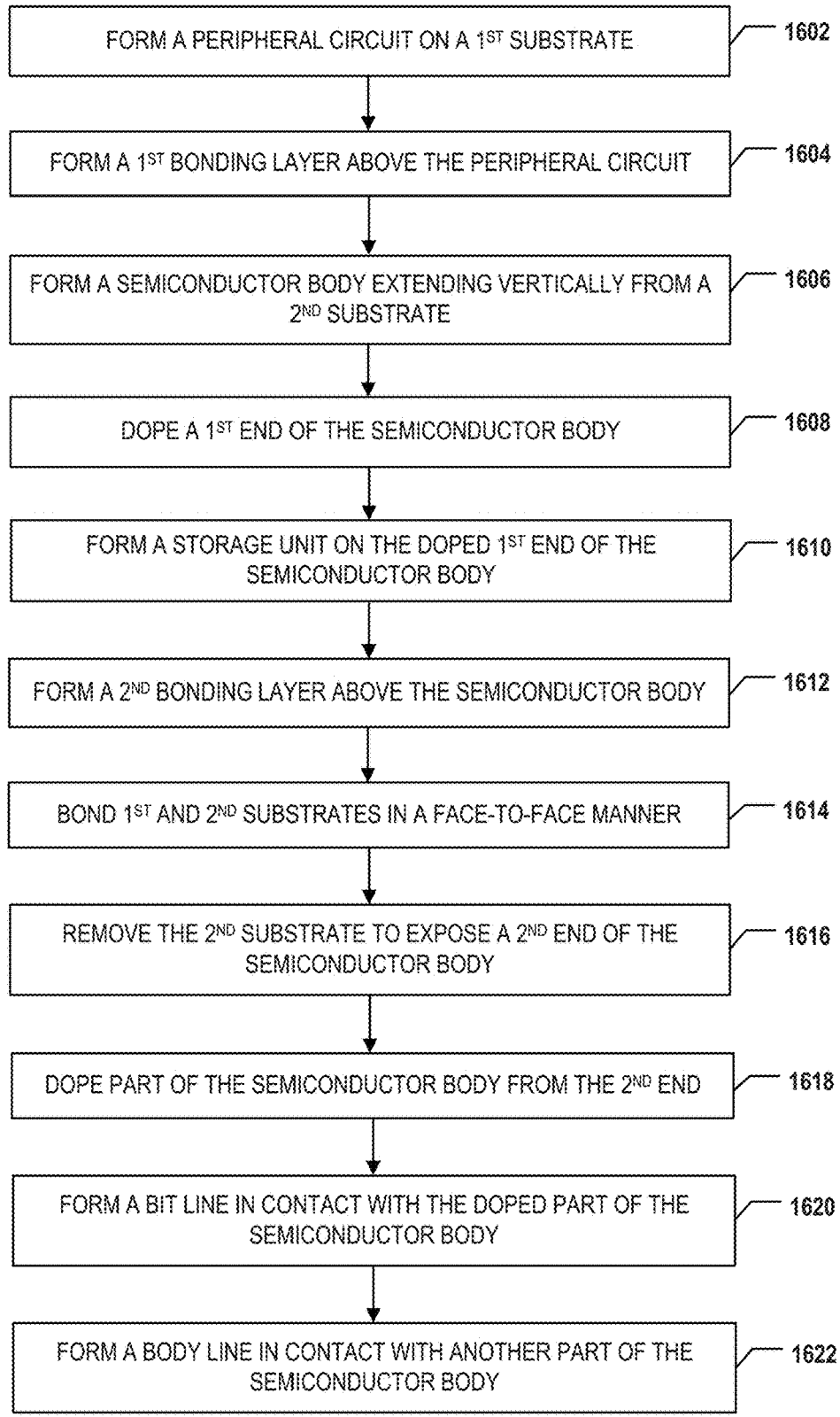
FIG. 16 illustrates a flowchart of a method for forming a 3D memory device including vertical transistors, according to some aspects of the present disclosure.

FIGS. 13A-13M illustrate a fabrication process for forming a 3D memory device including vertical transistors, according to some aspects of the present disclosure. FIGS. 14A-14M illustrate a fabrication process for forming another 3D memory device including vertical transistors, according to some aspects of the present disclosure. FIG. 16 illustrates a flowchart of a method 1600 for forming a 3D memory device including vertical transistors, according to some aspects of the present disclosure. Examples of the 3D memory devices depicted in FIGS. 13A-13M include 3D memory device 700 depicted in FIG. 7A. Examples of the 3D memory device depicted in FIGS. 14A-14M include 3D memory device 900 depicted in FIG. 9A. FIGS. 13A-13M, 14A-14M, and 16 will be described together. It is understood that the operations shown in method 1600 are not exhaustive and that other operations can be performed as well before, after, or between any of the illustrated operations. Further, some of the operations may be performed simultaneously, or in a different order than shown in FIG. 16.

Referring to FIG. 16, method 1600 starts at operation 1602, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

Figure 13A:
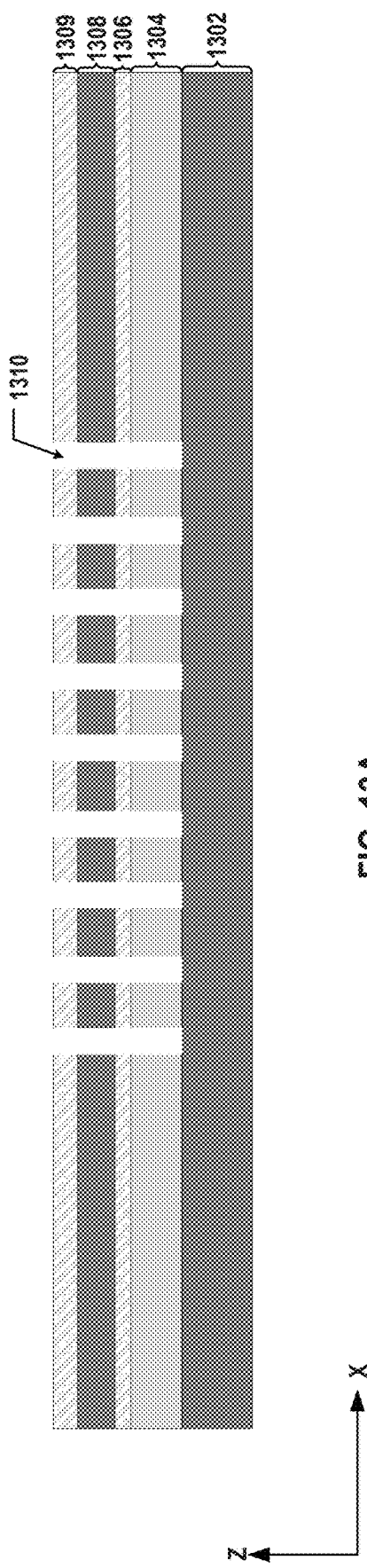
FIGS. 13A-13M illustrate a fabrication process for forming a 3D memory device including vertical transistors, according to some aspects of the present disclosure.
Figure 13B:
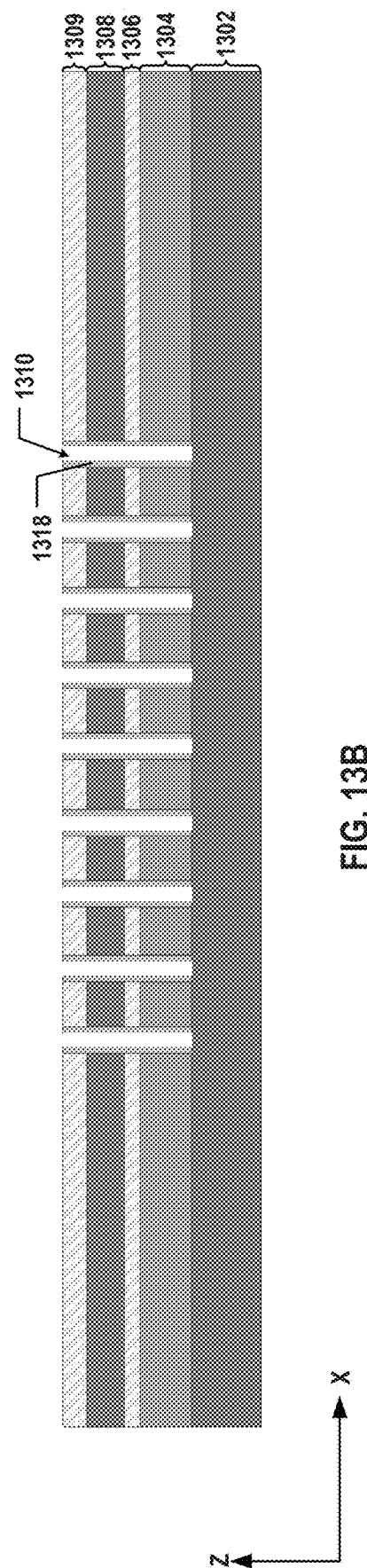
Figure 13C:
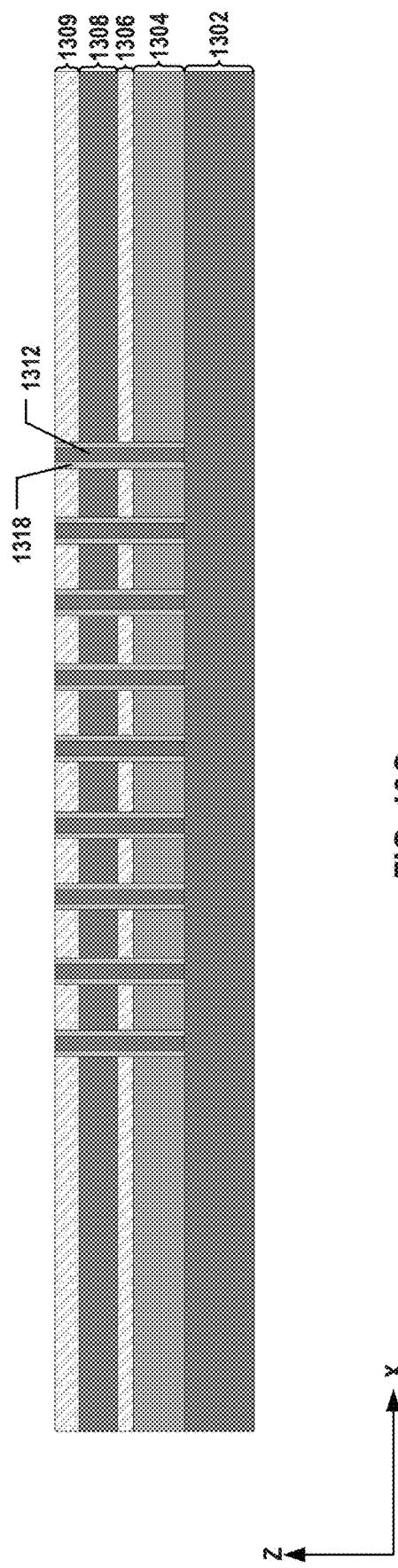
Figure 13D:
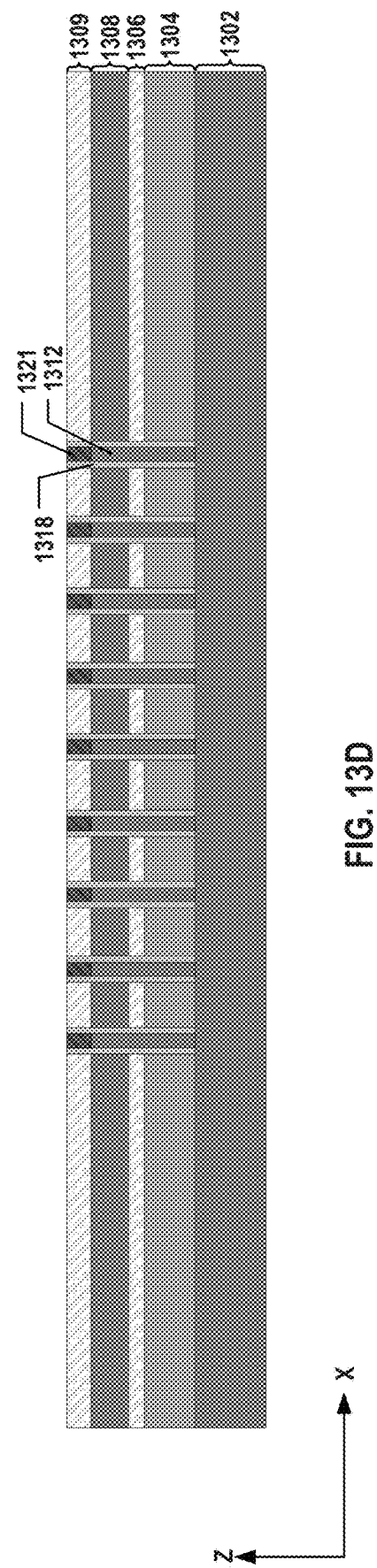
Figure 13E:
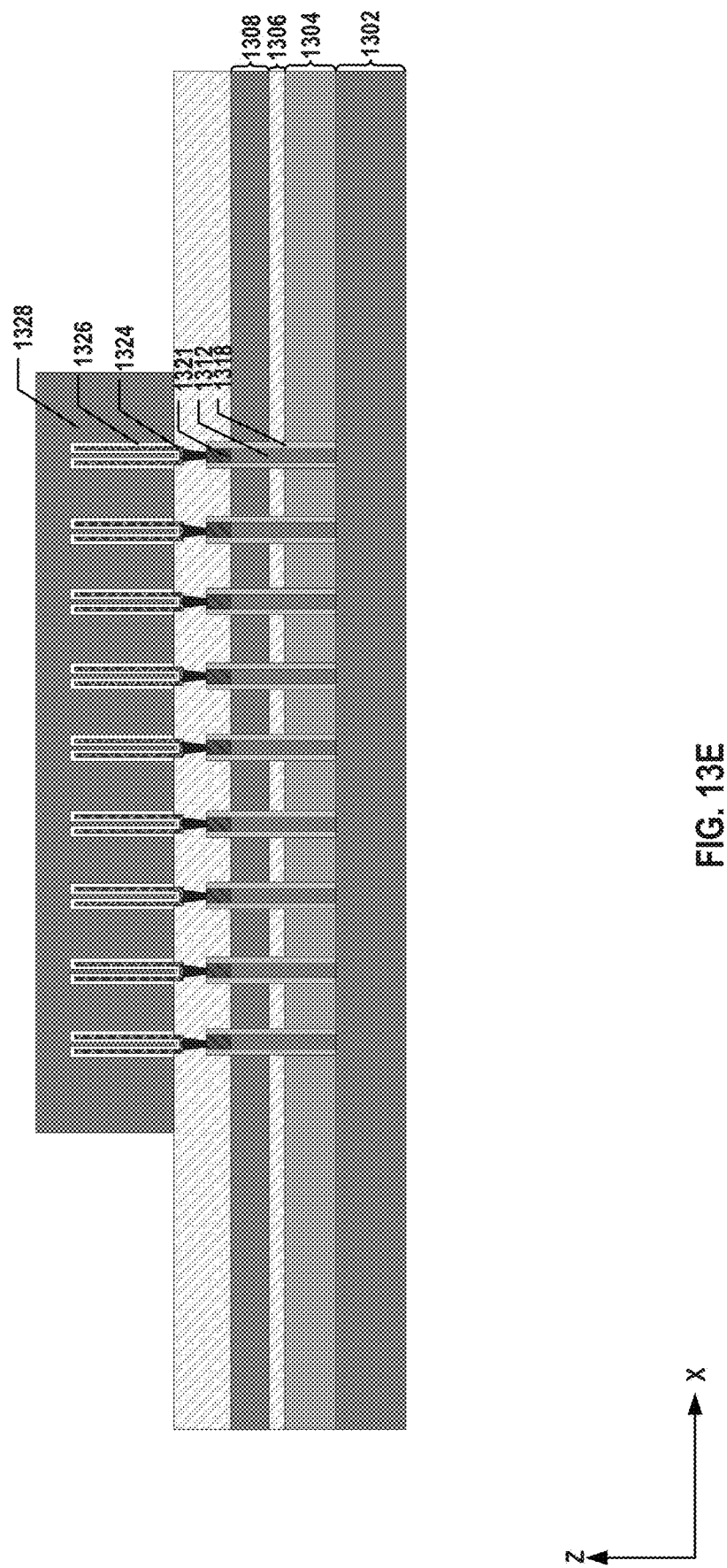
Figure 13F:
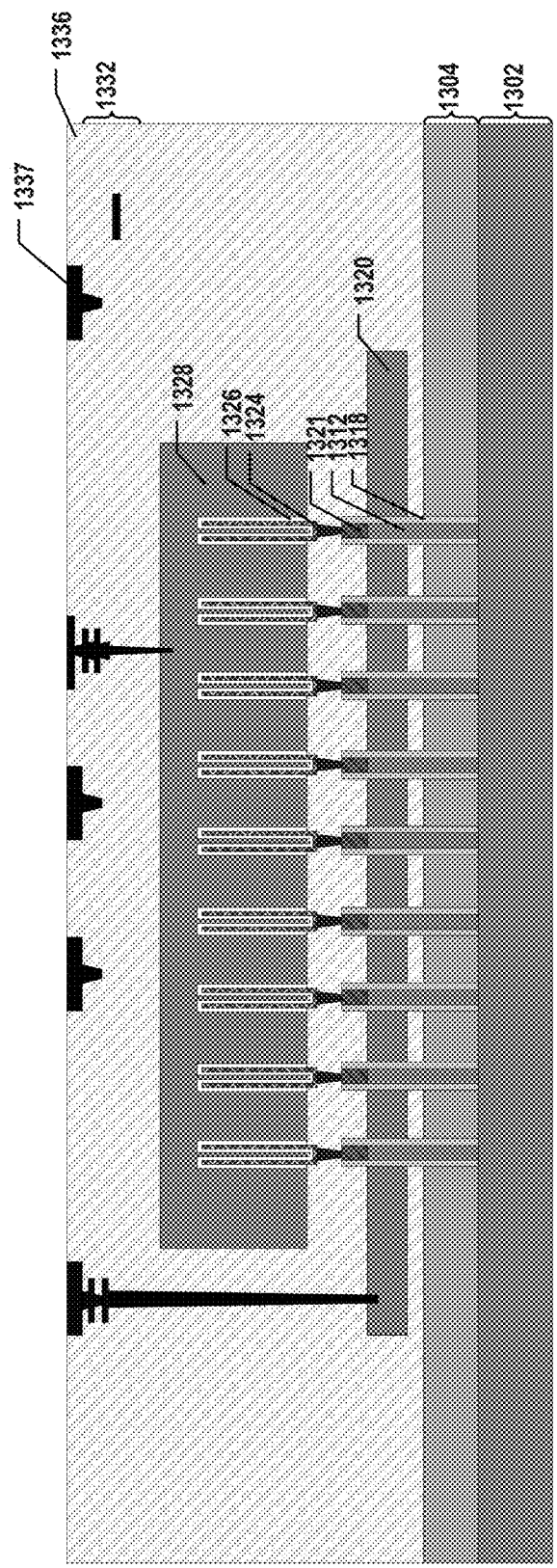
Figure 13G:
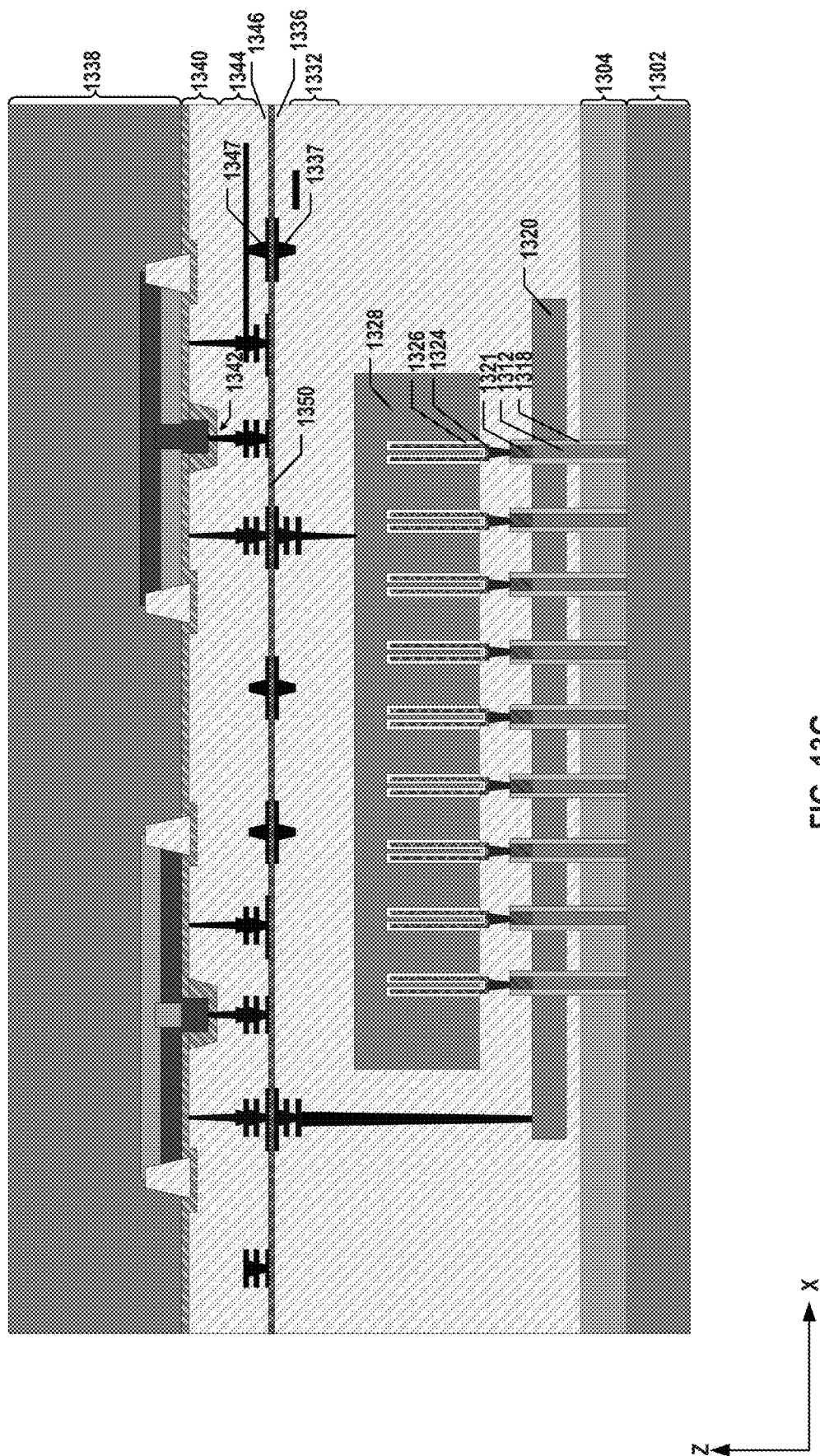
Figure 13H:
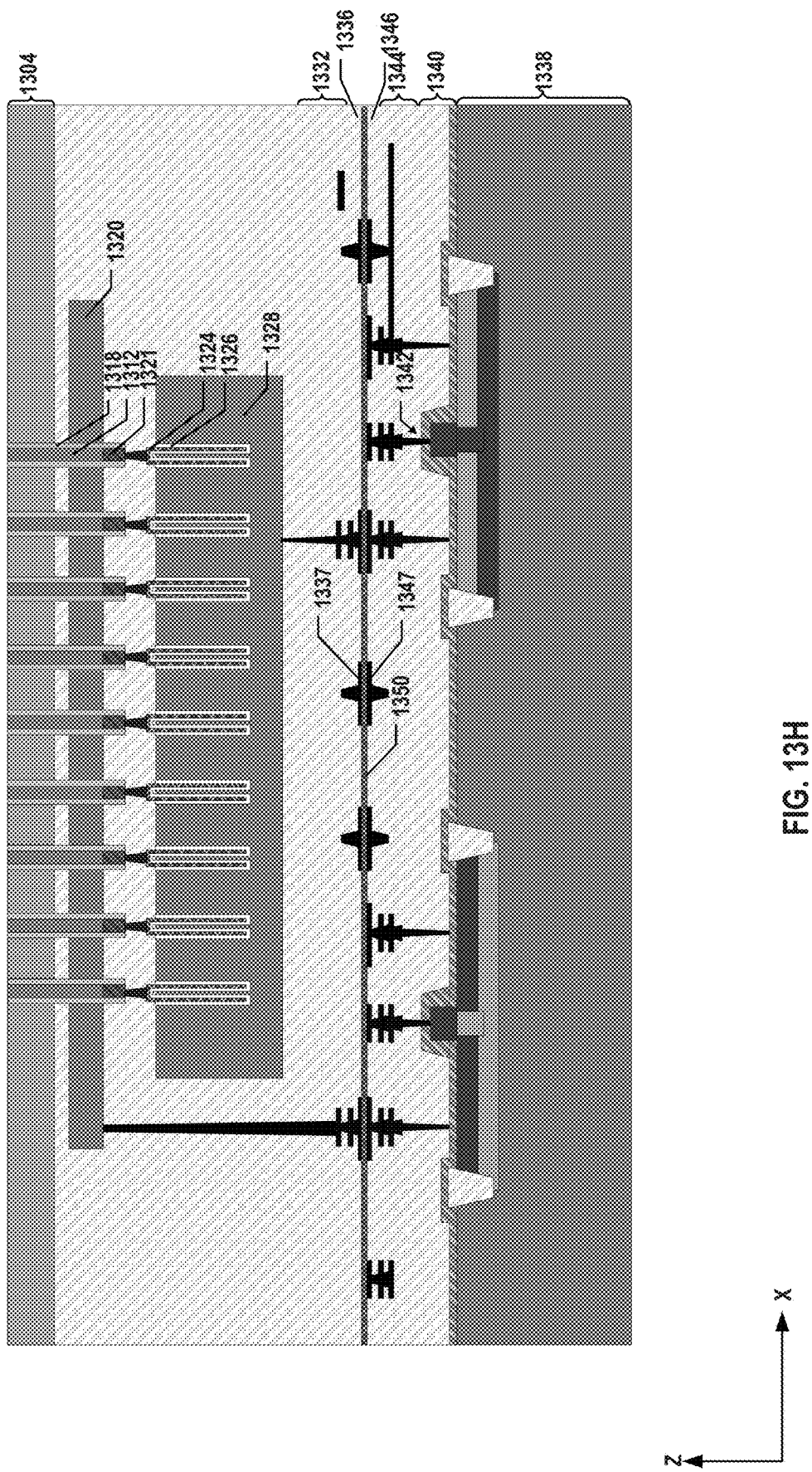

As illustrated in FIG. 13H, a plurality of transistors 1342 are formed on a silicon substrate 1338. Transistors 1342 can be formed by a plurality of processes including, but not limited to, photolithography, dry/wet etch, thin film deposition, thermal growth, implantation, chemical mechanical polishing (CMP), and any other suitable processes. In some implementations, doped regions are formed in silicon substrate 1338 by ion implantation and/or thermal diffusion, which function, for example, as the source and drain of transistors 1342. In some implementations, isolation regions (e.g., STIs) are also formed in silicon substrate 1338 by wet/dry etch and thin film deposition. Transistors 1342 can form peripheral circuits 1340 on silicon substrate 1338.

As illustrated in FIG. 13H, an interconnect layer 1344 can be formed above peripheral circuits 1340 having transistors 1342. Interconnect layer 1344 can include interconnects of MEOL and/or BEOL in a plurality of ILD layers to make electrical connections with peripheral circuits 1340. In some implementations, interconnect layer 1344 includes multiple ILD layers and interconnects therein formed in multiple processes. For example, the interconnects in interconnect layers 1344 can include conductive materials deposited by one or more thin film deposition processes including, but not limited to, chemical vapor deposition (CVD), physical vapor deposition (PVD), atomic layer deposition (ALD), electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 13H can be collectively referred to as interconnect layer 1344.

Method 1600 proceeds to operation 1604, as illustrated in FIG. 16, in which a first bonding layer is formed above the peripheral circuit (and the interconnect layer). The first bonding layer can include a first bonding contact. As illustrated in FIG. 13H, a bonding layer 1346 is formed above interconnect layer 1344 and peripheral circuits 1340. Bonding layer 1346 can include a plurality of bonding contacts 1347 surrounded by dielectrics. In some implementations, a dielectric layer (e.g., ILD layer) is deposited on the top surface of interconnect layer 1344 by one or more thin film deposition processes including, but not limited to, CVD, PVD, ALD, or any combination thereof. Bonding contacts 1347 can then be formed through the dielectric layer and in contact with the interconnects in interconnect layer 1344 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1600 proceeds to operation 1606, as illustrated in FIG. 16, in which a semiconductor body extending vertically from a second substrate is formed. The second substrate can include a silicon substrate. To form the semiconductor body, a word line sandwiched between two dielectric layers is formed above the substrate, an opening extending through the word line and the dielectric layers is formed to expose part of the substrate, and the semiconductor body is epitaxially grown from the exposed part of the substrate in the opening. To form the semiconductor body, a gate dielectric is formed on a sidewall of the opening prior to epitaxially growing the semiconductor body.

In some implementations, the semiconductor body extending vertically is formed from a first side (e.g., the front side) of the second substrate and surrounded by the gate dielectric. To form the semiconductor body, at operation 1702 in FIG. 17, a sacrificial layer, a first dielectric layer, a word line, and a second dielectric layer are subsequently formed on the substrate. The sacrificial layer can include silicon nitride, the first and second dielectric layers can include silicon oxide, and the word line can include a metal.

As illustrated in FIG. 13A, a sacrificial layer 1304, a first dielectric layer 1306, a word line 1308, and a second dielectric layer 1309 are sequentially formed on a silicon substrate 1302. In some implementations, silicon nitride, silicon oxide, a metal (e.g., W), and silicon oxide are subsequently deposited onto silicon substrate 1302 using one or more thin film deposition processes including, but not limited to, CVD, PVD, ALD, or any combination thereof. It is understood that the materials of first and second dielectric layers 1306 and 1309 may include any suitable dielectric materials other than silicon oxide, and the material of word line 1308 may include any suitable conductive materials other than metals. It is also understood that the sacrificial material of sacrificial layer 1304 is not limited to silicon nitride and may include any suitable sacrificial materials that are different from the materials of first dielectric layer 1306 and silicon substrate 1302. Silicon substrate 1302 can be intrinsic (i.e., undoped) or doped with a first type of dopant, such as P-type of dopants (e.g., e.g., B or Ga).

Figure 17:
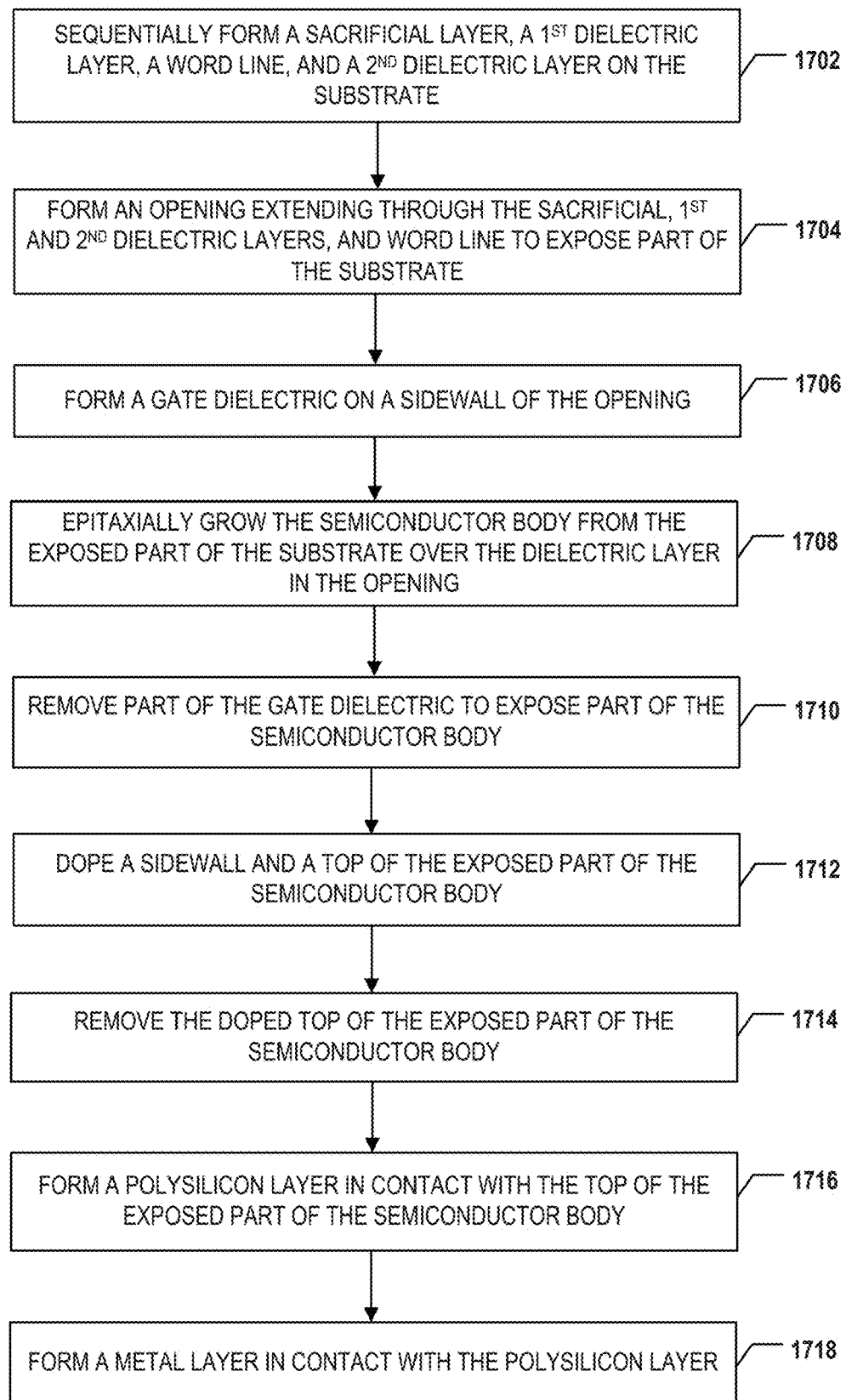
FIG. 17 illustrates a flowchart of a method for forming an array of memory cells each including a vertical transistor, according to some aspects of the present disclosure.

At operation 1704 in FIG. 17, an opening extending through the sacrificial layer, the first dielectric layer, the word line, and the second dielectric layer is formed to expose part of the substrate. As illustrated in FIG. 13A, an array of openings 1310 is formed, each of which extends vertically (in the z-direction) through the stack of second dielectric layer 1309, word line 1308, first dielectric layer 1306, and sacrificial layer 1304 to silicon substrate 1302. As a result, parts of silicon substrate 1302 can be exposed from openings 1310. In some implementations, a lithography process is performed to pattern the array of openings 1310 using an etch mask (e.g., a photoresist mask), for example, based on the design of word lines and bit lines, and one or more dry etching and/or wet etching processes, such as reactive ion etch (RIE), are performed to etch openings 1310 through second dielectric layer 1309, word line 1308, first dielectric layer 1306, and sacrificial layer 1304 until being stopped by silicon substrate 1302.

At operation 1706 in FIG. 17, a gate dielectric is formed on a sidewall of the opening. As illustrated in FIG. 13B, gate dielectrics 1318 are formed on sidewalls of openings 1310, respectively. To form gate dielectrics 1318, a gate dielectric layer, such as a layer of silicon oxide or high-k dielectric, can be deposited into openings 1310 to cover the sidewall and bottom of each opening 1310 using one or more thin film deposition processes including, but not limited to, CVD, PVD, ALD, or any combination thereof. The gate dielectric layer can then be partially etched using dry etching and/or wet etching, such as RIE, to remove parts thereof on the bottoms of openings 1310 to still expose parts of silicon substrate 1302 from openings 1310. The remainder of the gate dielectric layer on the sidewall of opening 1310 can thus become gate dielectric 1318. Gate dielectric 1318 and part of word line 1308 that is in contact with gate dielectric 1318 can thus become a gate structure of a vertical transistor to be formed.

At operation 1708 in FIG. 17, the semiconductor body is epitaxially grown from the exposed part of the substrate over the gate dielectric in the opening. As illustrated in FIG. 13C, an array of semiconductor bodies 1312 are formed over gate dielectrics 1318 in openings 1310 (shown in FIG. 13B), respectively. Semiconductor body 1312 can be epitaxially grown from the respective exposed part of silicon substrate 1302 in the respective opening 1310 over the respective gate dielectric 1318. The fabrication processes for epitaxially growing semiconductor body 1312 can include, but not limited to, vapor-phase epitaxy (VPE), liquid-phase epitaxy (LPE), molecular-beam epitaxy (MPE), or any combinations thereof. The epitaxy can occur upward (toward the positive z-direction) from the exposed parts of silicon substrate 1302 in openings 1310. Semiconductor body 1312 thus can have the same material as silicon substrate 1302, i.e., single crystalline silicon. The same as silicon substrate 1302, semiconductor body 1312 can be intrinsic (i.e., undoped) or doped with the first type of dopant, such as P-type of dopants (e.g., e.g., B or Ga). Depending on the shape of opening 1310, semiconductor body 1312 can have the same shape as opening 1310, such as a cuboid shape or a cylinder shape. In some implementations, a planarization process, such as CMP, is performed to remove excessive parts of semiconductor bodies 1312 beyond the top surface of second dielectric layer 1309. As a result, an array of semiconductor bodies 1312 (e.g., single crystalline silicon bodies) each surrounded by a respective gate dielectric 1318 and extending vertically (in the z-direction) from silicon substrate 1302 through the stack of second dielectric layer 1309, word line 1308, first dielectric layer 1306, and sacrificial layer 1304 is formed thereby, according to some implementations.

Referring back to FIG. 16, method 1600 proceeds to operation 1608 in which a first end of the semiconductor body is doped. As illustrated in FIG. 13D, the exposed upper end of each semiconductor body 1312, i.e., one of the two ends of semiconductor body 1312 in the vertical direction (the z-direction) that is away from silicon substrate 1302, is doped to form a source/drain 1321. In some implementations, an implantation process and/or thermal diffusion process are performed to dope P-type dopants or N-type dopants to the exposed upper ends of semiconductor bodies 1312 to form sources/drains 1321. In some implementations, a silicide layer is formed on source/drain 1321 by performing a silicidation process at the exposed upper ends of semiconductor bodies 1312.

Method 1600 proceeds to operation 1610, as illustrated in FIG. 16, in which a storage unit is formed on the doped first end of the semiconductor body. The storage unit can include a capacitor, a ferroelectric capacitor, or a PCM element. In some implementations, to form a storage unit that is a capacitor, a first electrode is formed on the doped first end of the semiconductor body, a capacitor dielectric is formed on the first electrode, and a second electrode is formed on the capacitor dielectric. In some implementations, an interconnect layer is formed above the word line. The interconnect layer can include a plurality of interconnects in one or more ILD layers.

As illustrated in FIG. 13E, one or more ILD layers are formed over the top surface of second dielectric layer 1309, for example, by depositing dielectrics using one or more thin film deposition processes including, but not limited to, CVD, PVD, ALD, or any combination thereof. It is understood that in some examples in which the ILD layers include silicon oxide, the same material as second dielectric layer 1309, the boundary and interface between the ILD layer and second dielectric layer 1309 may become indistinguishable after the deposition. As illustrated in FIG. 13E, first electrodes 1324, capacitor dielectrics 1326, and second electrodes 1328 are subsequently formed in the ILD layers to form capacitors in contact with semiconductor bodies 1312. In some implementations, each first electrode 1324 is formed on a respective source/drain 1321, i.e., the doped upper end of a respective semiconductor body 1312 by patterning and etching an electrode opening aligned with respective source/drain 1321 using lithography and etching processes and depositing conductive materials to fill the electrode opening using thin film deposition processes. Similarly, in some implementations, second electrode 1328 is formed on capacitor dielectrics 1326 by patterning and etching an electrode opening using lithography and etching processes and depositing conductive materials to fill the electrode opening using thin film deposition processes.

As illustrated in FIG. 13F, an interconnect layer 1332 can be formed above word line 1320. Interconnect layer 1332 can include interconnects of MEOL and/or BEOL in a plurality of ILD layers to make electrical connections with word line 1320 and second electrode 1328. In some implementations, interconnect layer 1332 includes multiple ILD layers and interconnects therein formed in multiple processes. For example, the interconnects in interconnect layers 1332 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on second electrode 1328 by one or more thin film deposition processes including, but not limited to, CVD, PVD, ALD, or any combination thereof. The ILD layers and interconnects illustrated in FIG. 13F can be collectively referred to as interconnect layer 1332.

Method 1600 proceeds to operation 1612, as illustrated in FIG. 16, in which a second bonding layer is formed above the semiconductor body (and the interconnect layer). The second bonding layer can include a second bonding contact. As illustrated in FIG. 13F, a bonding layer 1336 is formed above interconnect layer 1332 and semiconductor bodies 1312. Bonding layer 1336 can include a plurality of bonding contacts 1337 surrounded by dielectrics. In some implementations, a dielectric layer (e.g., ILD layer) is deposited on the top surface of interconnect layer 1332 by one or more thin film deposition processes including, but not limited to, CVD, PVD, ALD, or any combination thereof. Bonding contacts 1337 can then be formed through the dielectric layer and in contact with the interconnects in interconnect layer 1332 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1600 proceeds to operation 1614, as illustrated in FIG. 16, in which the first substrate and the second substrate are bonded in a face-to-face manner. The bonding can include hybrid bonding. In some implementations, the first bonding contact is in contact with the second bonding contact at a bonding interface after the bonding. In some implementations, the second substrate is above the first substrate after the bonding. In some implementations, the first substrate is above the second substrate after the bonding.

As illustrated in FIG. 13G, silicon substrate 1338 and components formed thereon (e.g., transistors 1342 in peripheral circuits 1340) are flipped upside down, and bonding layer 1346 facing down is bonded with bonding layer 1336 facing up, i.e., in a face-to-face manner, thereby forming a bonding interface 1350. In some implementations, a treatment process, e.g., a plasma treatment, a wet treatment, and/or a thermal treatment, is applied to the bonding surfaces prior to the bonding. Although not shown FIG. 13G, silicon substrate 1302 and components formed thereon (e.g., semiconductor bodies 1312) can be flipped upside down, and bonding layer 1336 facing down can be bonded with bonding layer 1346 facing up, i.e., in a face-to-face manner, thereby forming bonding interface 1350. After the bonding, bonding contacts 1337 in bonding layer 1336 and bonding contacts 1347 in bonding layer 1346 are aligned and in contact with one another, such that semiconductor bodies 1312 can be electrically connected to peripheral circuits 1340 across bonding interface 1350. It is understood that in the bonded chip, semiconductor bodies 1312 may be either above or below peripheral circuits 1340. Nevertheless, bonding interface 1350 can be formed vertically between peripheral circuits 1340 and semiconductor bodies 1312 after the bonding.

Method 1600 proceeds to operation 1616, as illustrated in FIG. 16, in which the second substrate is removed to expose a second end opposite to the first end of the semiconductor body. In some implementations, to remove the second substrate, the substrate is polished from the second side of the substrate until being stopped by the sacrificial layer. As illustrated in FIG. 13H, silicon substrate 1302 (shown in FIG. 13G) is removed from the backside to expose the upper ends of semiconductor bodies 1312 (used to be the lower ends before flipping over). In some implementations, silicon substrate 1302 is polished from the backside, for example, using a CMP process, until being stopped by sacrificial layer 1304 and the upper ends of semiconductor bodies 1312.

Method 1600 proceeds to operation 1618, as illustrated in FIG. 16, in which part of the semiconductor body is doped from the exposed second end of the semiconductor body. In some implementations, a protrusion of the semiconductor body is formed from the exposed second end of the semiconductor body prior to doping the part of the semiconductor body. The doped part and the another part of the semiconductor body can be in the protrusion of the semiconductor body. In some implementations, part of the protrusion of the semiconductor body is doped.

Figure 13I:
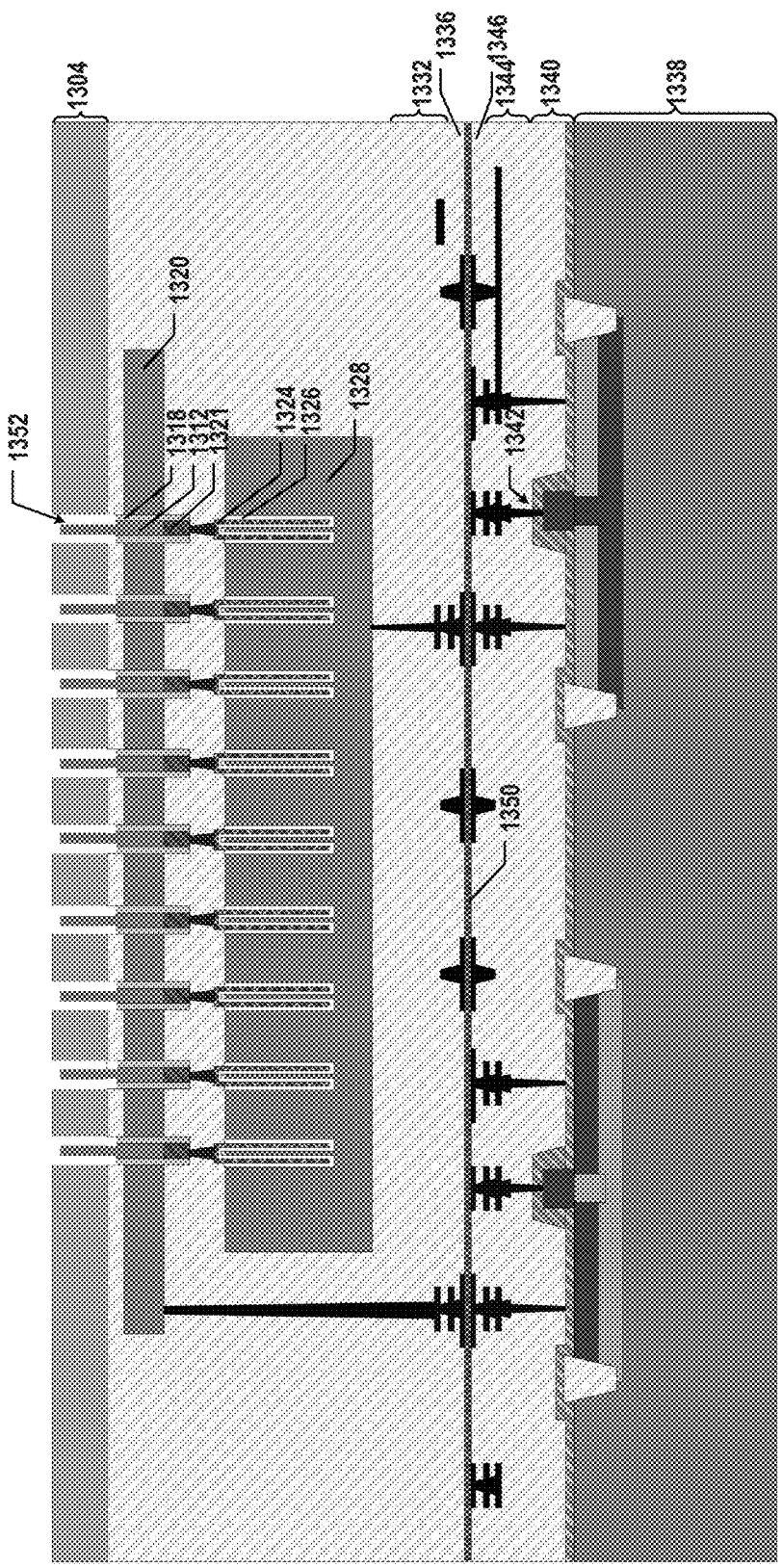

To form the protrusion of the semiconductor body and dope the part of the protrusion, at operation 1710 in FIG. 17, part of the gate dielectric is removed, for example, by dry etching and/or wet etching, to expose part of the semiconductor body. As illustrated in FIG. 13I, part of gate dielectric 1318 is removed from the upper end of semiconductor body 1312 to expose part of semiconductor body 1312. The exposed part of semiconductor body 1312 not surrounded by gate dielectric 1318 may be viewed as a protrusion of semiconductor body 1312, and the rest of semiconductor body 1312 is still surrounded by gate dielectric 1318 may be viewed as a base of semiconductor body 1312. In some implementations, a wet etchant (e.g., hydrofluoric acid (HF)) for selectively etching gate dielectric 1318 (e.g., including silicon oxide) against sacrificial layer 1304 (e.g., including silicon nitride) and semiconductor body 1312 (e.g., silicon).

The etching rate and/or duration can be controlled to ensure only part of gate dielectric 1318 is removed. In some implementations, the upper end of the remainder of gate dielectric 1318 is not above the bottom surface of sacrificial layer 1304.

As illustrated in FIG. 13I, a recess 1352 is formed surrounding the protrusion of semiconductor body 1312 after removing the part of gate dielectric 1318. In some implementations, part of the protrusion of semiconductor body 1312 is further removed, for example by dry etching and/or wet etching, to enlarge recess 1352, i.e., the opening in sacrificial layer 1304.

Figure 13J:
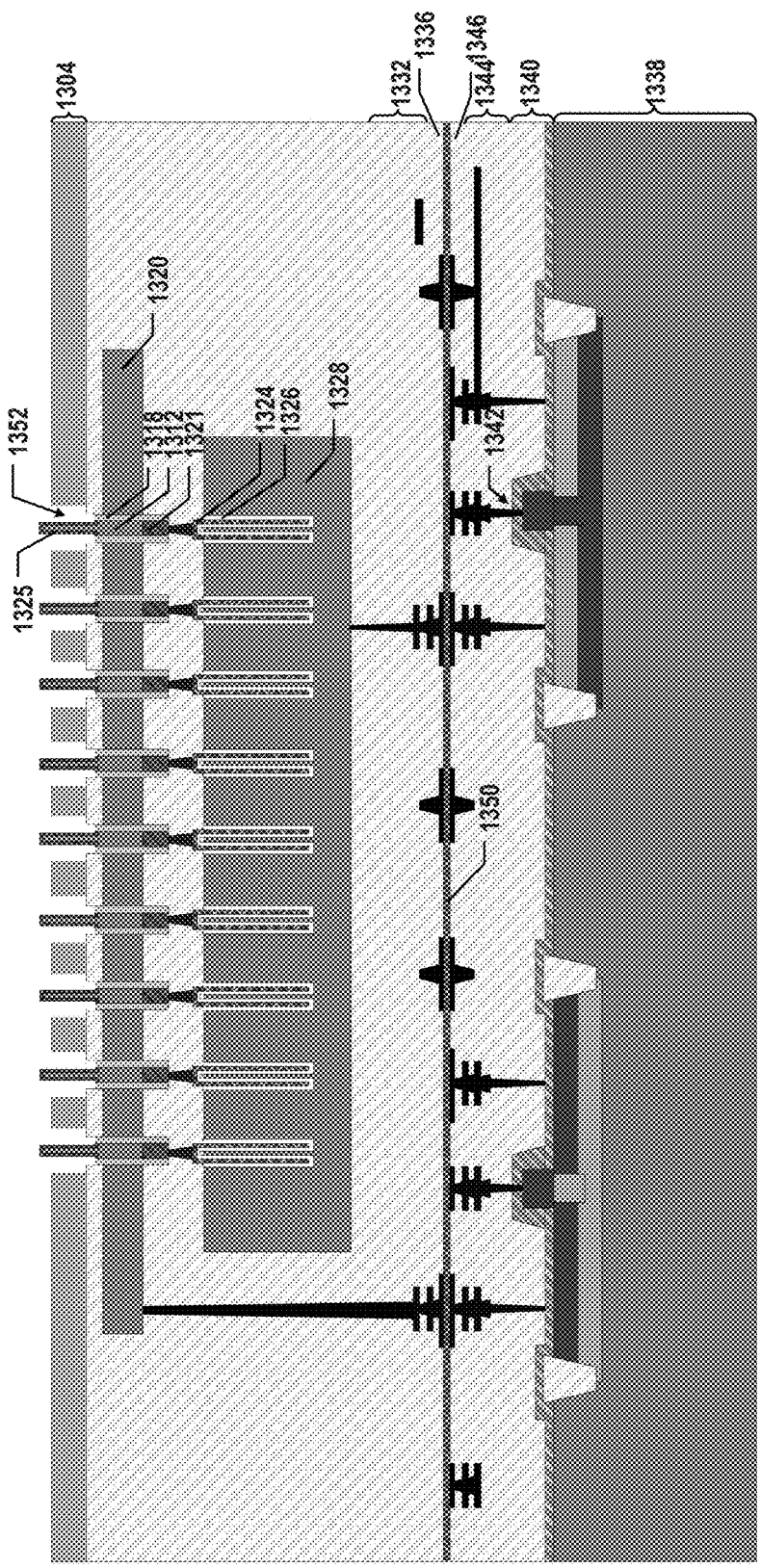

At operation 1712 in FIG. 17, a sidewall and a top of the exposed part of the semiconductor body are doped. As illustrated in FIG. 13J, the sidewall and the top of the exposed part (i.e., the protrusion) of semiconductor body 1312 are doped to form a doped region 1325. In some implementations, an implantation process and/or thermal diffusion process are performed to dope P-type dopants or N-type dopants through recess 1352 to the exposed upper ends of semiconductor bodies 1312 to form doped region 1325. In some implementations in which silicon substrate 1302 and semiconductor body 1312 is doped with the first type of dopant (e.g., P-type dopants), doped region 1325 is doped with a second type of dopant (e.g., N-type dopants) different from silicon substrate 1302 and semiconductor body 1312. The implantation process and/or thermal diffusion process can be controlled such that the dopant is limited to the exposed surface, e.g., the sidewall and the top of the protrusion of semiconductor body 1312 and does not diffuse to the entire protrusion. In other words, the protrusion of semiconductor body 1312 can include both doped region 1325 and the remaining portion (either undoped or doped with a different type of dopant) after doping.

At operation 1714 in FIG. 17, the doped top of the exposed part of the semiconductor body is removed. In some implementations, to remove the doped top of the exposed part of the semiconductor body, the sacrificial layer is thinned, and the exposed part of the semiconductor body is polished until being stopped by the thinned sacrificial layer.

Figure 13K:
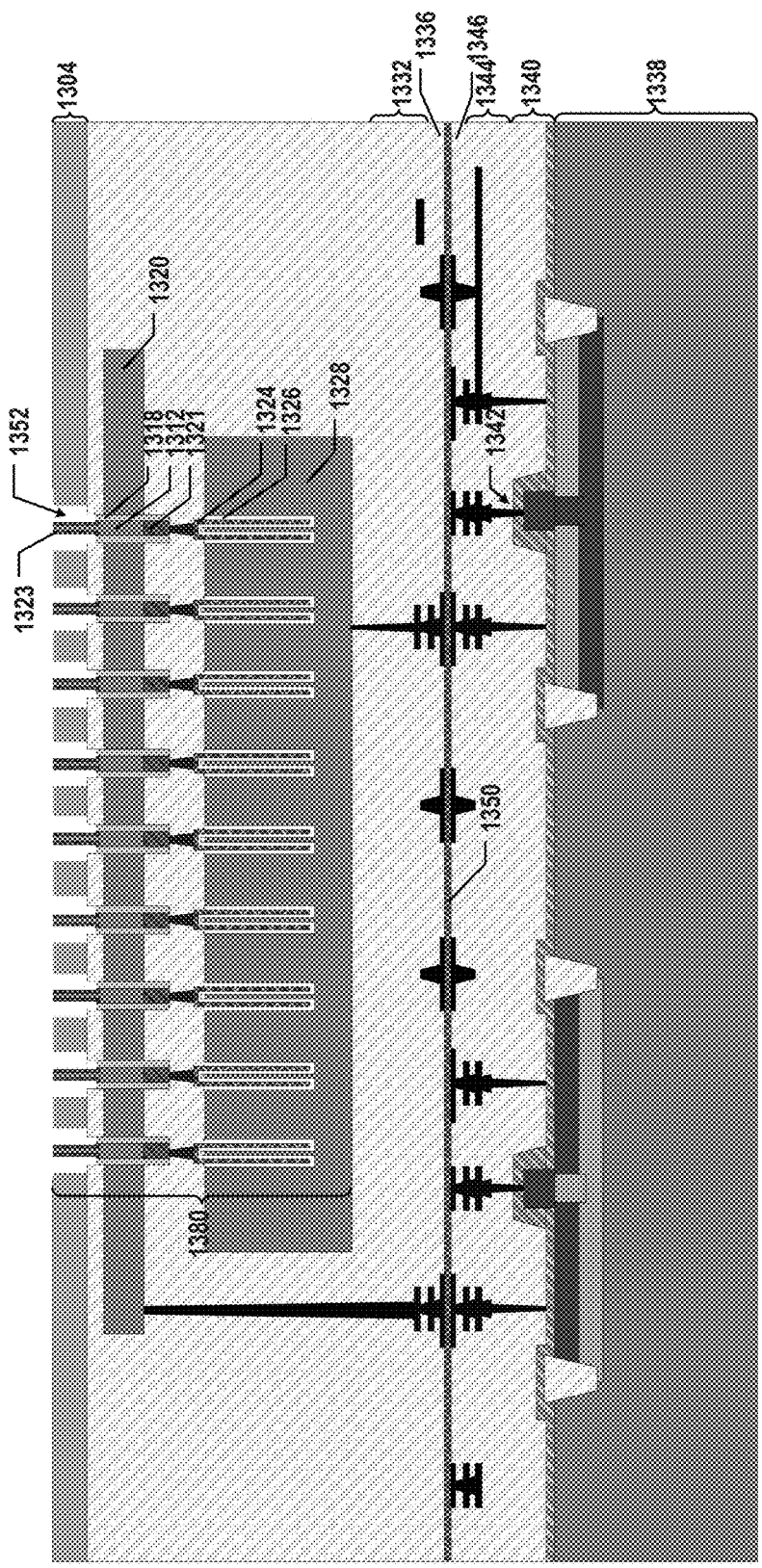

As illustrated in FIG. 13J, sacrificial layer 1304 is thinned, for example, using wet etching and/or dry etching, such that the top surface of thinned sacrificial layer 1304 becomes lower than the doped top of the exposed part (i.e., the protrusion) of semiconductor body 1312. As illustrated in FIG. 13K, the doped top of the protrusion of semiconductor body 1312 is removed, leaving the remainder of doped region 1325 on the sidewall of the protrusion to become another source/drain 1323. The portion of the protrusion of semiconductor body 1312 that is undoped or doped with a different type of dopant can thus be exposed from the upper end. In some implementations, the protrusions of semiconductor bodies 1312 are polished, for example, using a CMP process, to remove part of doped region 1325 (i.e., the doped top of the protrusion) until being stopped by the top surface of thinned sacrificial layer 1304. As a result, the upper end of the protrusion of semiconductor body 1312 can become flush with the top surface of thinned sacrificial layer 1304. Source/drain 1323 can be formed on the sidewall, but not the top, of the protrusion of semiconductor body 1312.

Accordingly, vertical transistors each having semiconductor body 1312, sources/drains 1321 and 1323, gate dielectric 1318, and the gate electrode (part of word line 1320 in contact with gate dielectric 1318) are formed thereby, as shown in FIG. 13K, according to some implementations. As described above, capacitors each having first and second electrodes 1324 and 1328 and capacitor dielectric 1326 are thereby formed as well, and DRAM cells 1380 each having a vertical transistor and a capacitor coupled to the vertical transistor are thereby formed, as shown in FIG. 13K, according to some implementations.

Figure 13L:
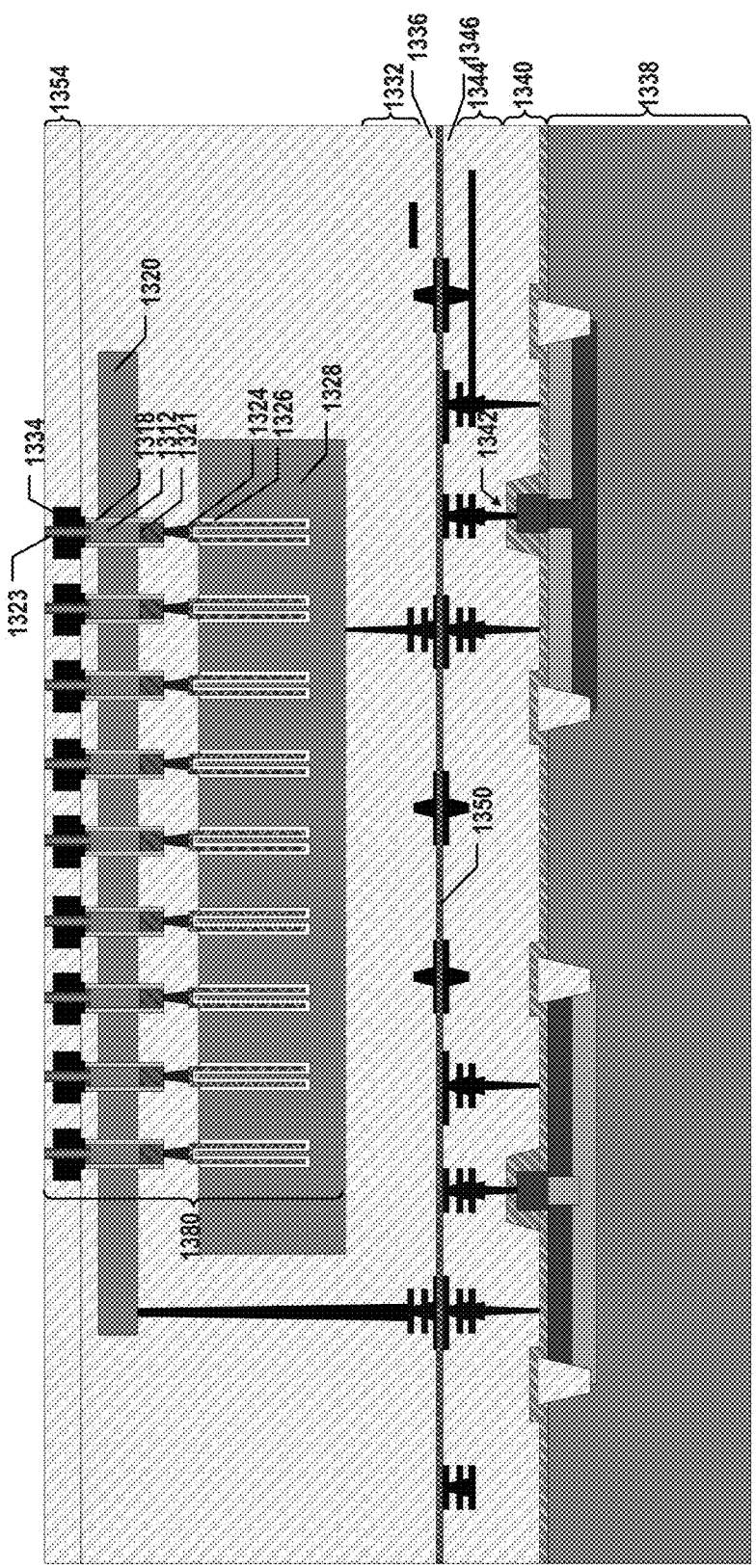

Referring back to FIG. 16, method 1600 proceeds to operation 1620 in which a bit line in contact with the doped part of the semiconductor body is formed. In some implementations, the bit line is in contact with the doped part of the protrusion of the semiconductor body. As illustrated in FIG. 13L, bit line 1334 is formed in recess 1352 (shown in FIG. 13K) to be in contact with source/drain 1323. The upper end of bit line 1334 can be lower than the upper end of the protrusion of semiconductor body 1312, such that bit line 1334 does not cover the exposed upper end of the portion of the protrusion that is undoped or doped with a different type of dopant. To form bit line 1334, in some implementations, sacrificial layer 1304 (shown in FIG. 13K) is first removed, for example, using wet etching and/or dry etching, and a conductive layer, such as a metal (e.g., W) layer, is deposited using by one or more thin film deposition processes including, but not limited to, CVD, PVD, ALD, or any combination thereof. The thickness of the conductive layer can be controlled to be smaller than the height of the protrusion of semiconductor body 1312 by controlling the deposition rate and/or duration or etching back the conductive layer after deposition. The conductive layer can then be patterned using lithography and dry etching and/or wet etching processes to form a plurality of bit lines 1334 each surrounding and contacting a respective source/drain 1323.

As illustrated in FIG. 13L, a dielectric layer 1354 is formed between and above bit lines 1334 to electrically insulate bit lines 1334. Dielectric layer 1354 can be formed by depositing a layer of dielectric material, such as silicon oxide, using one or more thin film deposition processes including, but not limited to, CVD, PVD, ALD, or any combination thereof to cover bit lines 1334. In some implementations, a planarization process, such as CMP, is performed to remove excessive dielectric material covering the upper ends of the protrusions of semiconductor bodies 1312, such that the upper ends of the protrusions are flush with the top surface of dielectric layer 1354 and thus, still remain exposed.

Method 1600 proceeds to operation 1622, as illustrated in FIG. 16, in which a body line in contact with another part of the semiconductor body is formed. In some implementations, the body line is in contact with the another part of the protrusion of the semiconductor body that is undoped or doped with a different type of dopant from the doped part.

Figure 13M:
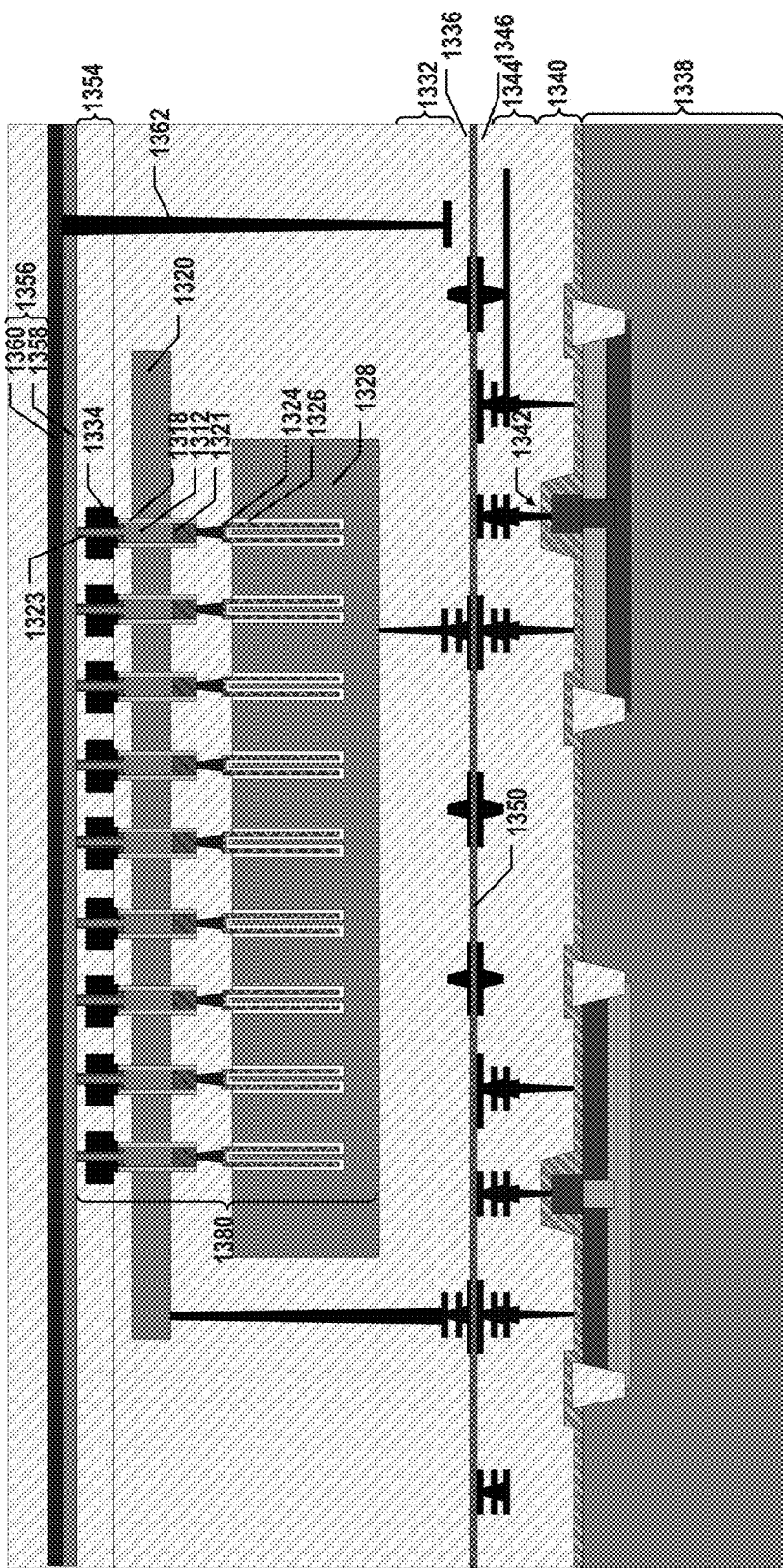

To form the body line, at operation 1716 in FIG. 17, a polysilicon layer in contact with the top of the exposed part (the protrusion) of the semiconductor body is formed. As illustrated in FIG. 13M, a polysilicon layer 1358 is formed in contact with the top of the protrusion of semiconductor body 1312. That is, the exposed upper end of the portion of the protrusion that is undoped or doped with a different type of dopant can be in contact with polysilicon layer 1358. Polysilicon layer 1358 can be formed by depositing a layer of polysilicon using one or more thin film deposition processes including, but not limited to, CVD, PVD, ALD, or any combination thereof on dielectric layer 1354 and the exposed upper ends of the portions of semiconductor bodies 1312. As shown in FIG. 13M, because the upper end of bit line 1334 is lower than the upper end of the protrusion of semiconductor bodies 1312 and is covered with dielectric layer 1354, bit line 1334 is electrically insulated from polysilicon layer 1358 by dielectric layer 1354. Since polysilicon layer 1358 and semiconductor body 1312 can have the same semiconductor material, such as silicon, the contact resistance therebetween can be reduced.

At operation 1718, a metal layer in contact with the polysilicon layer is formed. As illustrated in FIG. 13M, a metal layer 1360 is formed in contact with polysilicon layer 1358 to reduce the sheet resistance. Metal layer 1360 can be formed by depositing a layer of metal, such as W, using one or more thin film deposition processes including, but not limited to, CVD, PVD, ALD, or any combination thereof on polysilicon layer 1358. A body line 1356 including polysilicon layer 1358 and metal layer 1360 is thereby formed to be in contact with the portions of semiconductor bodies 1312 that are undoped or doped with a different type of dopant, according to some implementations. In some implementations, a body line contact 1362 is formed extending through dielectric layer 1354 and other ILD layers, for example, by wet/dry etching processes, followed by depositing conductive materials. Body line contact 1362 can be in contact with body line 1356 and the interconnects in interconnect layer 1332.

Although not shown, it is understood that a pad-out interconnect layer may be formed above body line 1356. The pad-out interconnect layer may include interconnects, such as pad contacts, formed in one or more ILD layers. The pad contacts may include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is also understood that in some examples, the pad-out interconnect layer may be formed on the backside of silicon substrate 1338, and through substrate contacts (TSC) may be formed extending vertically through silicon substrate 1338. Silicon substrate 1338 may be thinned prior to forming the pad-out interconnect layer and TSCs, for example, using planarization processes and/or etching processes.

As described above, FIGS. 13A-13M and 17 illustrate a fabrication process and method of forming DRAM cells 1380 having vertical transistors corresponding to vertical transistors 726 in FIG. 7A. In some implementations as shown in FIGS. 14A-14M and 18, a fabrication process and method of forming DRAM cells 1480 having vertical transistors corresponding to vertical transistors 926 in FIG. 9A is illustrated.

Referring to FIG. 16, method 1600 starts at operation 1602, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

Figure 14A:
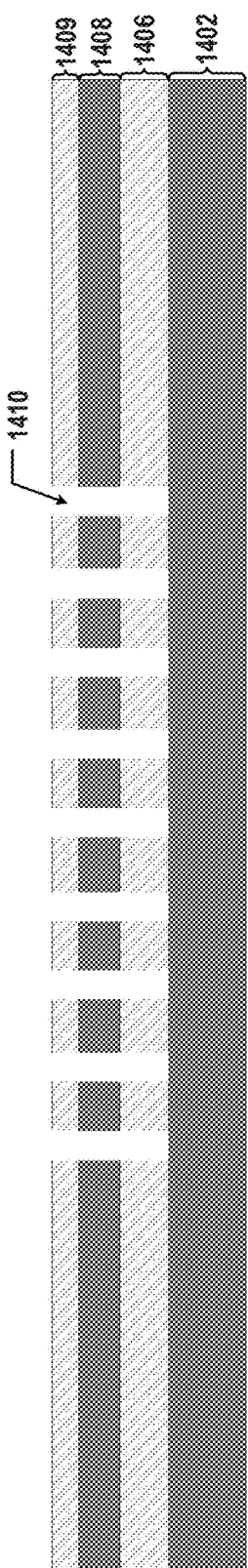
FIGS. 14A-14M illustrate a fabrication process for forming another 3D memory device including vertical transistors, according to some aspects of the present disclosure.
Figure 14B:
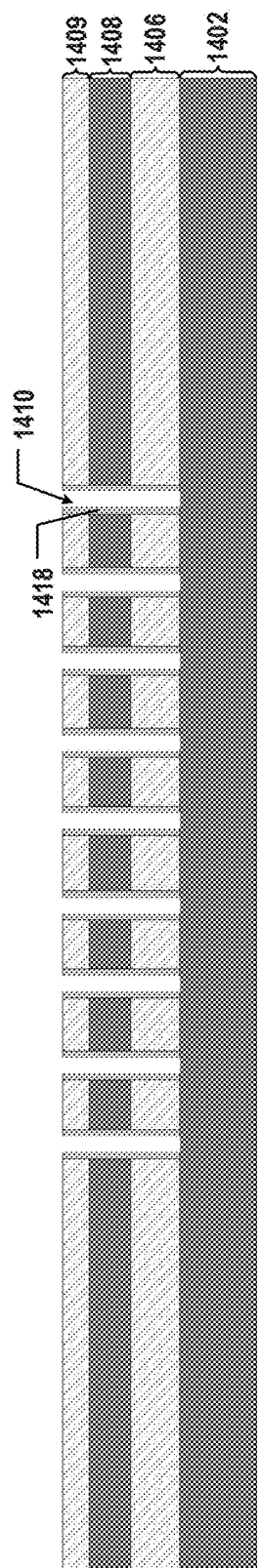
Figure 14C:
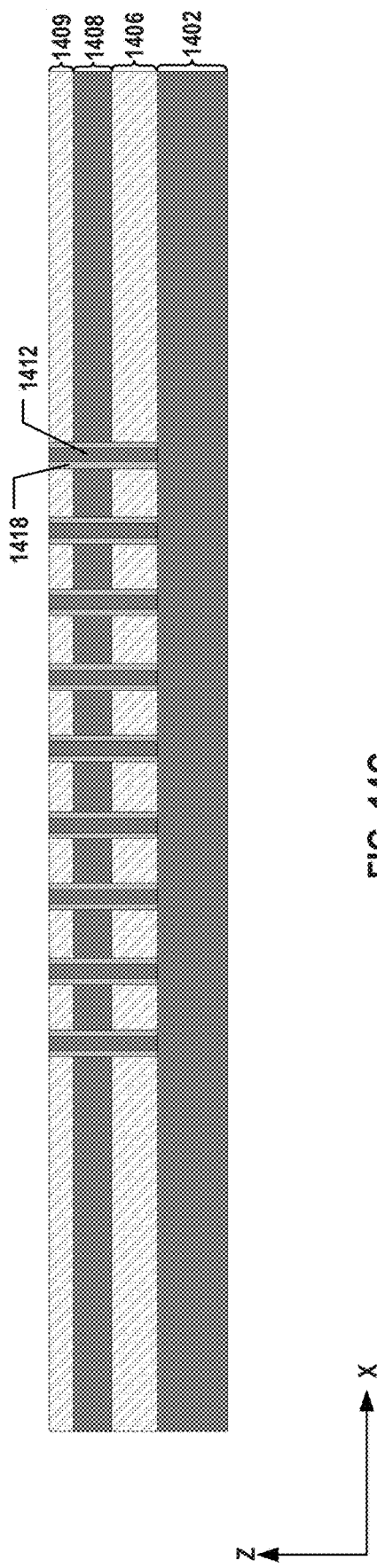
Figure 14D:
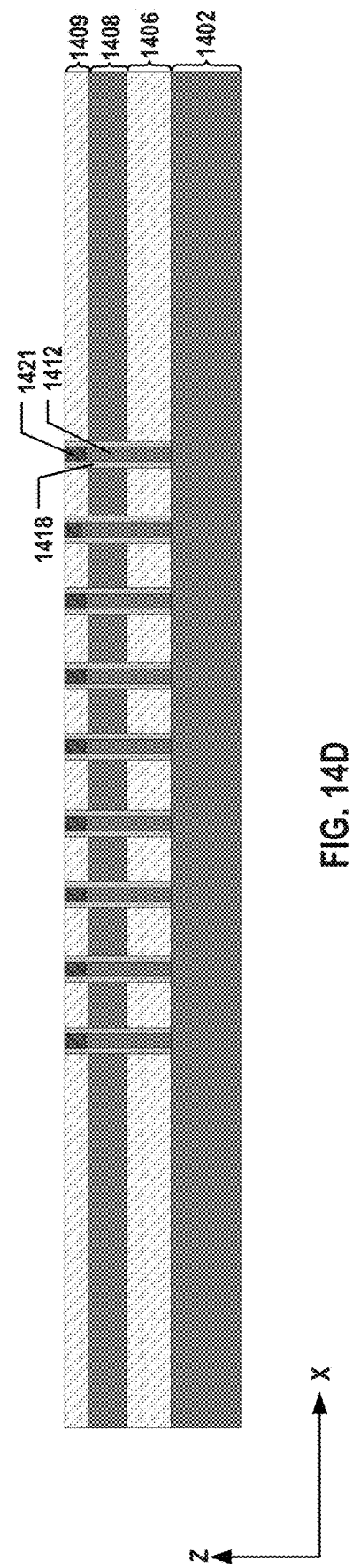
Figure 14E:
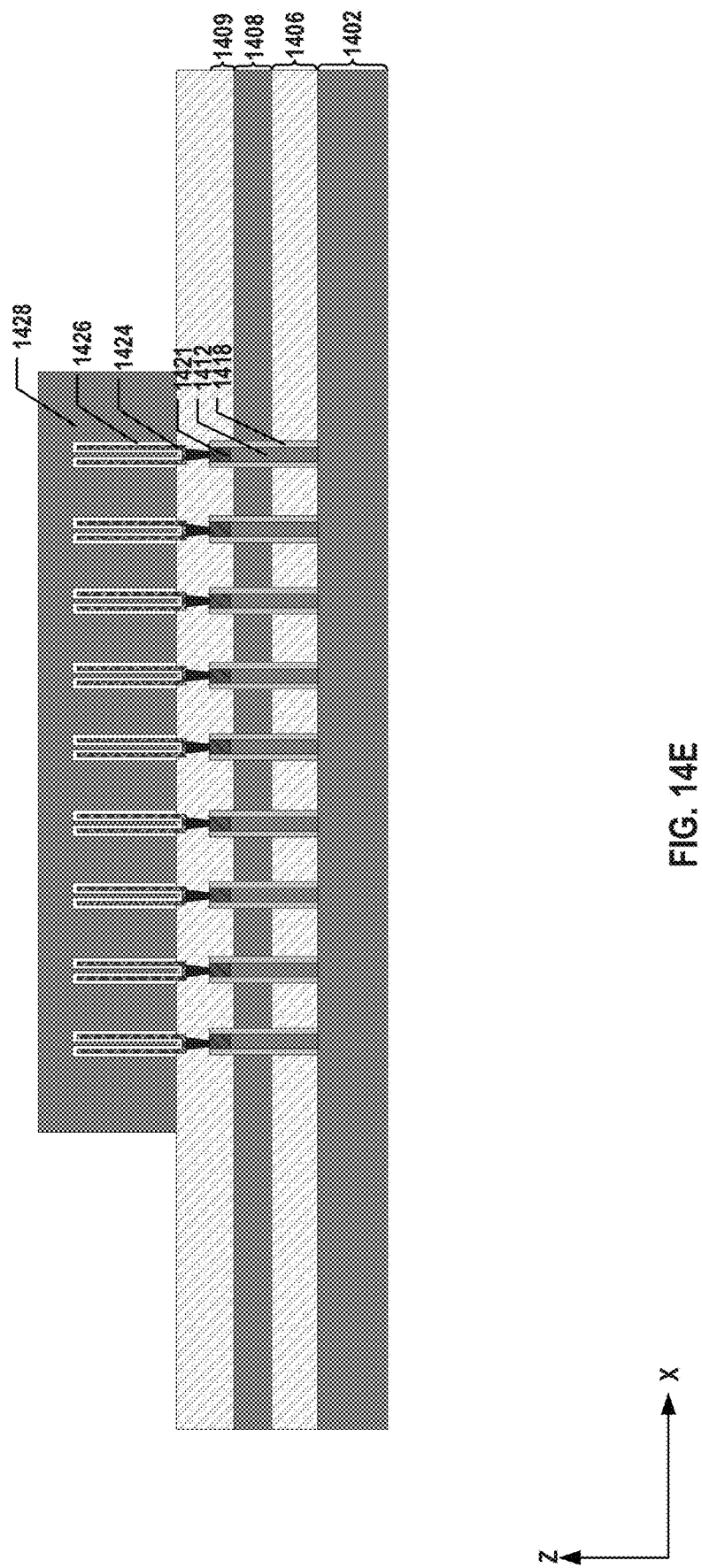
Figure 14F:
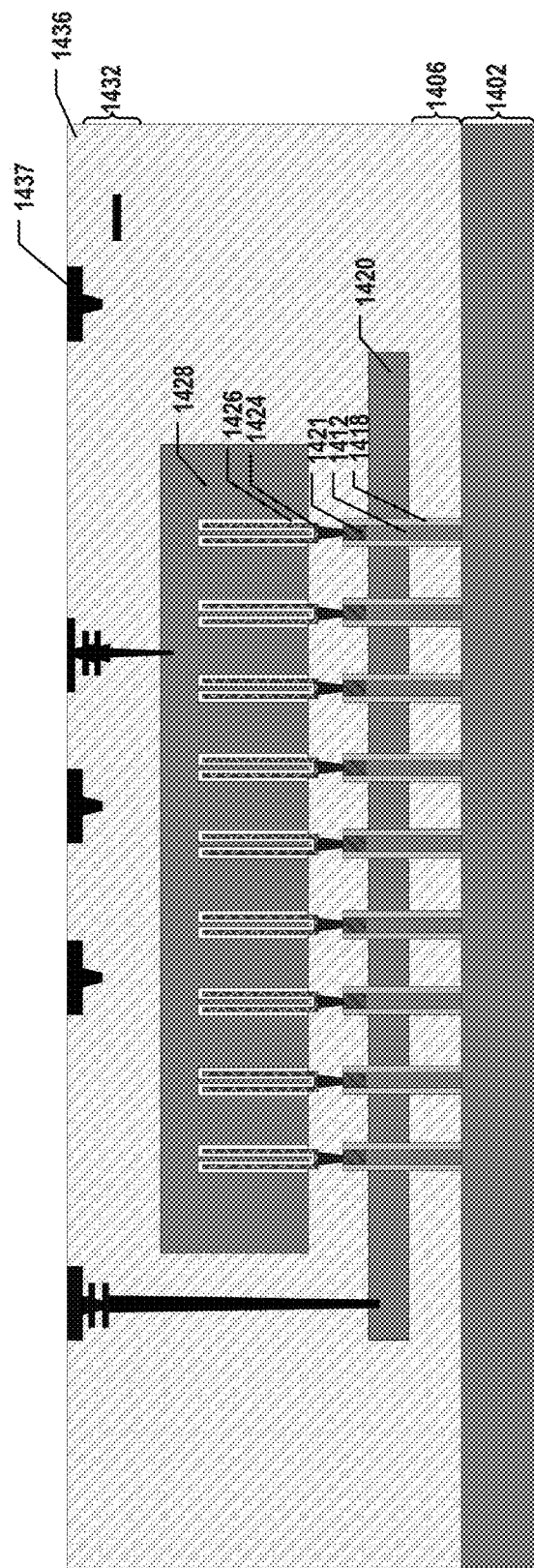
Figure 14G:
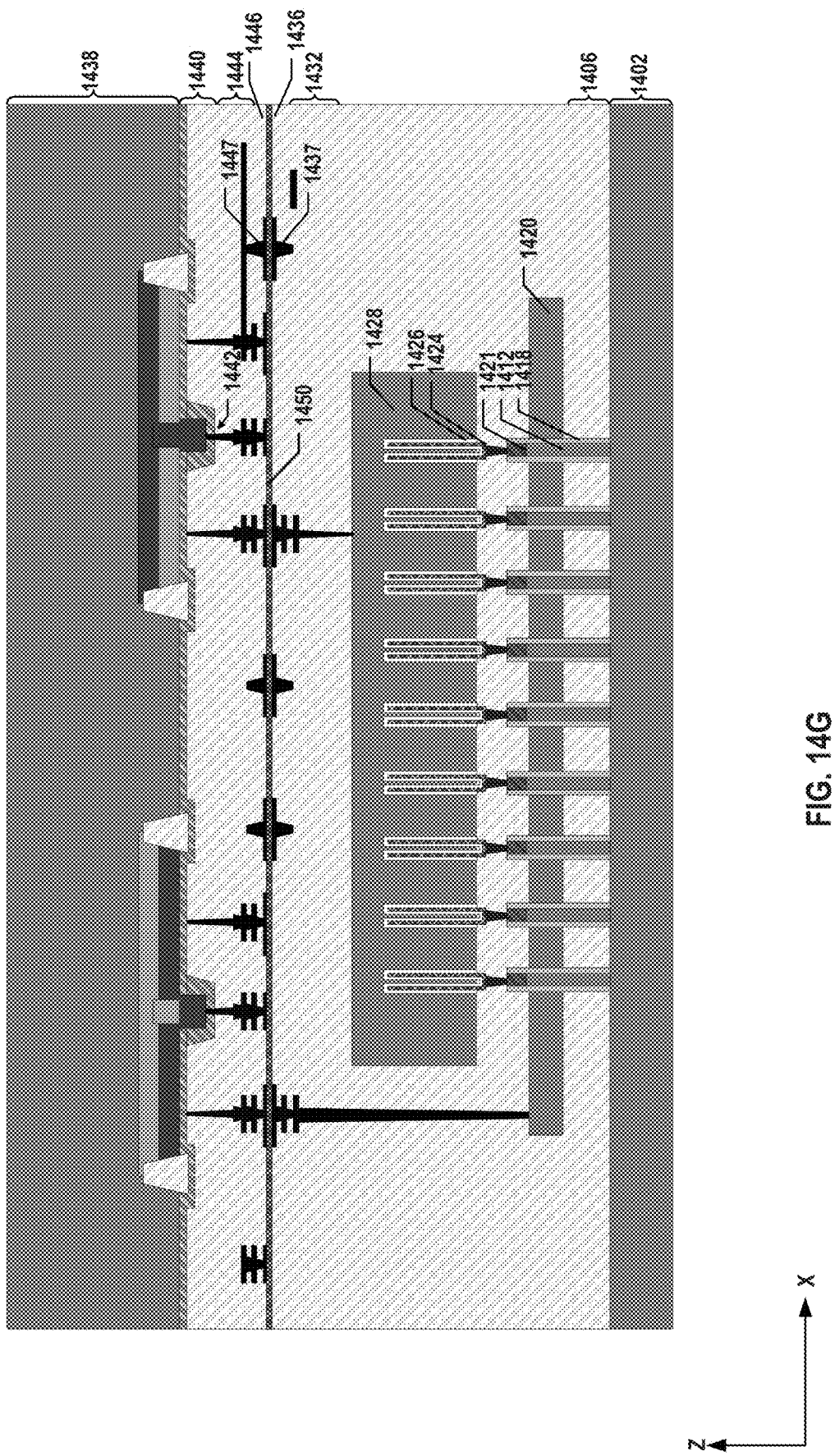
Figure 14H:
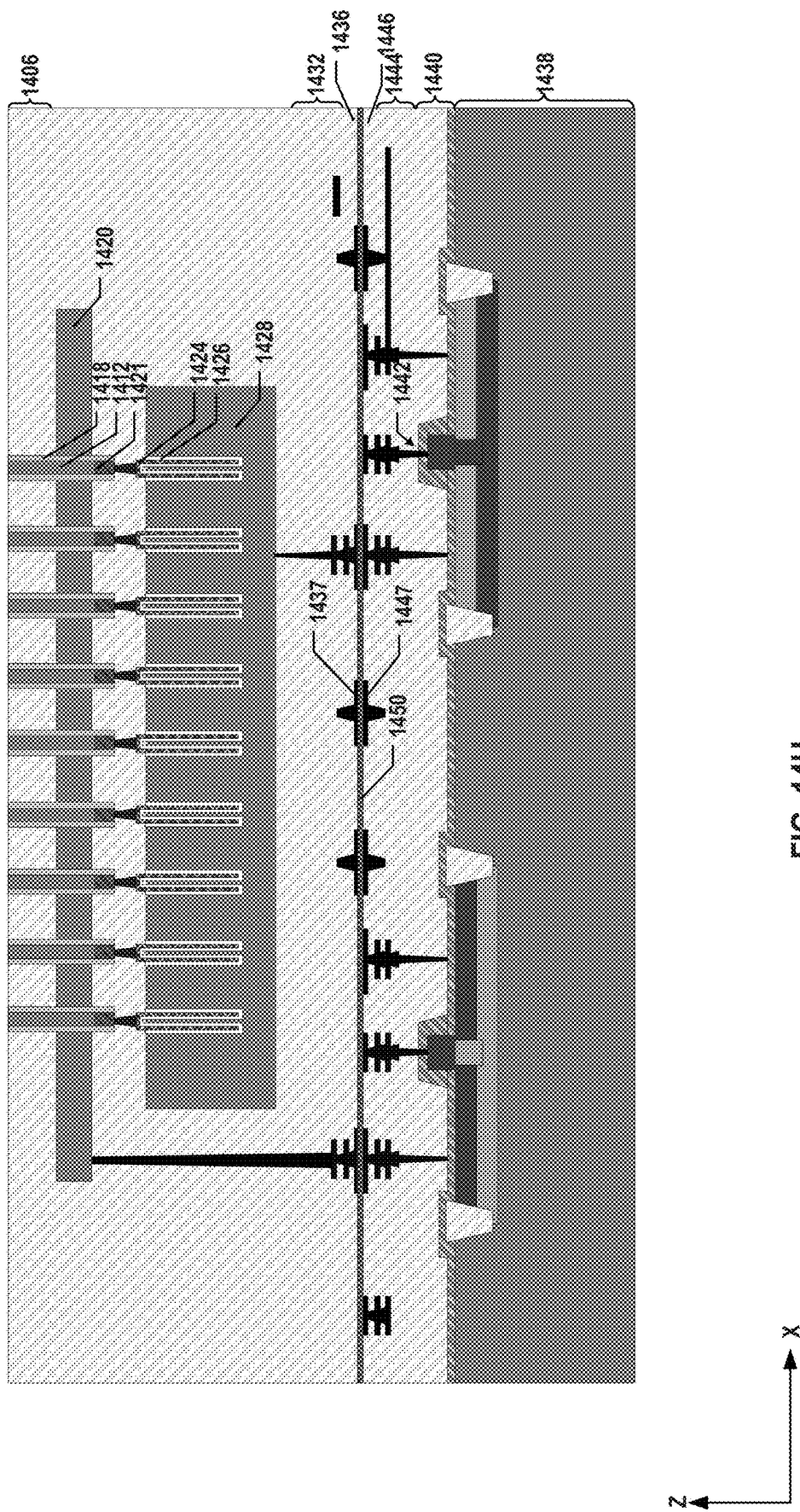

As illustrated in FIG. 14H, a plurality of transistors 1442 are formed on a silicon substrate 1438. Transistors 1442 can be formed by a plurality of processes including, but not limited to, photolithography, dry/wet etch, thin film deposition, thermal growth, implantation, CMP, and any other suitable processes. In some implementations, doped regions are formed in silicon substrate 1438 by ion implantation and/or thermal diffusion, which function, for example, as the source and drain of transistors 1442. In some implementations, isolation regions (e.g., STIs) are also formed in silicon substrate 1438 by wet/dry etch and thin film deposition. Transistors 1442 can form peripheral circuits 1440 on silicon substrate 1438.

As illustrated in FIG. 14H, an interconnect layer 1444 can be formed above peripheral circuits 1440 having transistors 1442. Interconnect layer 1444 can include interconnects of MEOL and/or BEOL in a plurality of ILD layers to make electrical connections with peripheral circuits 1440. In some implementations, interconnect layer 1444 includes multiple ILD layers and interconnects therein formed in multiple processes. For example, the interconnects in interconnect layers 1444 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 14H can be collectively referred to as interconnect layer 1444.

Method 1600 proceeds to operation 1604, as illustrated in FIG. 16, in which a first bonding layer is formed above the peripheral circuit (and the interconnect layer). The first bonding layer can include a first bonding contact. As illustrated in FIG. 14H, a bonding layer 1446 is formed above interconnect layer 1444 and peripheral circuits 1440. Bonding layer 1446 can include a plurality of bonding contacts 1447 surrounded by dielectrics. In some implementations, a dielectric layer (e.g., ILD layer) is deposited on the top surface of interconnect layer 1444 by one or more thin film deposition processes including, but not limited to, CVD, PVD, ALD, or any combination thereof. Bonding contacts 1447 then can be formed through the dielectric layer and in contact with the interconnects in interconnect layer 1444 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1600 proceeds to operation 1606, as illustrated in FIG. 16, in which a semiconductor body extending vertically from a second substrate is formed. The second substrate can include a silicon substrate. To form the semiconductor body, a word line sandwiched between two dielectric layers is formed above the substrate, an opening extending through the word line and the dielectric layers is formed to expose part of the substrate, and the semiconductor body is epitaxially grown from the exposed part of the substrate in the opening. To form the semiconductor body, a gate dielectric is formed on a sidewall of the opening prior to epitaxially growing the semiconductor body.

In some implementations, the semiconductor body extending vertically is formed from a first side (e.g., the front side) of the second substrate. To form the semiconductor body, at operation 1802 in FIG. 18, a first dielectric layer, a word line, and a second dielectric layer are subsequently formed on the substrate. The first and second dielectric layers can include silicon oxide, and the word line can include a metal.

As illustrated in FIG. 14A, a first dielectric layer 1406, a word line 1408, and a second dielectric layer 1409 are sequentially formed on a silicon substrate 1402. In some implementations, silicon oxide, a metal (e.g., W), and silicon oxide are subsequently deposited onto silicon substrate 1402 using one or more thin film deposition processes including, but not limited to, CVD, PVD, ALD, or any combination thereof. It is understood that the materials of first and second dielectric layers 1406 and 1409 may include any suitable dielectric materials other than silicon oxide, and the material of word line 1408 may include any suitable conductive materials other than metals. Silicon substrate 1402 can be intrinsic (i.e., undoped) or doped with a first type of dopant, such as P-type of dopants (e.g., e.g., B or Ga).

Figure 18:
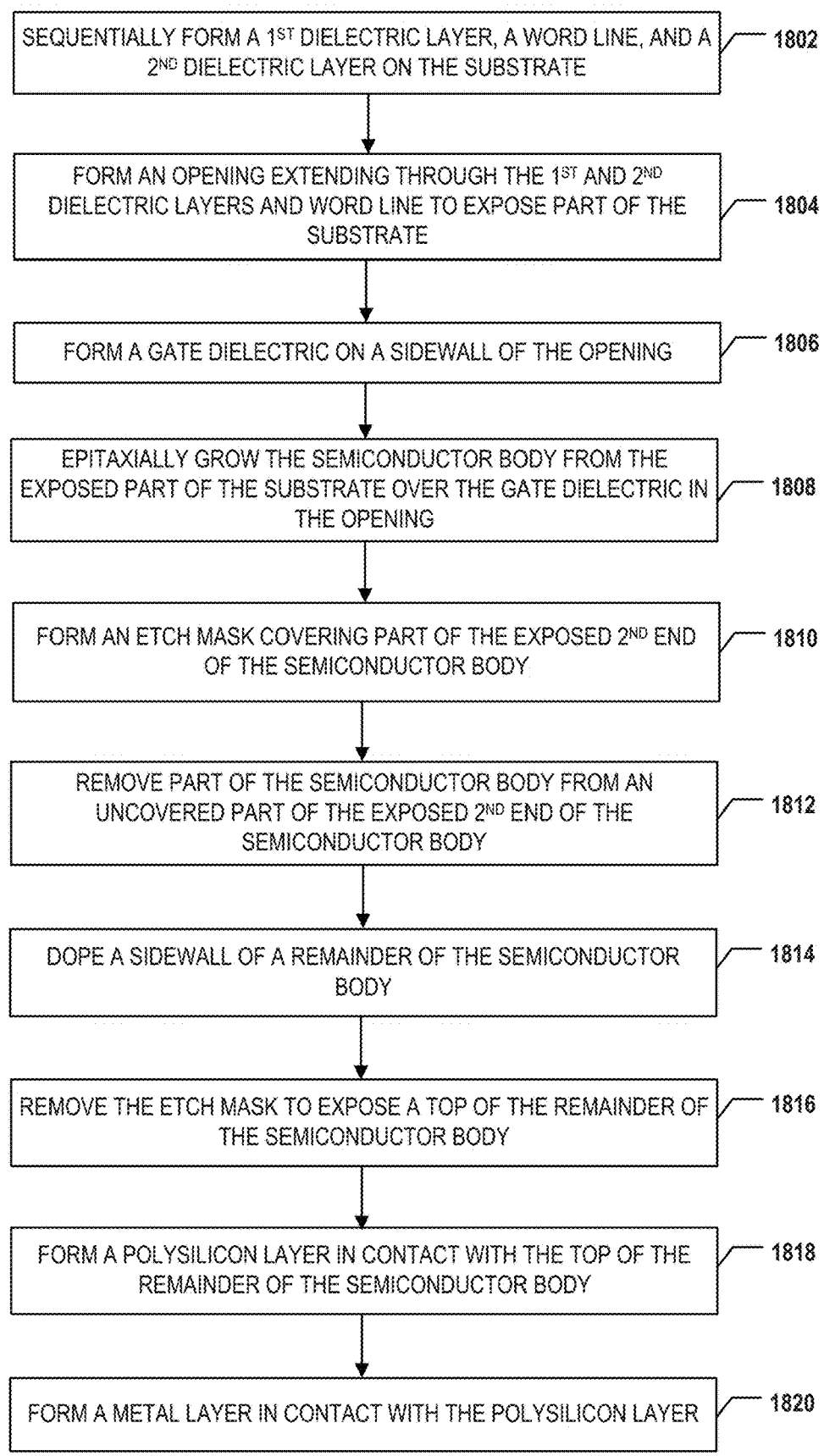
FIG. 18 illustrates a flowchart of a method for forming another array of memory cells each including a vertical transistor, according to some aspects of the present disclosure.

At operation 1804 in FIG. 18, an opening extending through the first dielectric layer, the word line, and the second dielectric layer is formed to expose part of the substrate. As illustrated in FIG. 14A, an array of openings 1410 is formed, each of which extends vertically (in the z-direction) through the stack of second dielectric layer 1409, word line 1408, and first dielectric layer 1406 to silicon substrate 1402. As a result, parts of silicon substrate 1402 can be exposed from openings 1410. In some implementations, a lithography process is performed to pattern the array of openings 1410 using an etch mask (e.g., a photoresist mask), for example, based on the design of word lines and bit lines, and one or more dry etching and/or wet etching processes, such as RIE, are performed to etch openings 1410 through second dielectric layer 1409, word line 1408, and first dielectric layer 1406 until being stopped by silicon substrate 1402.

At operation 1806 in FIG. 18, a gate dielectric is formed on a sidewall of the opening. As illustrated in FIG. 14B, gate dielectrics 1418 are formed on sidewalls of openings 1410, respectively. To form gate dielectrics 1418, a gate dielectric layer, such as a layer of silicon oxide or high-k dielectric, can be deposited into openings 1410 to cover the sidewall and bottom of each opening 1410 using one or more thin film deposition processes including, but not limited to, CVD, PVD, ALD, or any combination thereof. The gate dielectric layer can then be partially etched using dry etching and/or wet etching, such as RIE, to remove parts thereof on the bottoms of openings 1410 to still expose parts of silicon substrate 1402 from openings 1410. The remainder of the gate dielectric layer on the sidewall of opening 1410 can thus become gate dielectric 1418. Gate dielectric 1418 and part of word line 1408 that is in contact with gate dielectric 1418 can thus become a gate structure of a vertical transistor to be formed.

At operation 1808 in FIG. 18, the semiconductor body is epitaxially grown from the exposed part of the substrate over the gate dielectric in the opening. As illustrated in FIG. 14C, an array of semiconductor bodies 1412 are formed over gate dielectrics 1418 in openings 1410 (shown in FIG. 14B), respectively. Semiconductor body 1412 can be epitaxially grown from the respective exposed part of silicon substrate 1402 in the respective opening 1410 over the respective gate dielectric 1418. The fabrication processes for epitaxially growing semiconductor body 1412 can include, but not limited to, VPE, LPE, MPE, or any combinations thereof. The epitaxy can occur upward (toward the positive z-direction) from the exposed parts of silicon substrate 1402 in openings 1410. Semiconductor body 1412 thus can have the same material as silicon substrate 1402, i.e., single crystalline silicon. The same as silicon substrate 1402, semiconductor body 1412 can be intrinsic (i.e., undoped) or doped with the first type of dopant, such as P-type of dopants (e.g., e.g., B or Ga). Depending on the shape of opening 1410, semiconductor body 1412 can have the same shape as opening 1410, such as a cuboid shape or a cylinder shape. In some implementations, a planarization process, such as CMP, is performed to remove excessive parts of semiconductor bodies 1412 beyond the top surface of second dielectric layer 1409. As a result, an array of semiconductor bodies 1412 (e.g., single crystalline silicon bodies) each surrounded by a respective gate dielectric 1418 and extending vertically (in the z-direction) from silicon substrate 1402 through the stack of second dielectric layer 1409, word line 1408, and first dielectric layer 1406 is formed thereby, according to some implementations.

Referring back to FIG. 16, method 1600 proceeds to operation 1608 in which a first end of the semiconductor body is doped. As illustrated in FIG. 14D, the exposed upper end of each semiconductor body 1412, i.e., one of the two ends of semiconductor body 1412 in the vertical direction (the z-direction) that is away from silicon substrate 1402, is doped to form a source/drain 1421. In some implementations, an implantation process and/or thermal diffusion process are performed to dope P-type dopants or N-type dopants to exposed upper ends of semiconductor bodies 1412 to form sources/drains 1421. In some implementations, a silicide layer is formed on source/drain 1421 by performing a silicidation process at the exposed upper ends of semiconductor bodies 1412.

Method 1600 proceeds to operation 1610, as illustrated in FIG. 16, in which a storage unit is formed on the doped first end of the semiconductor body. The storage unit can include a capacitor, a ferroelectric capacitor, or a PCM element. In some implementations, to form a storage unit that is a capacitor, a first electrode is formed on the doped first end of the semiconductor body, a capacitor dielectric is formed on the first electrode, and a second electrode is formed on the capacitor dielectric. In some implementations, an interconnect layer is formed above the word line. The interconnect layer can include a plurality of interconnects in one or more ILD layers.

As illustrated in FIG. 14E, one or more ILD layers are formed over the top surface of second dielectric layer 1409, for example, by depositing dielectrics using one or more thin film deposition processes including, but not limited to, CVD, PVD, ALD, or any combination thereof. It is understood that in some examples in which the ILD layers include silicon oxide, the same material as second dielectric layer 1409, the boundary and interface between the ILD layer and second dielectric layer 1409 may become indistinguishable after the deposition. As illustrated in FIG. 14E, first electrodes 1424, capacitor dielectrics 1426, and second electrodes 1428 are subsequently formed in the ILD layers to form capacitors in contact with semiconductor bodies 1412. In some implementations, each first electrode 1424 is formed on a respective source/drain 1421, i.e., the doped upper end of a respective semiconductor body 1412 by patterning and etching an electrode opening aligned with respective source/drain 1421 using lithography and etching processes and depositing conductive materials to fill the electrode opening using thin film deposition processes. Similarly, in some implementations, second electrode 1428 is formed on capacitor dielectrics 1426 by patterning and etching an electrode opening using lithography and etching processes and depositing conductive materials to fill the electrode opening using thin film deposition processes.

As illustrated in FIG. 14F, an interconnect layer 1432 can be formed above word line 1420. Interconnect layer 1432 can include interconnects of MEOL and/or BEOL in a plurality of ILD layers to make electrical connections with word line 1420 and second electrode 1428. In some implementations, interconnect layer 1432 includes multiple ILD layers and interconnects therein formed in multiple processes. For example, the interconnects in interconnect layers 1432 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited on second electrode 1428 by one or more thin film deposition processes including, but not limited to, CVD, PVD, ALD, or any combination thereof. The ILD layers and interconnects illustrated in FIG. 14F can be collectively referred to as interconnect layer 1432.

Method 1600 proceeds to operation 1612, as illustrated in FIG. 16, in which a second bonding layer is formed above the semiconductor body (and the interconnect layer). The second bonding layer can include a second bonding contact. As illustrated in FIG. 14F, a bonding layer 1436 is formed above interconnect layer 1432 and semiconductor bodies 1412. Bonding layer 1436 can include a plurality of bonding contacts 1437 surrounded by dielectrics. In some implementations, a dielectric layer (e.g., ILD layer) is deposited on the top surface of interconnect layer 1432 by one or more thin film deposition processes including, but not limited to, CVD, PVD, ALD, or any combination thereof. Bonding contacts 1437 can then be formed through the dielectric layer and in contact with the interconnects in interconnect layer 1432 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1600 proceeds to operation 1614, as illustrated in FIG. 16, in which the first substrate and the second substrate are bonded in a face-to-face manner. The bonding can include hybrid bonding. In some implementations, the first bonding contact is in contact with the second bonding contact at a bonding interface after the bonding. In some implementations, the second substrate is above the first substrate after the bonding. In some implementations, the first substrate is above the second substrate after the bonding.

As illustrated in FIG. 14G, silicon substrate 1438 and components formed thereon (e.g., transistors 1442 in peripheral circuits 1440) are flipped upside down, and bonding layer 1446 facing down is bonded with bonding layer 1436 facing up, i.e., in a face-to-face manner, thereby forming a bonding interface 1450. In some implementations, a treatment process, e.g., a plasma treatment, a wet treatment, and/or a thermal treatment, is applied to the bonding surfaces prior to the bonding. Although not shown FIG. 14G, silicon substrate 1402 and components formed thereon (e.g., semiconductor bodies 1412) can be flipped upside down, and bonding layer 1436 facing down can be bonded with bonding layer 1446 facing up, i.e., in a face-to-face manner, thereby forming bonding interface 1450. After the bonding, bonding contacts 1437 in bonding layer 1436 and bonding contacts 1447 in bonding layer 1446 are aligned and in contact with one another, such that semiconductor bodies 1412 can be electrically connected to peripheral circuits 1440 across bonding interface 1450. It is understood that in the bonded chip, semiconductor bodies 1412 may be either above or below peripheral circuits 1440. Nevertheless, bonding interface 1450 can be formed vertically between peripheral circuits 1440 and semiconductor bodies 1412 after the bonding.

Method 1600 proceeds to operation 1616, as illustrated in FIG. 16, in which the second substrate is removed to expose a second end opposite to the first end of the semiconductor body. In some implementations, to remove the second substrate, the substrate is polished from the second side of the substrate until being stopped by the first dielectric layer. As illustrated in FIG. 14H, silicon substrate 1402 (shown in FIG. 14G) is removed from the backside to expose the upper ends of semiconductor bodies 1412 (used to be the lower ends before flipping over). In some implementations, silicon substrate 1402 is polished from the backside, for example, using a CMP process, until being stopped by first dielectric layer 1406 and the upper ends of semiconductor bodies 1412.

Method 1600 proceeds to operation 1618, as illustrated in FIG. 16, in which part of the semiconductor body is doped from the exposed second end of the semiconductor body. In some implementations, a protrusion of the semiconductor body is formed from the exposed second end of the semiconductor body prior to doping the part of the semiconductor body. The doped part and the another part of the semiconductor body can be in the protrusion of the semiconductor body. In some implementations, part of the protrusion of the semiconductor body is doped.

Figure 14I:
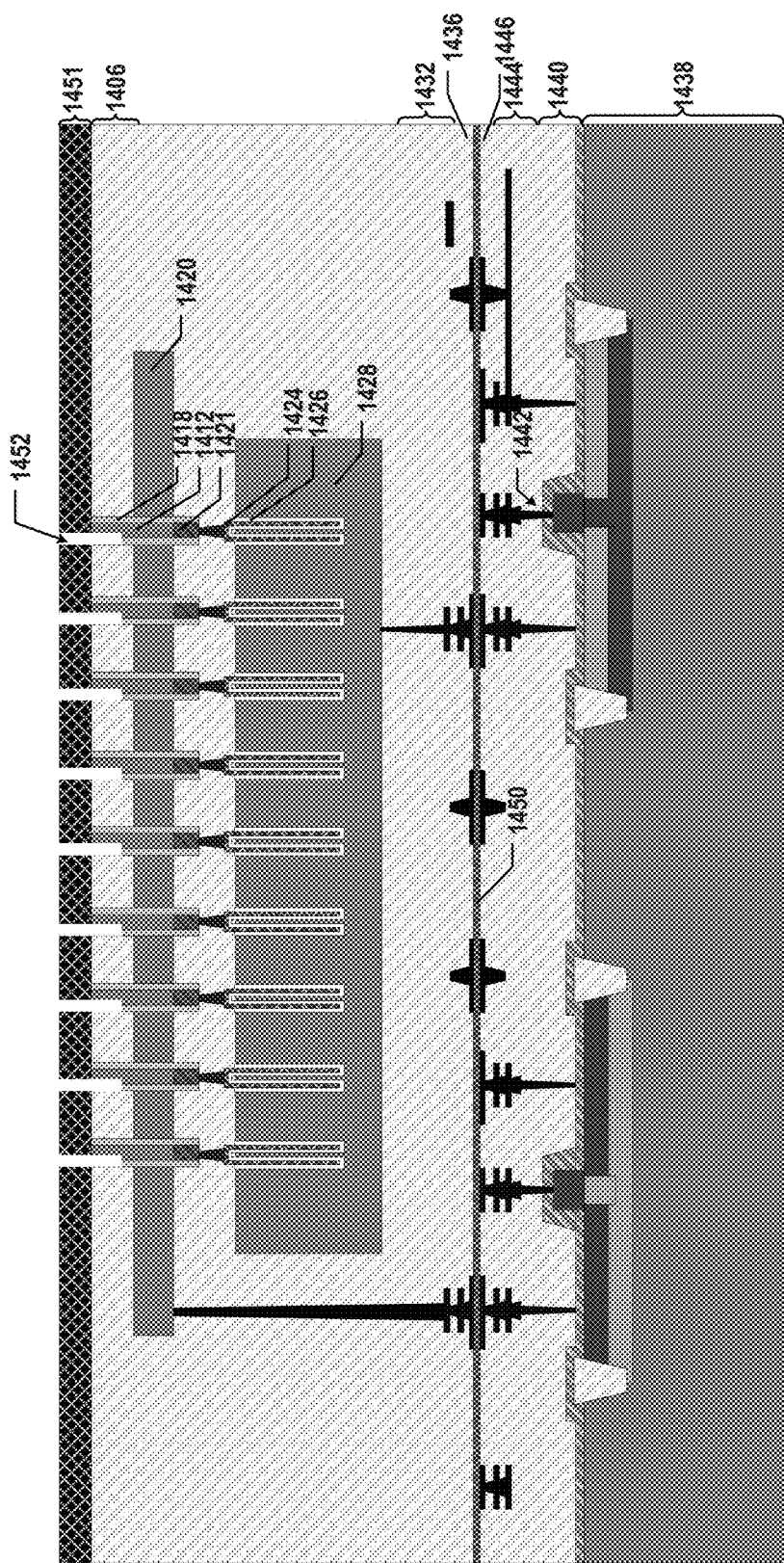

To form the protrusion of the semiconductor body and dope the part of the protrusion, at operation 1810 in FIG. 18, an etch mask covering part of the exposed first end of the semiconductor body is formed. As illustrated in FIG. 14I, an etch mask 1451 is formed on first dielectric layer 1406. Etch mask 1451 can be patterned to cover part of the exposed upper end of semiconductor body 1412, leaving the remaining part of the exposed upper end of semiconductor body 1412 uncovered. In some implementations, a layer of etch mask material, such as carbon, photoresist, etc., is deposited on first dielectric layer 1406 and the exposed upper ends of semiconductor bodies 1412 using one or more thin film deposition processes including, but not limited to, CVD, PVD, ALD, or any combination thereof. The layer of etch mask material can then be patterned to form openings therethrough each aligned with part of the upper end of a respective semiconductor body 1412 using lithography and dry etching and/or wet etching, as shown in FIG. 14I. Each opening through etch mask 1451 is patterned to expose part of the upper end of a respective semiconductor body 1412, leaving the remaining part of the upper end of semiconductor body 1412 still being covered by etch mask 1451.

At operation 1812 in FIG. 18, part of the semiconductor body is removed from an uncovered part of the exposed first end of the semiconductor body to expose the sidewall of the remainder of the semiconductor body. As illustrated in FIG. 14I, part of semiconductor body 1412 and part of gate dielectric 1418 that are not covered by etch mask 1451 are removed, for example, using dry etching and/or wet etching, from the upper end thereof to form a recess 1452. Recess 1452 can expose part of semiconductor body 1412 that has a sidewall not in contact with gate dielectric 1418 as shown in FIG. 14I. The exposed part of semiconductor body 1412 not fully surrounded by gate dielectric 1418 may be viewed as a protrusion of semiconductor body 1412, and the rest of semiconductor body 1412 is still fully surrounded by gate dielectric 1418 may be viewed as a base of semiconductor body 1412. In some implementations, an RIE process is performed through the openings of etch mask 1451 to etch the uncovered parts of semiconductor body 1412 and gate dielectric 1418. The etching rate and/or duration can be controlled to ensure only parts of gate dielectric 1418 and semiconductor body 1412 are removed. One or some sides, but not all sides, of the remaining protrusion of semiconductor body 1412 are still in contact with gate dielectric 1418, while the rest side(s) of the protrusion are exposed from recess 1452 and are not in contact with gate dielectric 1418, according to some implementations.

Figure 14J:
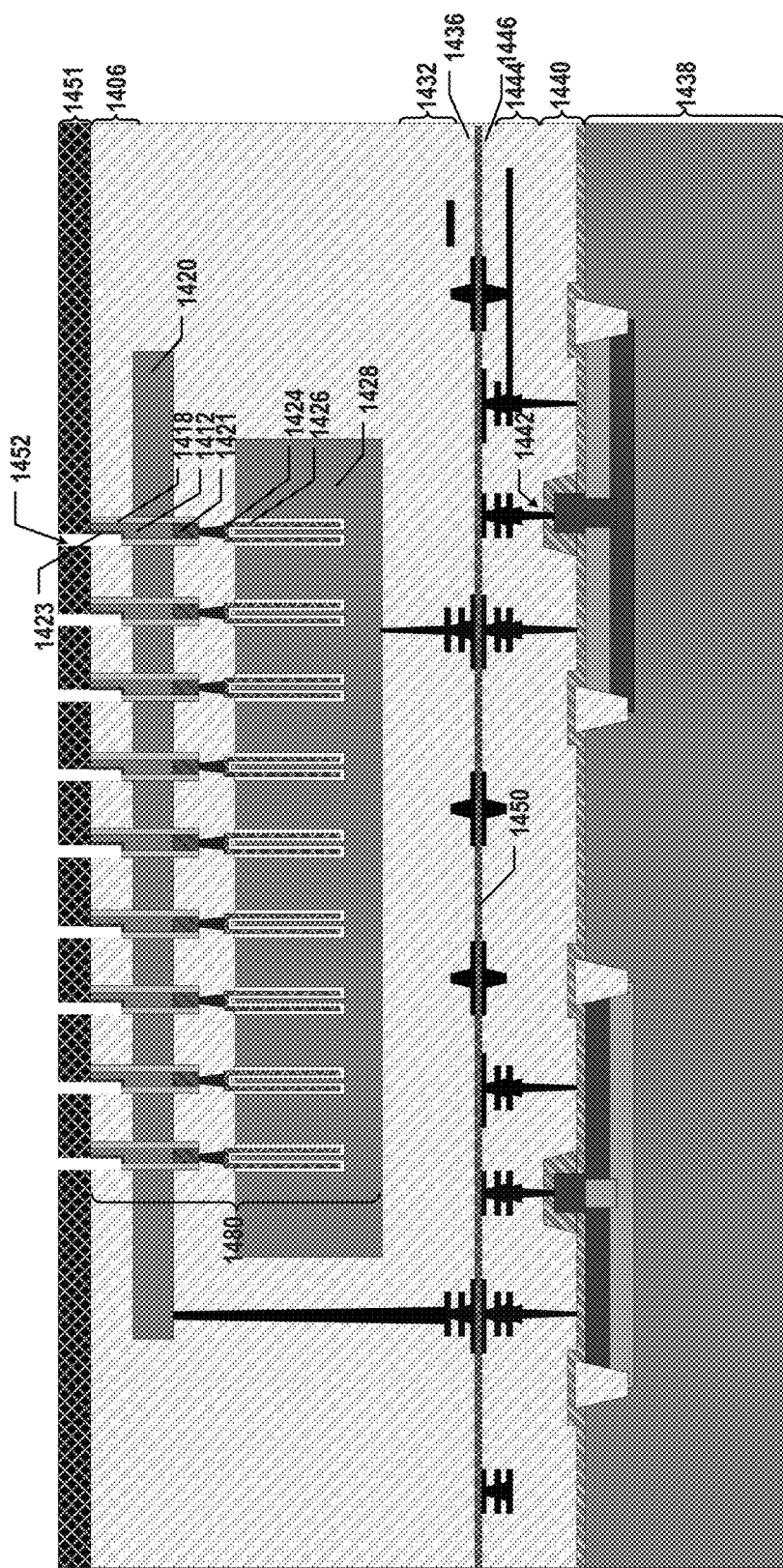

At operation 1814 in FIG. 18, a sidewall of a remainder of the semiconductor body is doped. As illustrated in FIG. 14J, the sidewall of the remainder (e.g., the protrusion) of semiconductor body 1412 is doped to form another source/drain 1423. In some implementations, an implantation process and/or thermal diffusion process are performed to dope P-type dopants or N-type dopants through recess 1452 to the exposed upper ends of semiconductor bodies 1412 to form a doped region, i.e., source/drain 1423. In some implementations in which silicon substrate 1402 and semiconductor body 1412 is doped with the first type of dopant (e.g., P-type dopants), source/drain 1423 is doped with a second type of dopant (e.g., N-type dopants) different from silicon substrate 1402 and semiconductor body 1412. The implantation process and/or thermal diffusion process can be controlled such that the dopant is limited to the exposed surface, e.g., the sidewall of the protrusion of semiconductor body 1412 and does not diffuse to the entire protrusion. In other words, the protrusion of semiconductor body 1412 can include both source/drain 1423 and the remaining portion (either undoped or doped with a different type of dopant) after doping. As shown in FIG. 14I, since the top of the protrusion of semiconductor body 1412 remains covered by etch mask 1451 during the doping, the top of the protrusion remains undoped or doped with a different type of dopant. That is, source/drain 1423 can be formed on one or some sidewalls, but not the top, of the protrusion of semiconductor body 1412.

Accordingly, vertical transistors each having semiconductor body 1412, sources/drains 1421 and 1423, gate dielectric 1418, and the gate electrode (part of word line 1420 in contact with gate dielectric 1418) are formed thereby, as shown in FIG. 14J, according to some implementations. As described above, capacitors each having first and second electrodes 1424 and 1428 and capacitor dielectric 1426 are thereby formed as well, and DRAM cells 1480 each having a vertical transistor and a capacitor coupled to the vertical transistor are thereby formed, as shown in FIG. 14J, according to some implementations.

Figure 14K:
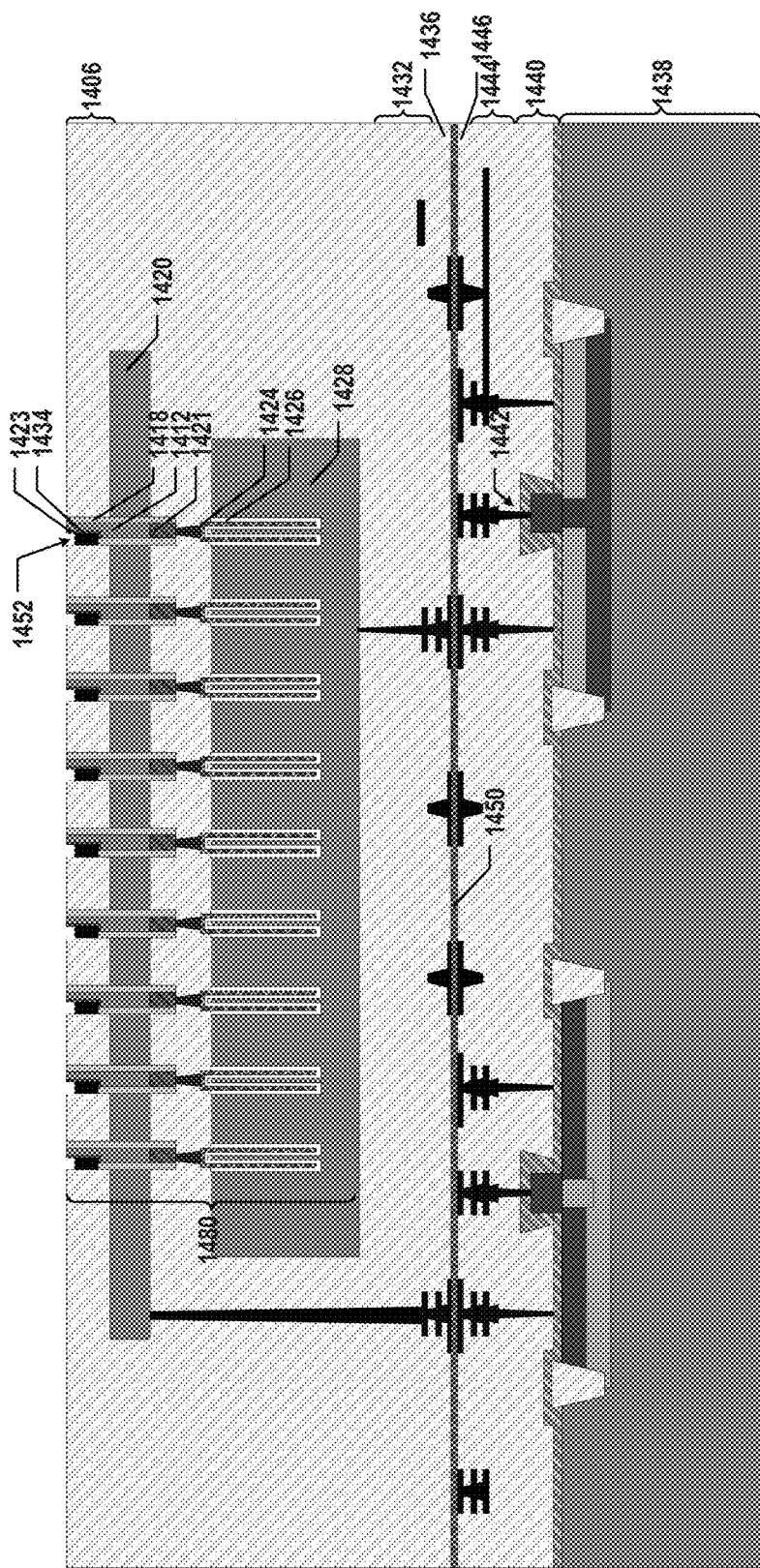

At operation 1816 in FIG. 18, the etch mask is removed to expose a top of the remainder of the semiconductor body. As illustrated in FIG. 14K, etch mask 1451 (shown in FIG. 14J) is removed, for example, using wet etching and/or dry etching, to expose the top of the protrusion of semiconductor body 1412 as well as first dielectric layer 1406.

Referring back to FIG. 16, method 1600 proceeds to operation 1620 in which a bit line in contact with the doped part of the semiconductor body is formed. In some implementations, the bit line is in contact with the doped sidewall of the remainder of the semiconductor body. As illustrated in FIG. 14K, bit line 1434 is formed in recess 1452 to be in contact with source/drain 1423. The upper end of bit line 1434 can be lower than the upper end of the protrusion of semiconductor body 1412, such that bit line 1434 does not cover the exposed upper end of the portion of the protrusion that is undoped or doped with a different type of dopant. To form bit line 1434, in some implementations, a conductive layer, such as a metal (e.g., W) layer, is deposited using by one or more thin film deposition processes including, but not limited to, CVD, PVD, ALD, or any combination thereof to partially fill recess 1452. The thickness of bit line 1434 can be controlled to be smaller than the height of the protrusion of semiconductor body 1412 by controlling the deposition rate and/or duration. In some implementations, the conductive layer fully fills recess 1452, and the excessive conductive layer is removed using CMP, followed by etching back the conductive layer in recess 1452 to control the thickness of resulting bit line 1434 to the smaller than the height of the protrusion of semiconductor body 1412.

Figure 14L:
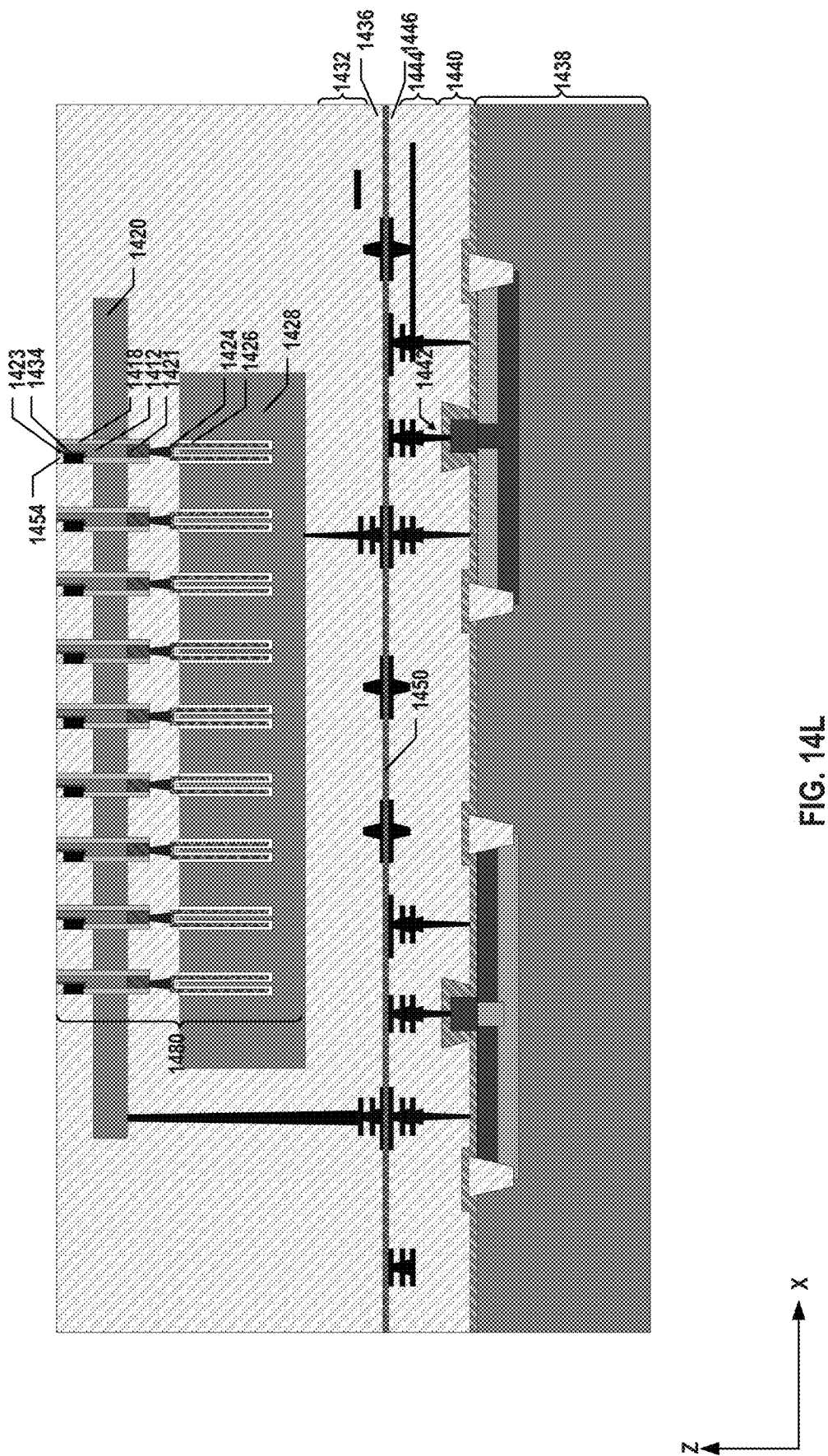

As illustrated in FIG. 14L, a dielectric layer 1454 is formed over bit line 1434 in recess 1452 (shown in FIG. 14K) to electrically insulate bit lines 1434. Dielectric layer 1454 can be formed by depositing a layer of dielectric material, such as silicon oxide, to fill recesses 1452 using by one or more thin film deposition processes including, but not limited to, CVD, PVD, ALD, or any combination thereof. In some implementations, a planarization process, such as CMP, is performed to remove excessive dielectric material covering the upper ends of the protrusions of semiconductor bodies 1412, such that the upper ends of the protrusions are flush with the top surface of dielectric layer 1454 and thus, still remain exposed.

Method 1600 proceeds to operation 1622, as illustrated in FIG. 16, in which a body line in contact with another part of the semiconductor body is formed. In some implementations, the body line is in contact with the another part of the remainder of the semiconductor body.

Figure 14M:
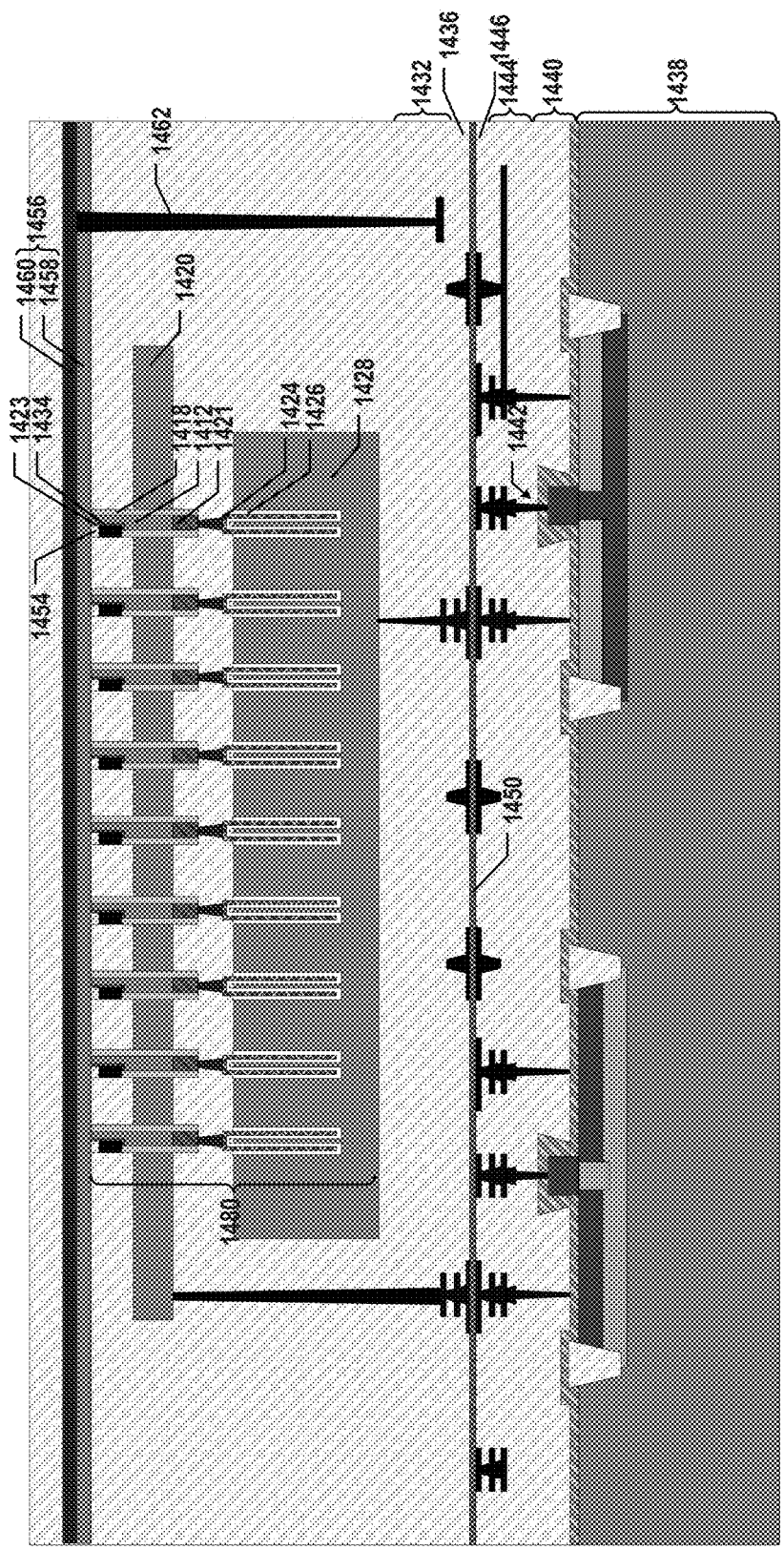

To form the body line, at operation 1818 in FIG. 18, a polysilicon layer in contact with the top of the remainder (the protrusion) of the semiconductor body is formed. As illustrated in FIG. 14M, a polysilicon layer 1458 is formed in contact with the top of the protrusion of semiconductor body 1412. That is, the exposed upper end of the protrusion can be in contact with polysilicon layer 1458. Polysilicon layer 1458 can be formed by depositing a layer of polysilicon using by one or more thin film deposition processes including, but not limited to, CVD, PVD, ALD, or any combination thereof on dielectric layer 1454 and the exposed upper ends of semiconductor bodies 1412. As shown in FIG. 14M, because the upper end of bit line 1434 is lower than the upper end of the protrusion of semiconductor bodies 1412 and is covered with dielectric layer 1454, bit line 1434 is electrically insulated from polysilicon layer 1458 by dielectric layer 1454. Since polysilicon layer 1458 and semiconductor body 1412 can have the same semiconductor material, such as silicon, the contact resistance therebetween can be reduced.

At operation 1820, a metal layer in contact with the polysilicon layer is formed. As illustrated in FIG. 14M, a metal layer 1460 is formed in contact with polysilicon layer 1458 to reduce the sheet resistance. Metal layer 1460 can be formed by depositing a layer of metal, such as W, using one or more thin film deposition processes including, but not limited to, CVD, PVD, ALD, or any combination thereof on polysilicon layer 1458. A body line 1456 including polysilicon layer 1458 and metal layer 1460 is thereby formed to be in contact with the portions of semiconductor bodies 1412 that are undoped or doped with a different type of dopant, according to some implementations. In some implementations, a body line contact 1462 is formed extending through ILD layers, for example, by wet/dry etching processes, followed by depositing conductive materials. Body line contact 1462 can be in contact with body line 1456 and the interconnects in interconnect layer 1432.

Although not shown, it is understood that a pad-out interconnect layer may be formed above body line 1456. The pad-out interconnect layer may include interconnects, such as pad contacts, formed in one or more ILD layers. The pad contacts may include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is also understood that in some examples, the pad-out interconnect layer may be formed on the backside of silicon substrate 1438, and TSCs may be formed extending vertically through silicon substrate 1438. Silicon substrate 1438 may be thinned prior to forming the pad-out interconnect layer and TSCs, for example, using planarization processes and/or etching processes.

Figure 19:
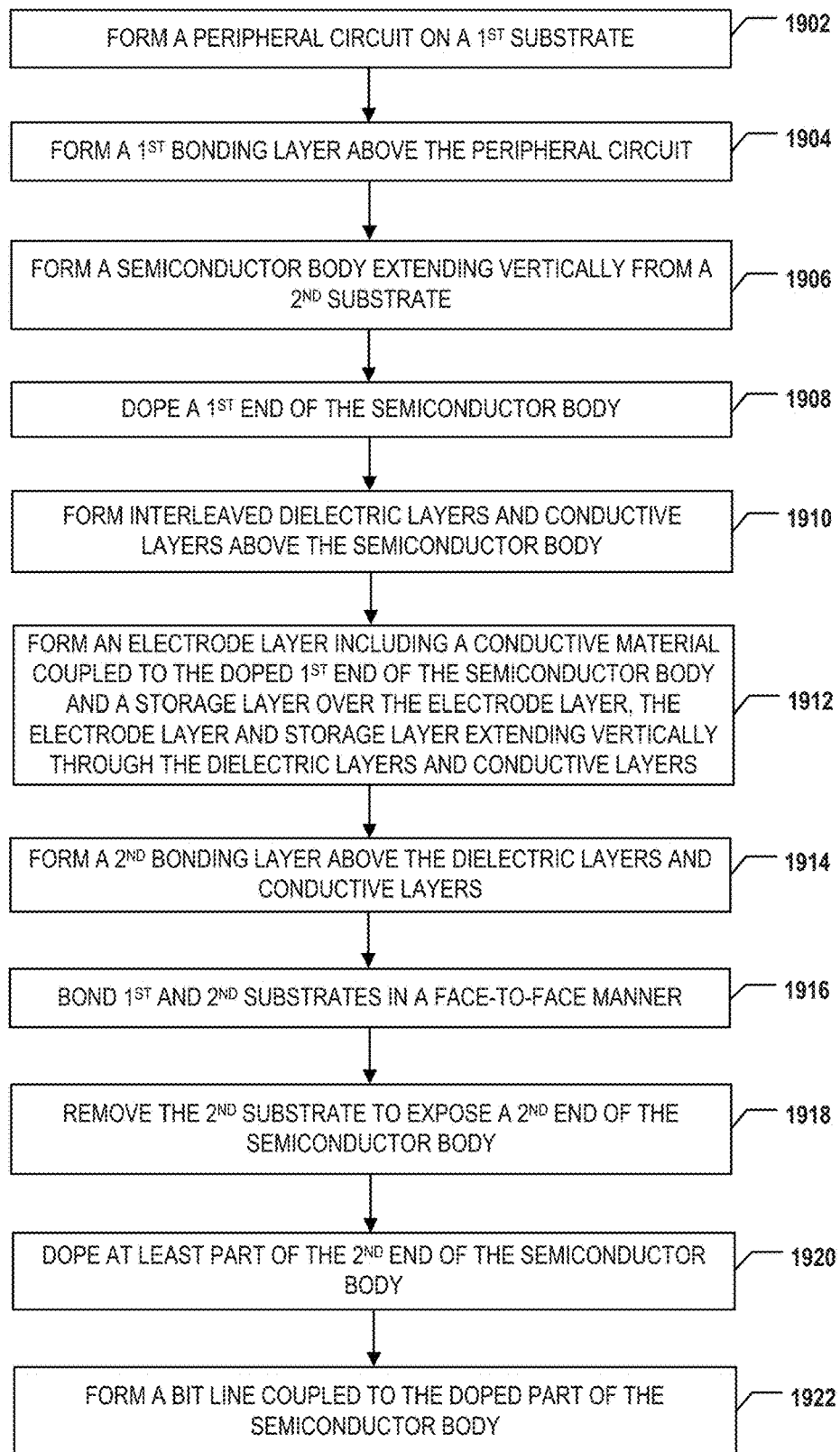
FIG. 19 illustrates a flowchart of a method for forming a 3D memory device including vertical transistors and stacked storage units, according to some aspects of the present disclosure.

FIGS. 15A-15E illustrate a fabrication process for forming a 3D memory device including vertical transistors and stacked storage units, according to some aspects of the present disclosure. FIG. 19 illustrates a flowchart of a method 1900 for forming a 3D memory device including vertical transistors and stacked storage units, according to some aspects of the present disclosure. Examples of the 3D memory devices depicted in FIGS. 15A-15E and 19 include 3D memory device 1000 depicted in FIG. 10A. FIGS. 15A-15E and 19 will be described together. It is understood that the operations shown in method 1900 are not exhaustive and that other operations can be performed as well before, after, or between any of the illustrated operations. Further, some of the operations may be performed simultaneously, or in a different order than shown in FIG. 19.

Referring to FIG. 19, method 1900 starts at operation 1902, in which a peripheral circuit is formed on a first substrate. The first substrate can include a silicon substrate. In some implementations, an interconnect layer is formed above the peripheral circuit. The interconnect layer can include a plurality of interconnects in one or more ILD layers.

Figure 15A:
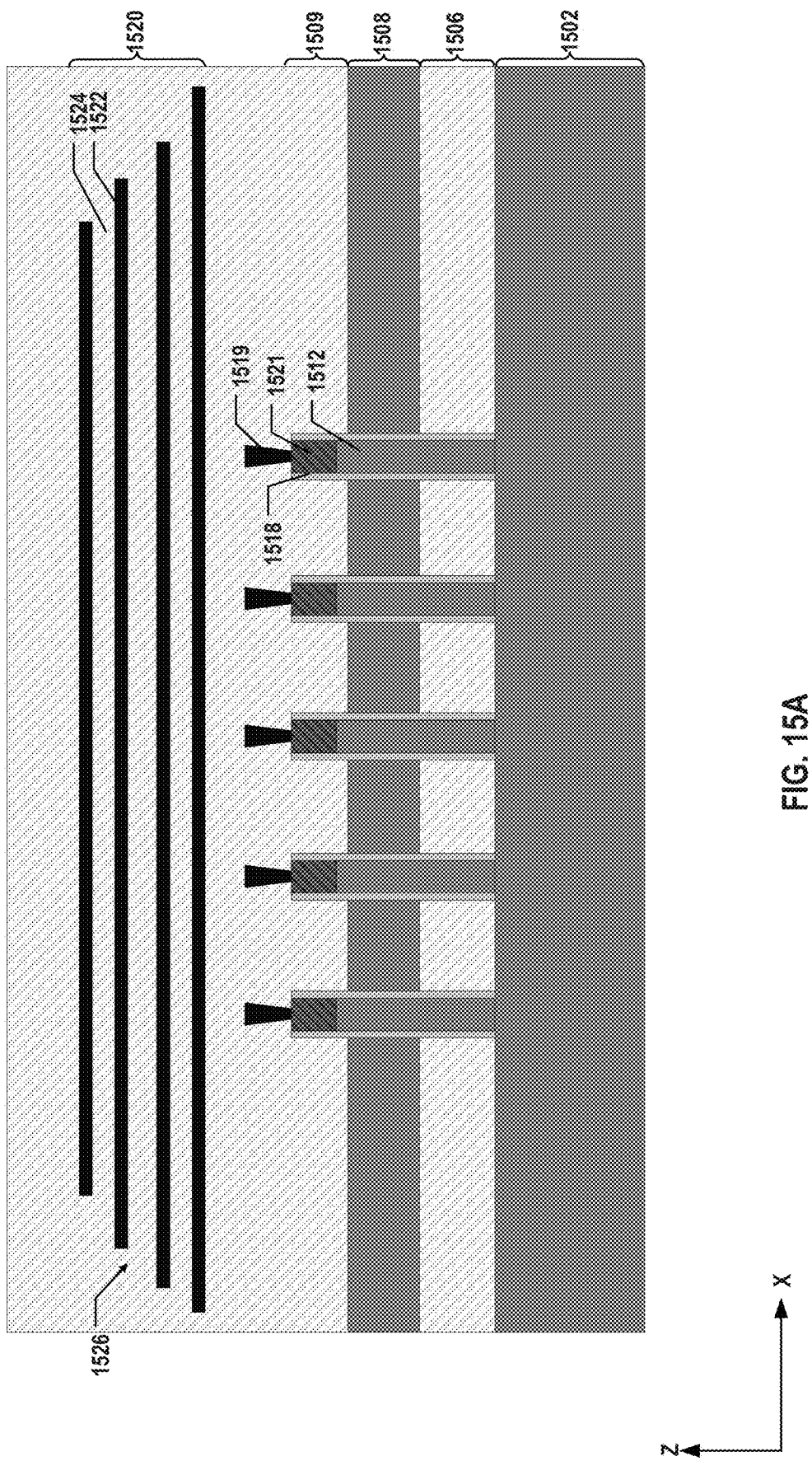
FIGS. 15A-15E illustrate a fabrication process for forming a 3D memory device including vertical transistors and stacked storage units, according to some aspects of the present disclosure.
Figure 15B:
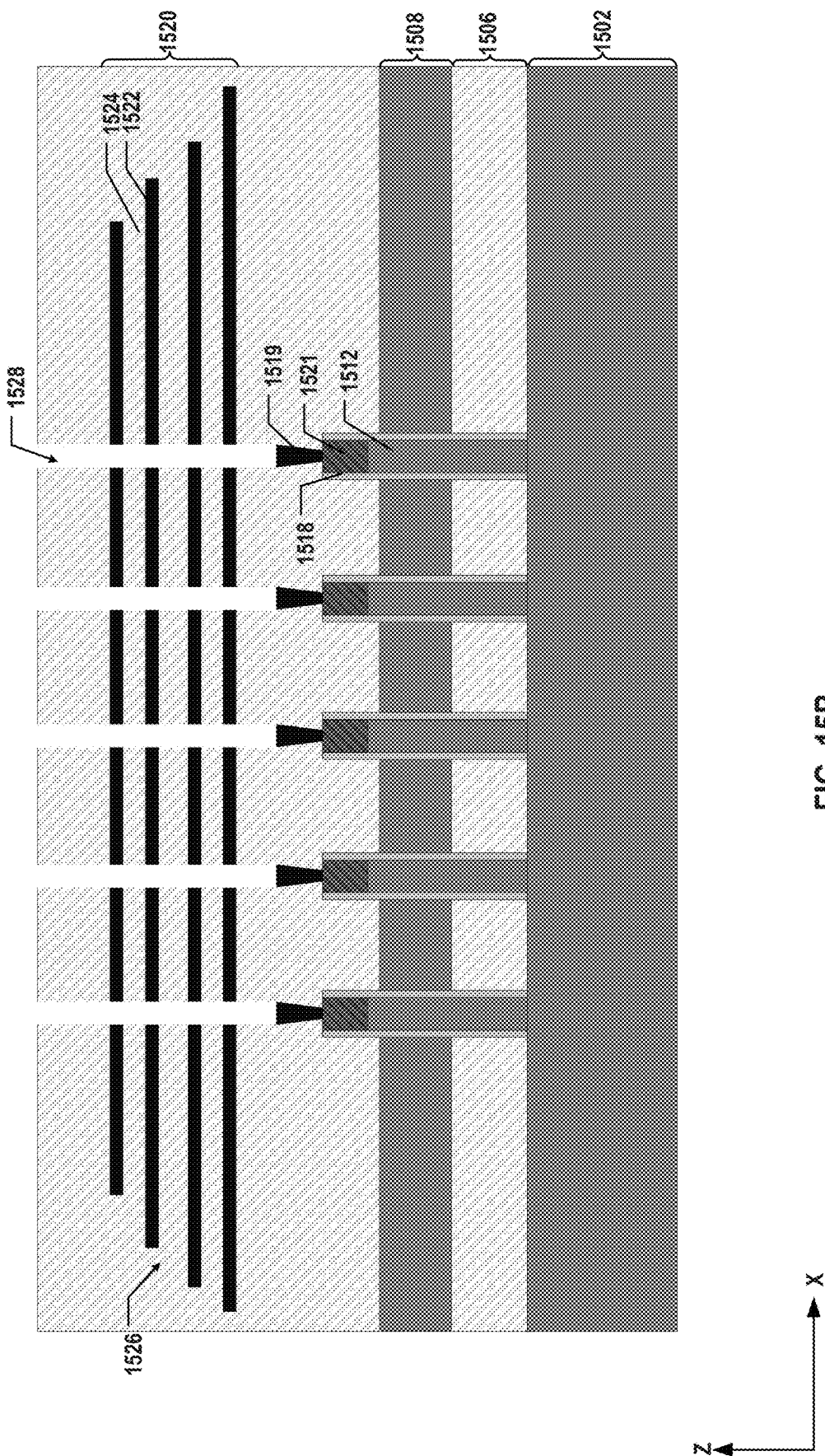
Figure 15C:
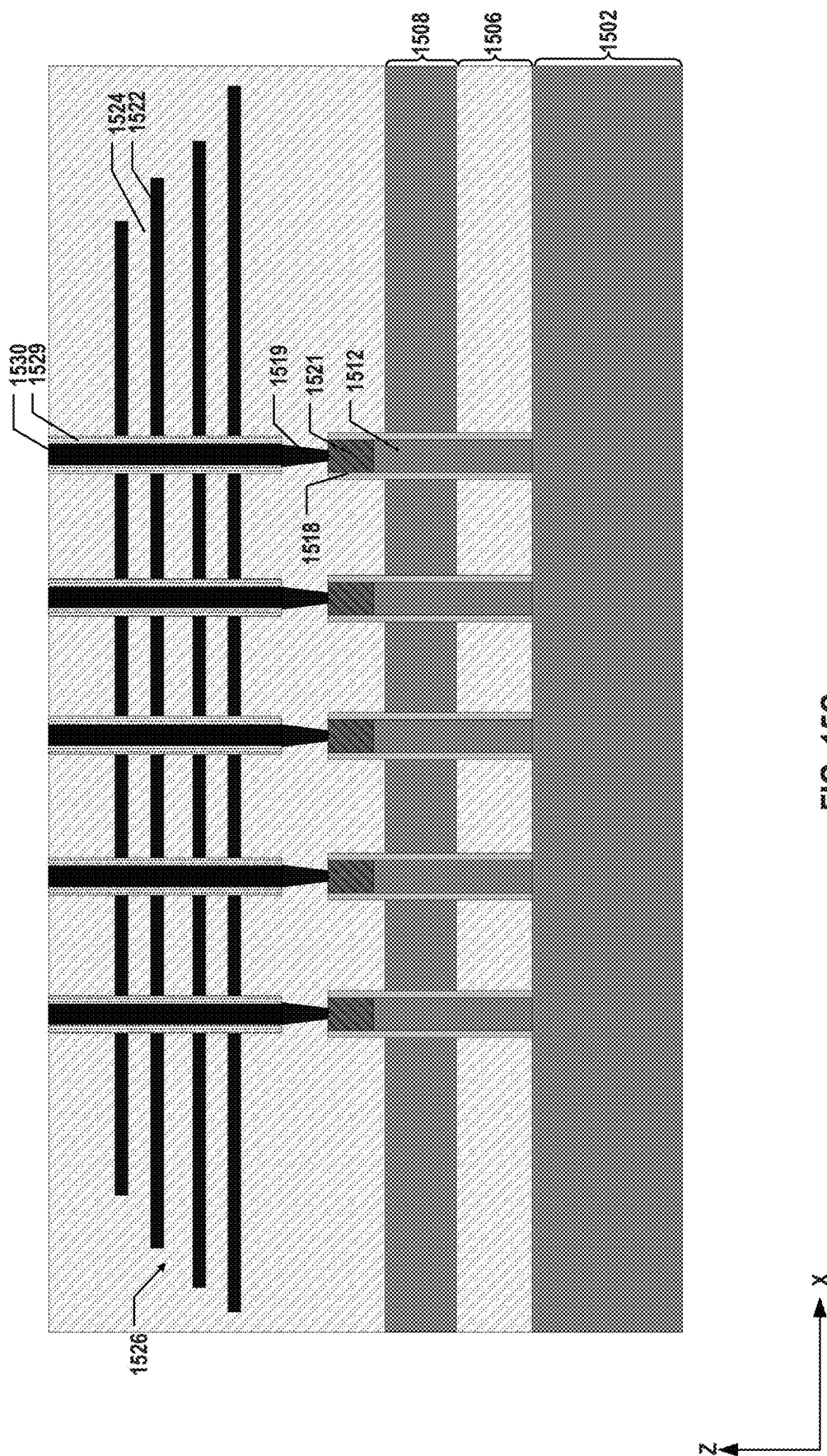
Figure 15D:
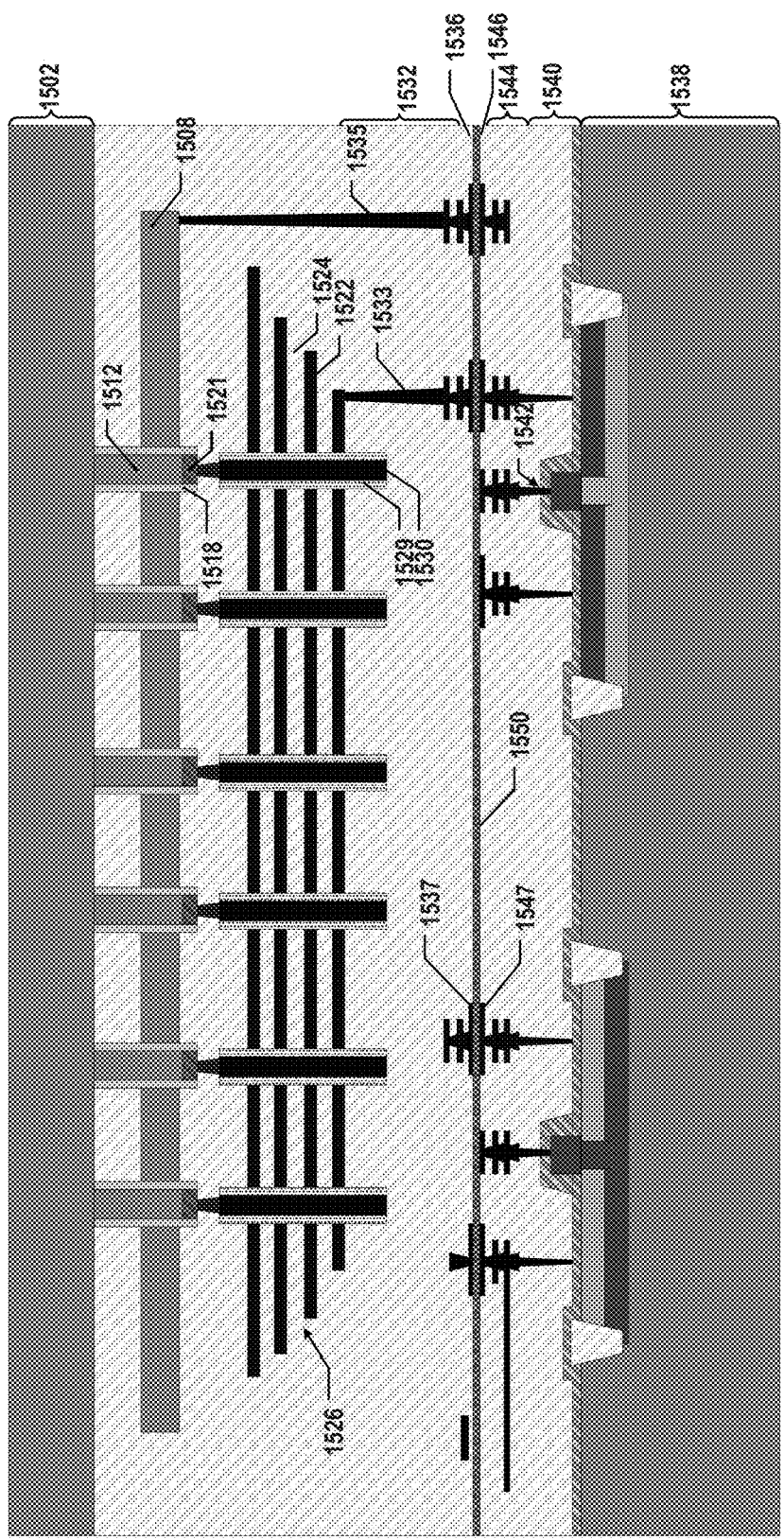

As illustrated in FIG. 15D, a plurality of transistors 1542 are formed on a silicon substrate 1538. Transistors 1542 can be formed by a plurality of processes including, but not limited to, photolithography, dry/wet etch, thin film deposition, thermal growth, implantation, CMP, and any other suitable processes. In some implementations, doped regions are formed in silicon substrate 1538 by ion implantation and/or thermal diffusion, which function, for example, as the source and drain of transistors 1542. In some implementations, isolation regions (e.g., STIs) are also formed in silicon substrate 1538 by wet/dry etch and thin film deposition. Transistors 1542 can form peripheral circuits 1540 on silicon substrate 1538.

As illustrated in FIG. 15D, an interconnect layer 1544 can be formed above peripheral circuits 1540 having transistors 1542. Interconnect layer 1544 can include interconnects of MEOL and/or BEOL in a plurality of ILD layers to make electrical connections with peripheral circuits 1540. In some implementations, interconnect layer 1544 includes multiple ILD layers and interconnects therein formed in multiple processes. For example, the interconnects in interconnect layers 1544 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 15D can be collectively referred to as interconnect layer 1544.

Method 1900 proceeds to operation 1904, as illustrated in FIG. 19, in which a first bonding layer is formed above the peripheral circuit (and the interconnect layer). The first bonding layer can include a first bonding contact. As illustrated in FIG. 15D, a bonding layer 1546 is formed above interconnect layer 1544 and peripheral circuits 1540. Bonding layer 1546 can include a plurality of bonding contacts 1547 surrounded by dielectrics. In some implementations, a dielectric layer (e.g., ILD layer) is deposited on the top surface of interconnect layer 1544 by one or more thin film deposition processes including, but not limited to, CVD, PVD, ALD, or any combination thereof. Bonding contacts 1547 can then be formed through the dielectric layer and in contact with the interconnects in interconnect layer 1544 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1900 proceeds to operation 1906, as illustrated in FIG. 19, in which a semiconductor body extending vertically from a first side (e.g., the front side) of a second substrate is formed. The second substrate can include a silicon substrate. To form the semiconductor body, a word line sandwiched between two dielectric layers is formed above the substrate, an opening extending through the word line and the dielectric layers is formed to expose part of the substrate, and the semiconductor body is epitaxially grown from the exposed part of the substrate in the opening. To form the semiconductor body, a gate dielectric is formed on a sidewall of the opening prior to epitaxially growing the semiconductor body.

As illustrated in FIG. 15A, an array of semiconductor bodies 1512 each extending vertically from a silicon substrate 1502 is formed. Semiconductor body 1512 can be surrounded by a gate dielectric 1518 and extend vertically through a word line 1508 sandwiched between dielectric layers 1506 and 1509. The fabrication process for forming semiconductor body 1512 and gate dielectric 1518 may be the same as the fabrication process described above with respect to semiconductor body 1312 or 1412 and gate dielectric 1318 or 1418 and thus, are not repeated.

Method 1900 proceeds to operation 1908, as illustrated in FIG. 19, in which a first end of the semiconductor body is doped. As illustrated in FIG. 15A, the upper end of each semiconductor body 1512, i.e., one of the two ends of semiconductor body 1512 in the vertical direction (the z-direction) that is away from silicon substrate 1502, is doped to form a source/drain 1521. In some implementations, an implantation process and/or thermal diffusion process are performed to dope P-type dopants or N-type dopants to the upper ends of semiconductor bodies 1512 to form sources/drains 1521. In some implementations, a silicide layer is formed on source/drain 1521 by performing a silicidation process at the upper ends of semiconductor bodies 1512.

Method 1900 proceeds to operation 1910, as illustrated in FIG. 19, in which interleaved dielectric layers and conductive layers are formed above the semiconductor body. In some implementations, to form the dielectric layers and conductive layers, the dielectric layers and the conductive layers are alternatingly deposited. In some implementations, a staircase structure is formed at the edges of the dielectric layers and the conductive layers.

As illustrated in FIG. 15A, a plurality of interleaved dielectric layers 1524 and conductive layers 1522 are formed above semiconductor bodies 1512. In some implementations, dielectric layers 1524 and conductive layers 1522 are alternatingly deposited using one or more thin film deposition processes including, but not limited to, PVD, CVD, ALD, or any combination thereof. In some implementations, dielectric layer 1524 includes silicon oxide, and conductive layer 1522 includes a metal, such as W. In some implementations, electrode contacts 1519 are formed prior to the formation of dielectric layers 1524 and conductive layers 1522. Each electrode contact 1519 can be in contact with source/drain 1521 of a respective semiconductor body 1512. To form electrode contact 1519, a contact hole can aligned with a corresponding semiconductor body 1512 and etched through ILD layers to expose source/drain 1521, and a conductive material can be deposited to fill the contact hole using one or more thin film deposition processes including, but not limited to, PVD, CVD, ALD, or any combination thereof.

As illustrated in FIG. 15A, a staircase structure 1526 is formed at the edges of interleaved dielectric layers 1524 and conductive layers 1522. Staircase structure 1526 can be formed by the so-called "trim-etch" processes, which, in each cycle, trims (e.g., etching incrementally and inwardly, often from all directions) a patterned photoresist layer, followed by etching the exposed portions of interleaved dielectric layers 1524 and conductive layers 1522 using the trimmed photoresist layer as an etch mask to form one step/level of staircase structure 1526. The process can be repeated until all the steps/levels of staircase structure 1526 are formed.

Method 1900 proceeds to operation 1912, as illustrated in FIG. 19, in which an electrode layer including a conductive material and coupled to a first end of the semiconductor body and a storage layer over the electrode layer are formed. The electrode layer and the storage layer can extend vertically through the dielectric layers and the conductive layers. In some implementations, to form the electrode layer and the storage layer, an opening extending through the dielectric layers and the conductive layers is formed, the storage layer is deposited on a sidewall of the opening, and the electrode layer is formed over the storage layer in the opening. The storage layer can include a ferroelectric material, and the electrode layer can include a metal.

As illustrated in FIG. 15B, an array of openings 1528 are formed each extending vertically through interleaved dielectric layers 1524 and conductive layers 1522. Each opening 1528 can expose a respective electrode contact 1519 or source/drain 1521 of a respective semiconductor body 1512 if electrode contact 1519 is not formed. Opening 1528 can be formed by first patterning an etch mask (not shown) with openings aligned with electrode contacts 1519 or sources/drains 1521 using lithography, followed by dry etching/and or wet etching through interleaved dielectric layers 1524 and conductive layers 1522, such as deep reactive ion etch (DRIE), which can be stopped at electrode contact 1519 or source/drain 1521.

As illustrated in FIG. 15C, opening 1528 (shown in FIG. 15B) is filled with a storage layer 1529 and an electrode layer 1530. Electrode layer 1530 can include a conductive material, such as a metal. In some implementations, storage layer 1529 is first formed on the sidewall of opening 1528 by depositing a ferroelectric material on the sidewall and the bottom of opening 1528 using one or more thin film deposition processes including, but not limited to ALD, CVD, PVD, or any combination thereof, followed by dry etching and/or wet etching to remove the ferroelectric material that is deposited on the bottom of opening 1528. Electrode layer 1530 can then be formed over storage layer 1529 by depositing a metal, such as W, to fill the remaining space of opening 1528 using one or more thin film deposition processes including, but not limited to ALD, CVD, PVD, or any combination thereof. The bottom of electrode layer 1530 can be in contact with electrode contact 1519 or source/drains 1521, such that electrode layer 1530 can be coupled to the upper end of semiconductor body 1512, and storage layer 1529 can be formed over electrode layer 1530 and in contact with conductive layers 1522. Both electrode layer 1530 and storage layer 1529 can extend vertically through interleaved dielectric layers 1524 and conductive layers 1522. Electrode layer 1530, storage layer 1529, and conductive layers 1522 can thus form vertically stacked storage units, such as ferroelectric capacitors.

In some implementations, an interconnect layer is formed above the word line. The interconnect layer can include a plurality of interconnects in one or more ILD layers. In some implementations, to form the interconnect layer, a plurality of contacts in contact with the conductive layers, respectively, at the staircase structure are formed.

As illustrated in FIG. 15D, an interconnect layer 1432 can be formed above word line 1520. Interconnect layer 1532 can include interconnects of MEOL and/or BEOL in a plurality of ILD layers to make electrical connections with word line 1520 and conductive layers 1522. The interconnects can include a word line contact 1535 in contact with word line 1508 and plate line contacts 1533 each in contact with a respective one of conductive layers 1522 at staircase structure 1526. In some implementations, interconnect layer 1532 includes multiple ILD layers and interconnects therein formed in multiple processes. For example, the interconnects in interconnect layers 1532 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited using one or more thin film deposition processes including, but not limited to, CVD, PVD, ALD, or any combination thereof. The ILD layers and interconnects illustrated in FIG. 15D can be collectively referred to as interconnect layer 1532.

Method 1900 proceeds to operation 1914, as illustrated in FIG. 19, in which a second bonding layer is formed above the dielectric layers and the conductive layers (and the interconnect layer). The second bonding layer can include a second bonding contact. As illustrated in FIG. 15D, a bonding layer 1536 is formed above interconnect layer 1532 and interleaved dielectric layers 1524 and conductive layers 1522. Bonding layer 1536 can include a plurality of bonding contacts 1537 surrounded by dielectrics. In some implementations, a dielectric layer (e.g., ILD layer) is deposited on the top surface of interconnect layer 1532 by one or more thin film deposition processes including, but not limited to, CVD, PVD, ALD, or any combination thereof. Bonding contacts 1537 can then be formed through the dielectric layer and in contact with the interconnects in interconnect layer 1532 by first patterning contact holes through the dielectric layer using patterning process (e.g., photolithography and dry/wet etch of dielectric materials in the dielectric layer). The contact holes can be filled with a conductor (e.g., Cu). In some implementations, filling the contact holes includes depositing a barrier layer, an adhesion layer, and/or a seed layer before depositing the conductor.

Method 1900 proceeds to operation 1916, as illustrated in FIG. 19, in which the first substrate and the second substrate are bonded in a face-to-face manner. The bonding can include hybrid bonding. In some implementations, the first bonding contact is in contact with the second bonding contact at a bonding interface after the bonding. In some implementations, the second substrate is above the first substrate after the bonding. In some implementations, the first substrate is above the second substrate after the bonding.

As illustrated in FIG. 15D, silicon substrate 1502 and components formed thereon (e.g., semiconductor bodies 1512 and the stacked storage units) are flipped upside down, and bonding layer 1536 facing down is bonded with bonding layer 1546 facing up, i.e., in a face-to-face manner, thereby forming a bonding interface 1550. In some implementations, a treatment process, e.g., a plasma treatment, a wet treatment, and/or a thermal treatment, is applied to the bonding surfaces prior to the bonding. Although not shown FIG. 15D, silicon substrate 1538 and components formed thereon (e.g., transistors 1542) can be flipped upside down, and bonding layer 1546 facing down can be bonded with bonding layer 1536 facing up, i.e., in a face-to-face manner, thereby forming bonding interface 1550. After the bonding, bonding contacts 1537 in bonding layer 1536 and bonding contacts 1547 in bonding layer 1546 are aligned and in contact with one another, such that semiconductor bodies 1512 and the stacked storage units can be electrically connected to peripheral circuits 1540 across bonding interface 1550. It is understood that in the bonded chip, semiconductor bodies 1512 and the stacked storage units may be either above or below peripheral circuits 1540. Nevertheless, bonding interface 1550 can be formed vertically between peripheral circuits 1540 and semiconductor bodies 1512/stacked storage units after the bonding.

Figure 15E:
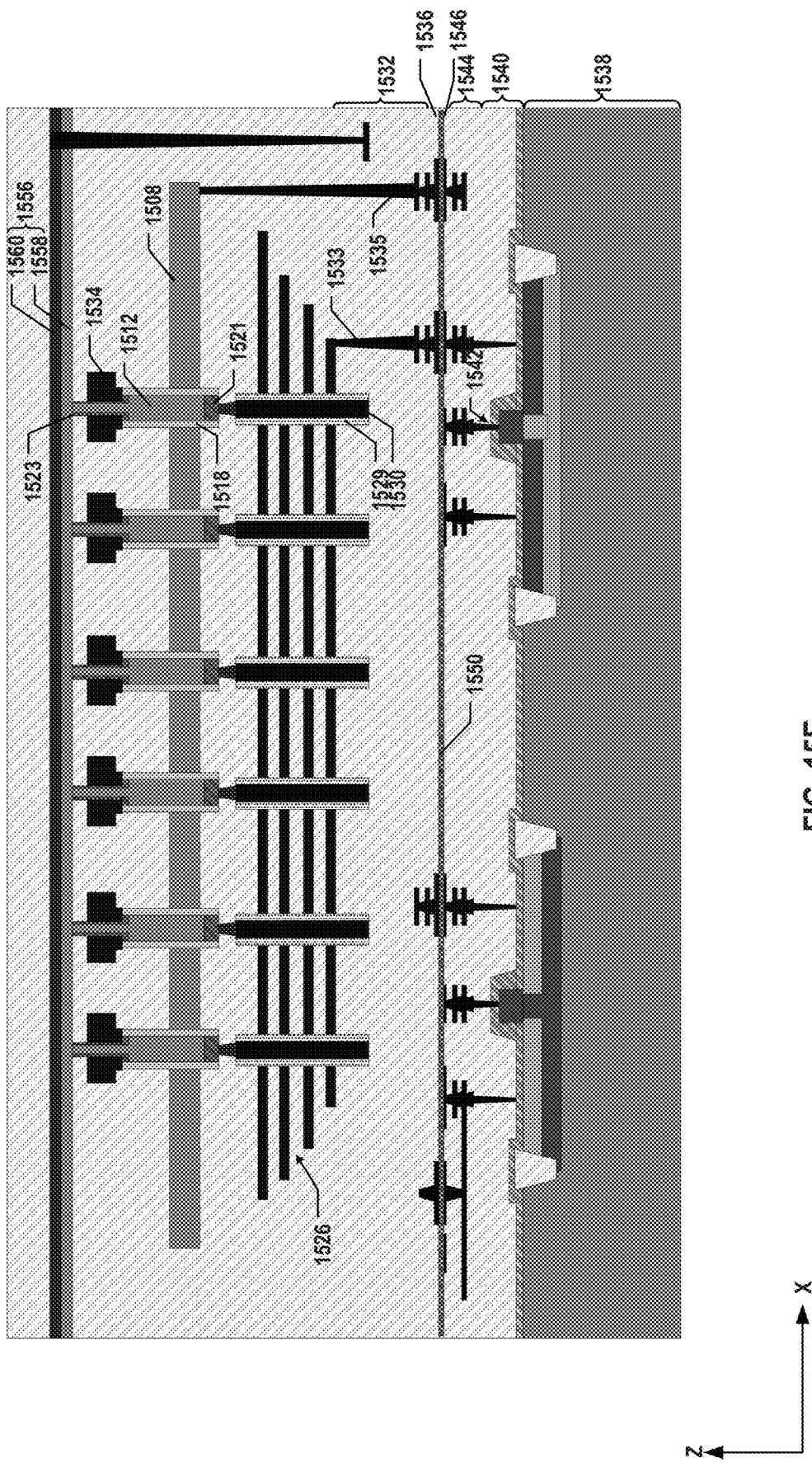

Method 1900 proceeds to operation 1918, as illustrated in FIG. 19, in which the second substrate is removed to expose a second end opposite to the first end of the semiconductor body. As illustrated in FIG. 15E, silicon substrate 1502 (shown in FIG. 15D) is removed from the backside to expose the upper ends of semiconductor bodies 1512 (used to be the lower ends before flipping over). In some implementations, silicon substrate 1502 is polished from the backside, for example, using a CMP process, until being stopped the upper ends of semiconductor bodies 1512.

Method 1900 proceeds to operation 1920, as illustrated in FIG. 19, in which at least part of the semiconductor body is doped from the exposed second end of the semiconductor body. As illustrated in FIG. 15E, at least part of semiconductor body 1512 is doped to form another source/drain 1523 from the upper end of semiconductor body 1512. Method 1900 proceeds to operation 1922, as illustrated in FIG. 19, in which a bit line coupled to the doped part of the semiconductor body is formed. As illustrated in FIG. 15E, a bit line 1534 is formed to be coupled to source/drain 1523. In some implementations, a body line coupled to another part of the semiconductor body is formed. As illustrated in FIG. 15E, a body line 1556 including a polysilicon layer 1558 and a metal layer 1560 is formed to be coupled to a portion of semiconductor body 1512. The fabrication process for forming source/drain 1523, bit line 1534, and body line 1556 may be the same as the fabrication process described above with respect to source/drain 1323 or 1423, bit line 1334 or 1434, and body line 1356 or 1456 and thus, are not repeated.

Although not shown, it is understood that a pad-out interconnect layer may be formed above body line 1556. The pad-out interconnect layer may include interconnects, such as pad contacts, formed in one or more ILD layers. The pad contacts may include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. It is also understood that in some examples, the pad-out interconnect layer may be formed on the backside of silicon substrate 1538, and through TSCs may be formed extending vertically through silicon substrate 1538. Silicon substrate 1538 may be thinned prior to forming the pad-out interconnect layer and TSCs, for example, using planarization processes and/or etching processes.

According to one aspect of the present disclosure, a memory device includes a vertical transistor, a storage unit, a bit line, and a body line. The vertical transistor includes a semiconductor body extending in a first direction. The semiconductor body includes a doped source, a doped drain, and a channel portion. The storage unit is coupled to a first terminal, the first terminal being one of the source and the drain. The bit line extends in a second direction perpendicular to the first direction and coupled to a second terminal, the second terminal being another one of the source and the drain. The body line is coupled to the channel portion of the semiconductor body.

In some implementations, the body line and the storage unit are coupled to opposite ends of the vertical transistor in the first direction.

In some implementations, the bit line is between the storage unit and the body line in the first direction.

In some implementations, the bit line is in contact with the second terminal and, the bit line is separated from the channel portion of the semiconductor body by the second terminal.

In some implementations, the first terminal is formed on one end of a base of the semiconductor body, the second terminal is formed on one or more sides of a protrusion of the semiconductor body, and the channel portion is formed in the base and the protrusion of the semiconductor body.

In some implementations, the semiconductor body includes single crystalline silicon, and the channel portion includes undoped single crystalline silicon or doped single crystalline silicon having a different type of dopant from the source and the drain.

In some implementations, the body line includes a polysilicon layer in contact with the channel portion of the semiconductor body, and a metal layer in contact with the polysilicon layer.

In some implementations, the memory device further includes a word line extending in a third direction perpendicular to the first direction and the second direction. In some implementations, the vertical transistor further includes a gate structure in contact with one or more sides of the semiconductor body in the third direction.

In some implementations, the vertical transistor and the storage unit form a DRAM cell, a PCM cell, or a FRAM cell.

According to another aspect of the present disclosure, a 3D memory device includes a first semiconductor structure including a peripheral circuit, a second semiconductor, and a bonding interface between the first semiconductor structure and the second semiconductor structure in a first direction. The second semiconductor structure includes a vertical transistor, a storage unit, a bit line, and a body line. The vertical transistor includes a semiconductor body extending in the first direction. The semiconductor body includes a doped source, a doped drain, and a channel portion. The storage unit is coupled to a first terminal, the first terminal being one of the source and the drain. The bit line extends in a second direction perpendicular to the first direction and coupled to a second terminal, the second terminal being another one of the source and the drain. The body line is coupled to the channel portion of the semiconductor body.

In some implementations, the storage unit is between the bonding interface and the vertical transistor in the first direction.

In some implementations, the 3D memory device further includes a word line extending in a third direction perpendicular to the first direction and the second direction. In some implementations, the vertical transistor further includes a gate structure in contact with one or more sides of the semiconductor body in the third direction.

In some implementations, the word line is between the bonding interface and the bit line in the first direction.

In some implementations, the first semiconductor structure further includes a first bonding layer including a first bonding contact, and the second semiconductor structure further includes a second bonding layer including a second bonding contact. In some implementations, the first bonding contact is in contact with the second bonding contact at the first bonding interface.

In some implementations, the body line and the storage unit are coupled to opposite ends of the vertical transistor in the first direction.

In some implementations, the bit line is between the storage unit and the body line in the first direction.

In some implementations, the bit line is in contact with the second terminal, and the bit line is separated from the channel portion of the semiconductor body by the second terminal.

In some implementations, the first terminalis formed on one end of a base of the semiconductor body, the second terminalis formed on one or more sides of a protrusion of the semiconductor body, and the channel portion is formed in the base and the protrusion of the semiconductor body.

In some implementations, the semiconductor body includes single crystalline silicon, and the channel portion includes undoped single crystalline silicon or doped single crystalline silicon having a different type of dopant from the source and the drain.

In some implementations, the body line includes a polysilicon layer in contact with the channel portion of the semiconductor body, and a metal layer in contact with the polysilicon layer.

According to still another aspect of the present disclosure, a memory system includes a memory device configured to store data and a memory controller coupled to the memory device. The memory device includes a vertical transistor, a storage unit, a bit line, and a body line. The vertical transistor includes a semiconductor body extending in a first direction. The semiconductor body includes a doped source, a doped drain, and a channel portion. The storage unit is coupled to a first terminal, the first terminal being one of the source and the drain. The bit line extends in a second direction perpendicular to the first direction and coupled to a second terminal, the second terminal being another one of the source and the drain. The body line is coupled to the channel portion of the semiconductor body. The memory controller is configured to control the vertical transistor and the storage unit through the bit line and the body line.

According to yet another aspect of the present disclosure, a method for forming a memory device is disclosed. A semiconductor body extending vertically from a first side of a substrate is formed. The substrate is removed from a second side opposite to the first side of the substrate to expose a first end of the semiconductor body. A protrusion of the semiconductor body is formed from the exposed first end of the semiconductor body. Part of the protrusion of the semiconductor body is doped. A bit line in contact with the doped part of the protrusion of the semiconductor body is formed. A body line in contact with another part of the protrusion of the semiconductor body is formed.

In some implementations, a second end opposite to the first end of the semiconductor body is doped prior to removing the substrate.

In some implementations, a storage unit is formed on the doped second end of the semiconductor body prior to removing the substrate.

In some implementations, to form the storage unit, a first electrode is formed on the doped second end of the semiconductor body, a capacitor dielectric is formed on the first electrode, and a second electrode is formed on the capacitor dielectric.

In some implementations, to form the semiconductor body, a word line sandwiched between two dielectric layers is formed above the substrate, an opening extending through the word line and the dielectric layers is formed to expose part of the substrate, and the semiconductor body is epitaxially grown from the exposed part of the substrate in the opening.

In some implementations, a gate dielectric is formed on a sidewall of the opening prior to epitaxially growing the semiconductor body.

In some implementations, to form the body line, a polysilicon layer is formed in contact with the another part of the protrusion of the semiconductor body, and a metal layer in contact with the polysilicon layer is formed.

According to yet another aspect of the present disclosure, a method for forming a 3D memory device is disclosed. A peripheral circuit is formed on a first substrate. A semiconductor body extending vertically from a second substrate is formed. The first substrate and the second substrate are bonded in a face-to-face manner. The second substrate is removed to expose a first end of the semiconductor body. Part of the semiconductor body is doped from the exposed first end of the semiconductor body. A body line in contact with another part of the semiconductor body is formed.

In some implementations, a bit line in contact with the doped part of the semiconductor body is formed.

In some implementations, a protrusion of the semiconductor body is formed from the exposed first end of the semiconductor body prior to doping the part of the semiconductor body.

In some implementations, the doped part and the another part of the semiconductor body are in the protrusion of the semiconductor body.

In some implementations, a first bonding layer including a first bonding contact is formed above the peripheral circuit, and a second bonding layer including a second bonding contact is formed above the semiconductor body. In some implementations, the first bonding contact is in contact with the second bonding contact at a bonding interface after the bonding.

In some implementations, the bonding includes hybrid bonding.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a vertical transistor comprising a semiconductor body extending in a first direction, wherein the semiconductor body comprises a doped source, a doped drain, and a channel portion;
a storage unit coupled to a first terminal, the first terminal being one of the source and the drain;
a bit line extending in a second direction perpendicular to the first direction and coupled to a second terminal, the second terminal being another one of the source and the drain; and
a body line coupled to the channel portion of the semiconductor body,
wherein the bit line is between the storage unit and the body line in the first direction.

2. The memory device of claim 1, wherein the body line and the storage unit are coupled to opposite ends of the vertical transistor in the first direction.

3. The memory device of claim 1, wherein the bit line is in contact with the second terminal, and the bit line is separated from the channel portion of the semiconductor body by the second terminal.

4. The memory device of claim 1, wherein
the first terminal is formed on one end of a base of the semiconductor body;
the second terminal is formed on one or more sides of a protrusion of the semiconductor body; and
the channel portion is formed in the base and the protrusion of the semiconductor body.

5. The memory device of claim 1, wherein the semiconductor body comprises single crystalline silicon, and the channel portion comprises undoped single crystalline silicon or doped single crystalline silicon having a different type of dopant from the source and the drain.

6. The memory device of claim 5, wherein the body line comprises a polysilicon layer in contact with the channel portion of the semiconductor body, and a metal layer in contact with the polysilicon layer.

7. The memory device of claim 1, further comprising a word line extending in a third direction perpendicular to the first direction and the second direction,
wherein the vertical transistor further comprises a gate structure in contact with one or more sides of the semiconductor body in the third direction.

8. The memory device of claim 1, wherein the vertical transistor and the storage unit form a dynamic random-access memory (DRAM) cell, a phase-change memory (PCM) cell, or a ferroelectric RAM (FRAM) cell.

9. The memory device of claim 1, wherein:
the body line comprises a polysilicon layer in contact with the channel portion of the semiconductor body, and a metal layer in contact with the polysilicon layer.

10. A three-dimensional (3D) memory device, comprising:
a first semiconductor structure comprising a peripheral circuit;
a second semiconductor structure comprising:
a vertical transistor comprising a semiconductor body extending in a first direction, wherein the semiconductor body comprises a doped source, a doped drain, and a channel portion;
a storage unit coupled to a first terminal, the first terminal being one of the source and the drain;
a bit line extending in a second direction perpendicular to the first direction and coupled to a second terminal, the second terminal being another one of the source and the drain; and
a body line coupled to the channel portion of the semiconductor body; and
a bonding interface between the first semiconductor structure and the second semiconductor structure in the first direction.

11. The 3D memory device of claim 10, wherein the storage unit is between the bonding interface and the vertical transistor in the first direction.

12. The 3D memory device of claim 10, further comprising a word line extending in a third direction perpendicular to the first direction and the second direction,
wherein the vertical transistor further comprises a gate structure in contact with one or more sides of the semiconductor body in the third direction.

13. The 3D memory device of claim 12, wherein the word line is between the bonding interface and the bit line in the first direction.

14. The 3D memory device of claim 10, wherein
the first semiconductor structure further comprises a first bonding layer comprising a first bonding contact, and the second semiconductor structure further comprises a second bonding layer comprising a second bonding contact; and
the first bonding contact is in contact with the second bonding contact at the first bonding interface.

15. The 3D memory device of claim 10, wherein the body line and the storage unit are coupled to opposite ends of the vertical transistor in the first direction.

16. The 3D memory device of claim 10, wherein the bit line is between the storage unit and the body line in the first direction.

17. The 3D memory device of claim 10, wherein the bit line is in contact with the second terminal, and the bit line is separated from the channel portion of the semiconductor body by the second terminal.

18. The 3D memory device of claim 10, wherein
the first terminal is formed on one end of a base of the semiconductor body;
the second terminal is formed on one or more sides of a protrusion of the semiconductor body; and
the channel portion is formed in the base and the protrusion of the semiconductor body.

19. The 3D memory device of claim 10, wherein the semiconductor body comprises single crystalline silicon, and the channel portion comprises undoped single crystalline silicon or doped single crystalline silicon having a different type of dopant from the source and the drain.

20. A memory system, comprising:
a memory device configured to store data, and comprising:
a vertical transistor comprising a semiconductor body extending in a first direction, wherein the semiconductor body comprises a doped source, a doped drain, and a channel portion;
a storage unit coupled to a first terminal, the first terminal being one of the source and the drain;
a bit line extending in a second direction perpendicular to the first direction and coupled to a second terminal, the second terminal being another one of the source and the drain; and
a body line coupled to the channel portion of the semiconductor body, wherein the bit line is between the storage unit and the body line in the first direction; and a memory controller coupled to the memory device and configured to control the vertical transistor and the storage unit through the bit line and the body line.

* * * * *